(12) United States Patent
Wu et al.

(10) Patent No.: US 12,317,551 B2
(45) Date of Patent: May 27, 2025

(54) SEMICONDUCTOR DEVICES INCLUDING BACKSIDE POWER RAILS AND METHODS OF MANUFACTURE

(71) Applicant: Taiwan Semiconductor Manufacturing Co., Ltd., Hsinchu (TW)

(72) Inventors: Chun-Hung Wu, New Taipei (TW); Chia-Ling Chung, Hsinchu (TW); Su-Hao Liu, Jhongpu Township (TW); Liang-Yin Chen, Hsinchu (TW); Shun-Wu Lin, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 513 days.

(21) Appl. No.: 17/566,316

(22) Filed: Dec. 30, 2021

(65) Prior Publication Data

US 2022/0310785 A1    Sep. 29, 2022

Related U.S. Application Data

(60) Provisional application No. 63/166,333, filed on Mar. 26, 2021.

(51) Int. Cl.
*H10D 62/10* (2025.01)
*H01L 21/425* (2006.01)
*H10D 30/67* (2025.01)
*H10D 84/01* (2025.01)
*H10D 84/03* (2025.01)

(52) U.S. Cl.
CPC ......... *H10D 62/118* (2025.01); *H01L 21/425* (2013.01); *H10D 30/6713* (2025.01); *H10D 30/6757* (2025.01); *H10D 84/013* (2025.01); *H10D 84/038* (2025.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

FOREIGN PATENT DOCUMENTS

| | | |
|---|---|---|
| CN | 112510038 A | 3/2021 |
| TW | 202109880 A | 3/2021 |

*Primary Examiner* — Khaja Ahmad
(74) *Attorney, Agent, or Firm* — Slater Matsil, LLP

(57) ABSTRACT

A method of forming a semiconductor device including performing an ion implantation on a substrate and etching the substrate and semiconductor devices formed by the same are disclosed. In an embodiment, a method includes forming a transistor on a first side of a substrate; performing an ion implantation on a second side of the substrate opposite the first side; after performing the ion implantation, etching the substrate to remove the substrate and form a first recess; and forming a dielectric layer in the first recess.

20 Claims, 54 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,152,488 B2 | 10/2021 | Lin et al. |
| 11,227,950 B2 | 1/2022 | Wang et al. |
| 2014/0367753 A1* | 12/2014 | Huang ............ H01L 21/823871 438/294 |
| 2016/0359008 A1* | 12/2016 | Choi ................ H01L 21/31111 |
| 2019/0221649 A1* | 7/2019 | Glass .............. H01L 21/823418 |
| 2019/0378790 A1* | 12/2019 | Bohr ................... H01L 23/5286 |
| 2020/0126987 A1* | 4/2020 | Rubin ................ H10D 84/0186 |

* cited by examiner

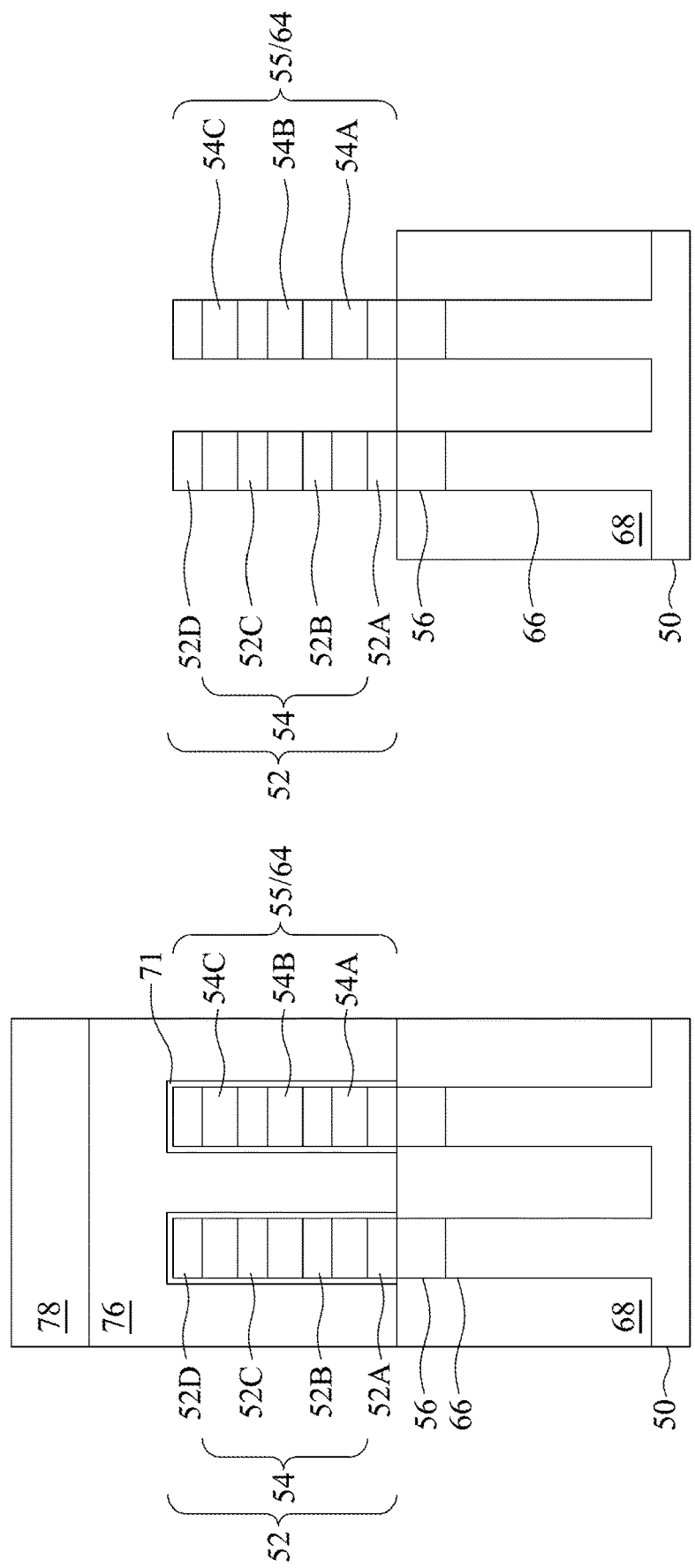

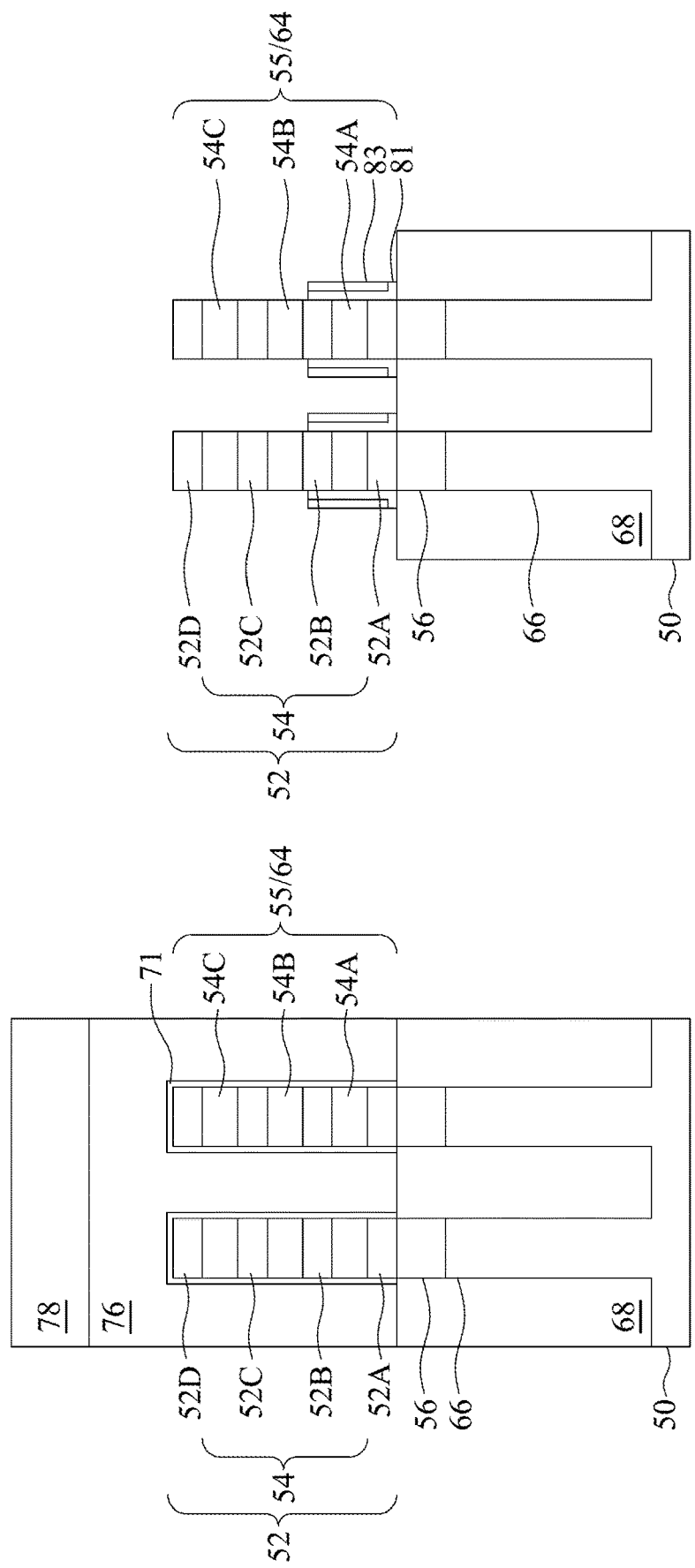

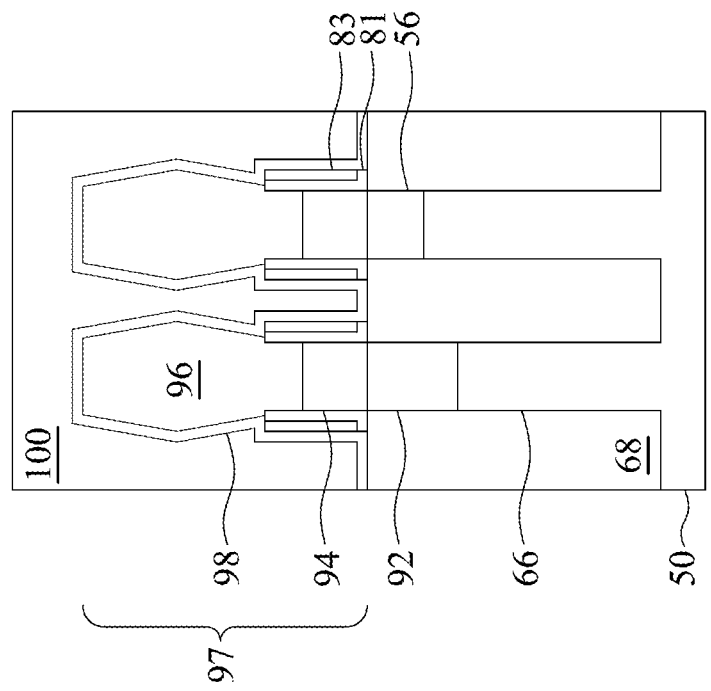
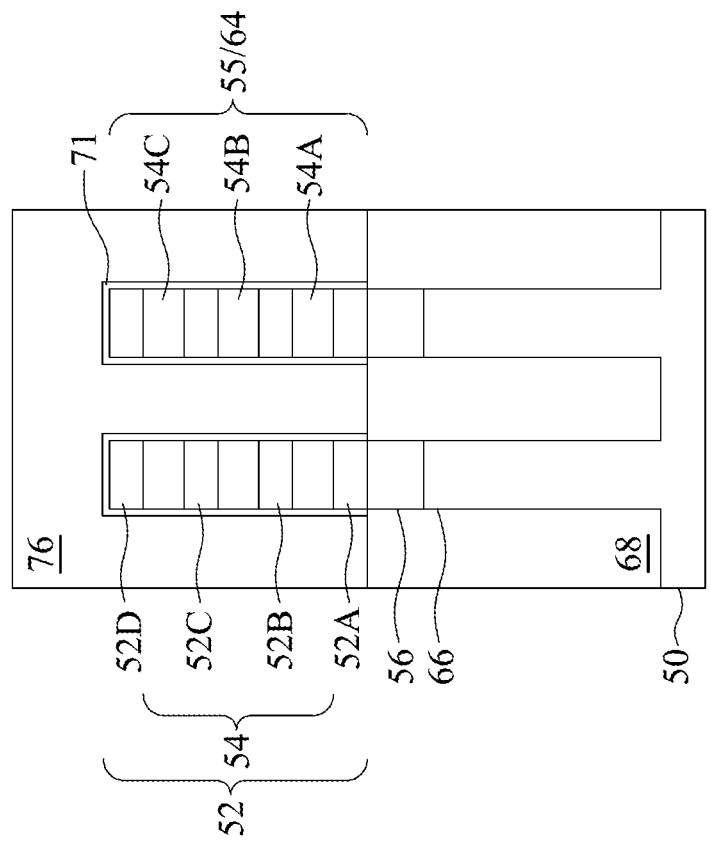
Fig. 14B
Fig. 14A

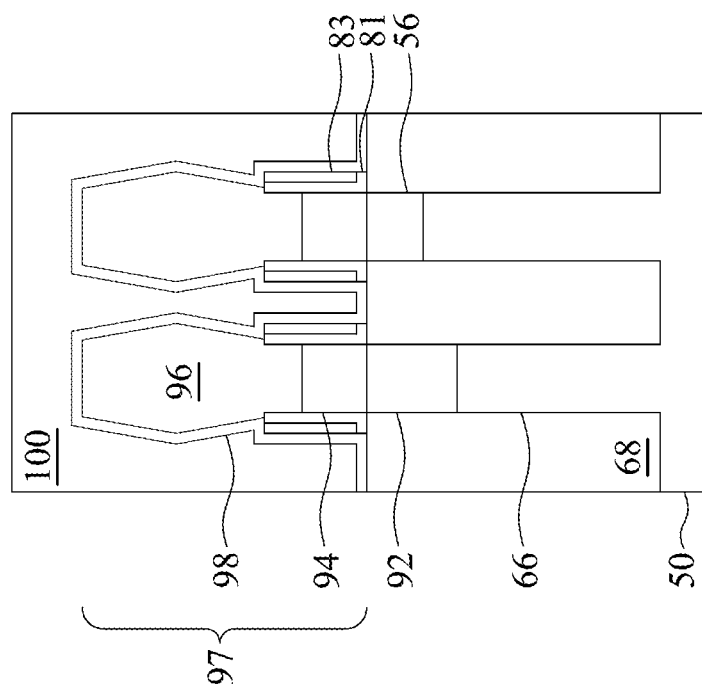
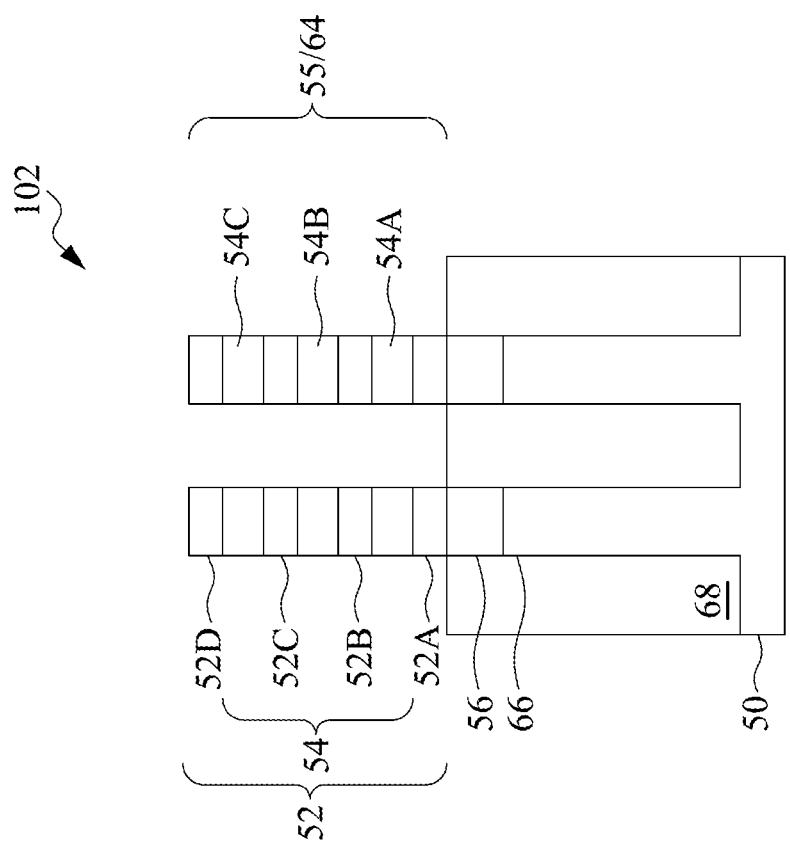
Fig. 15B
Fig. 15A

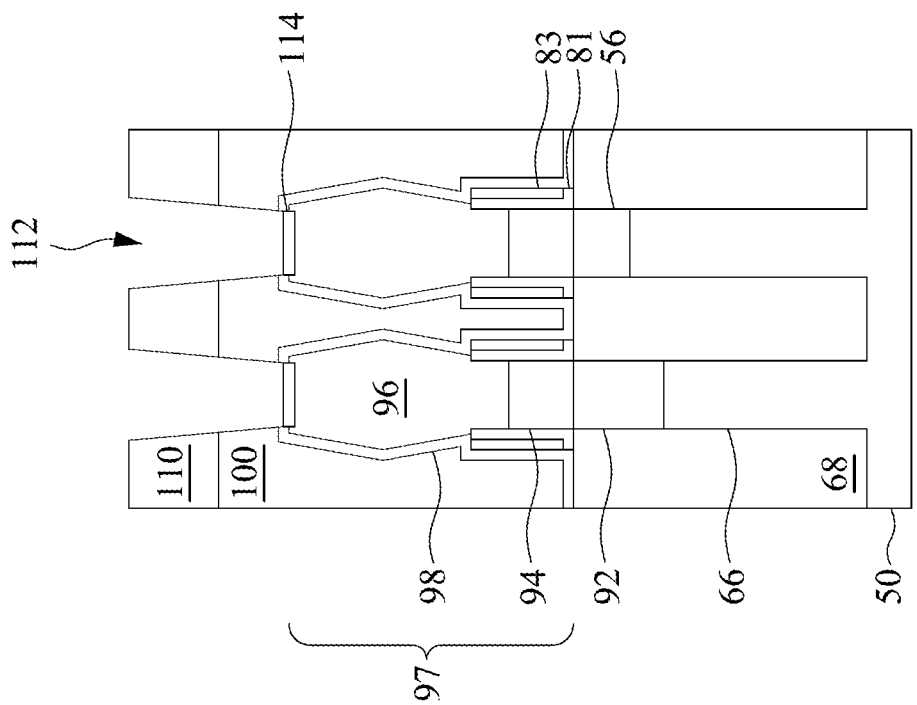
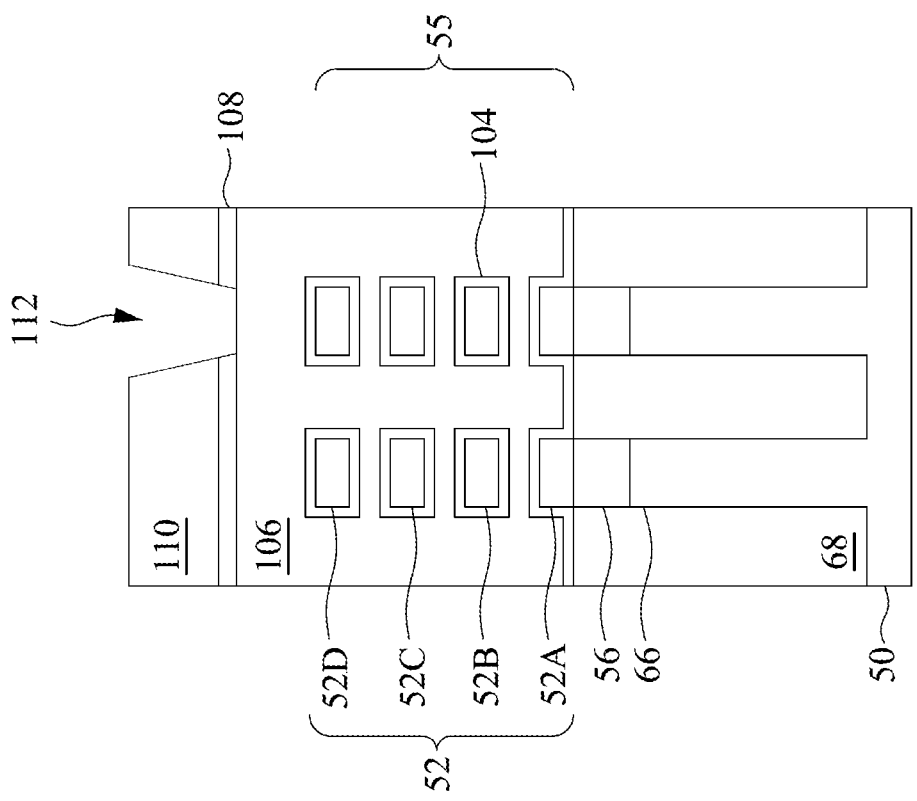
Fig. 19B
Fig. 19A

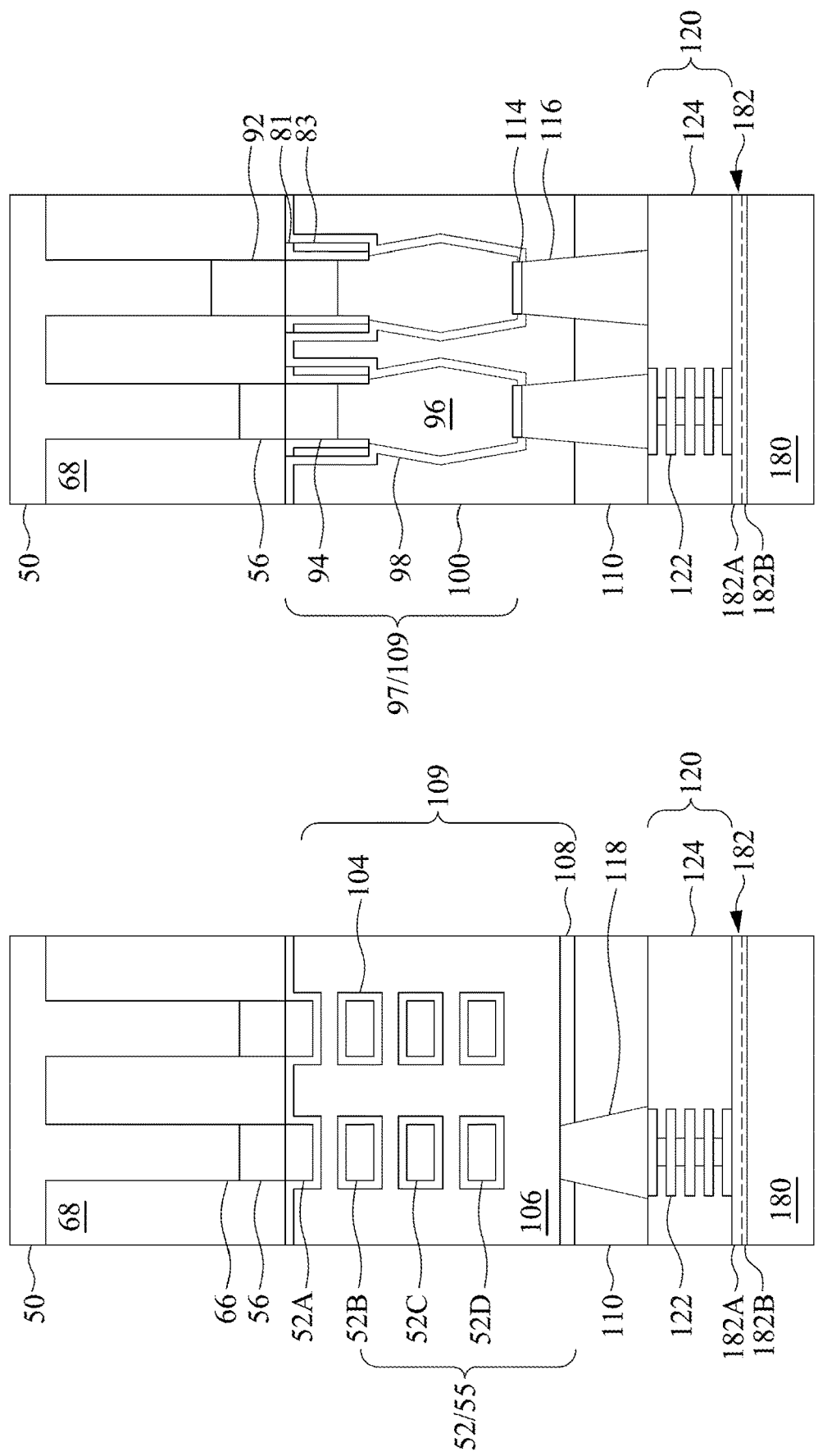

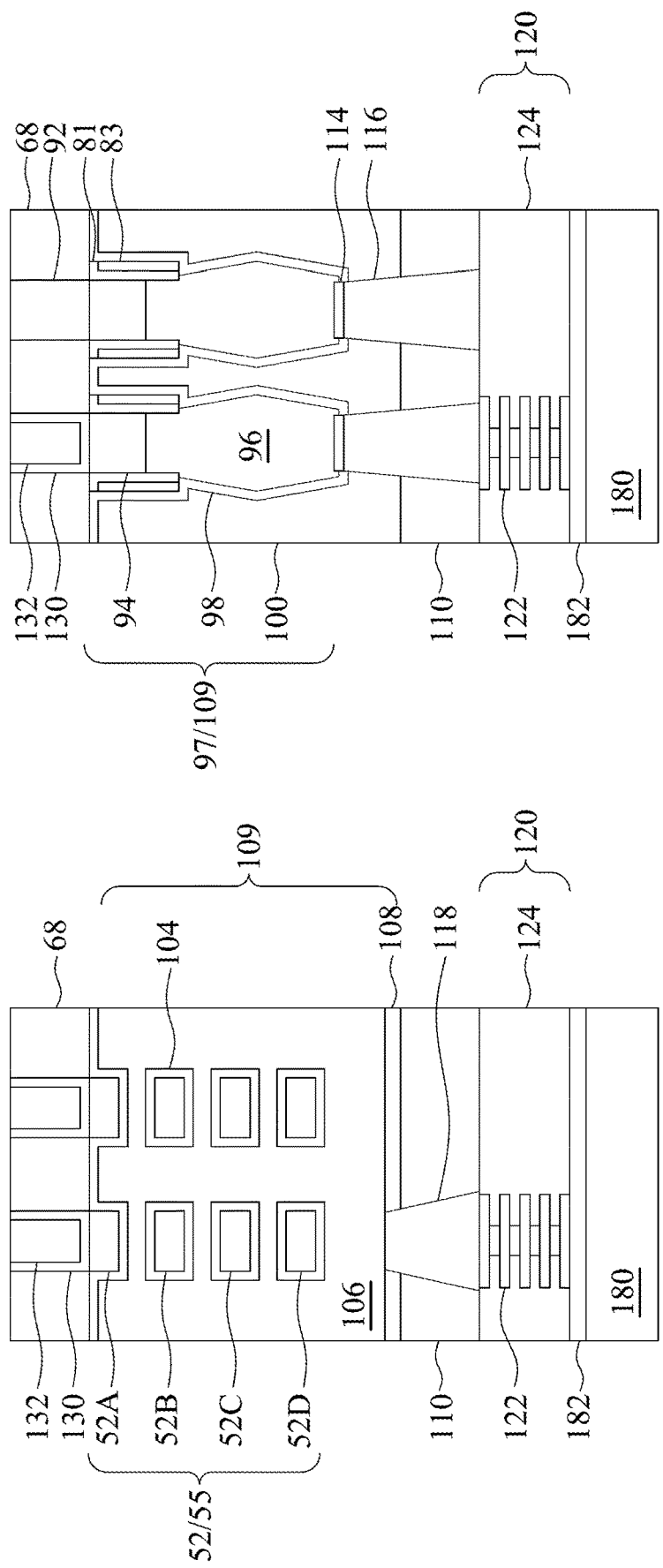

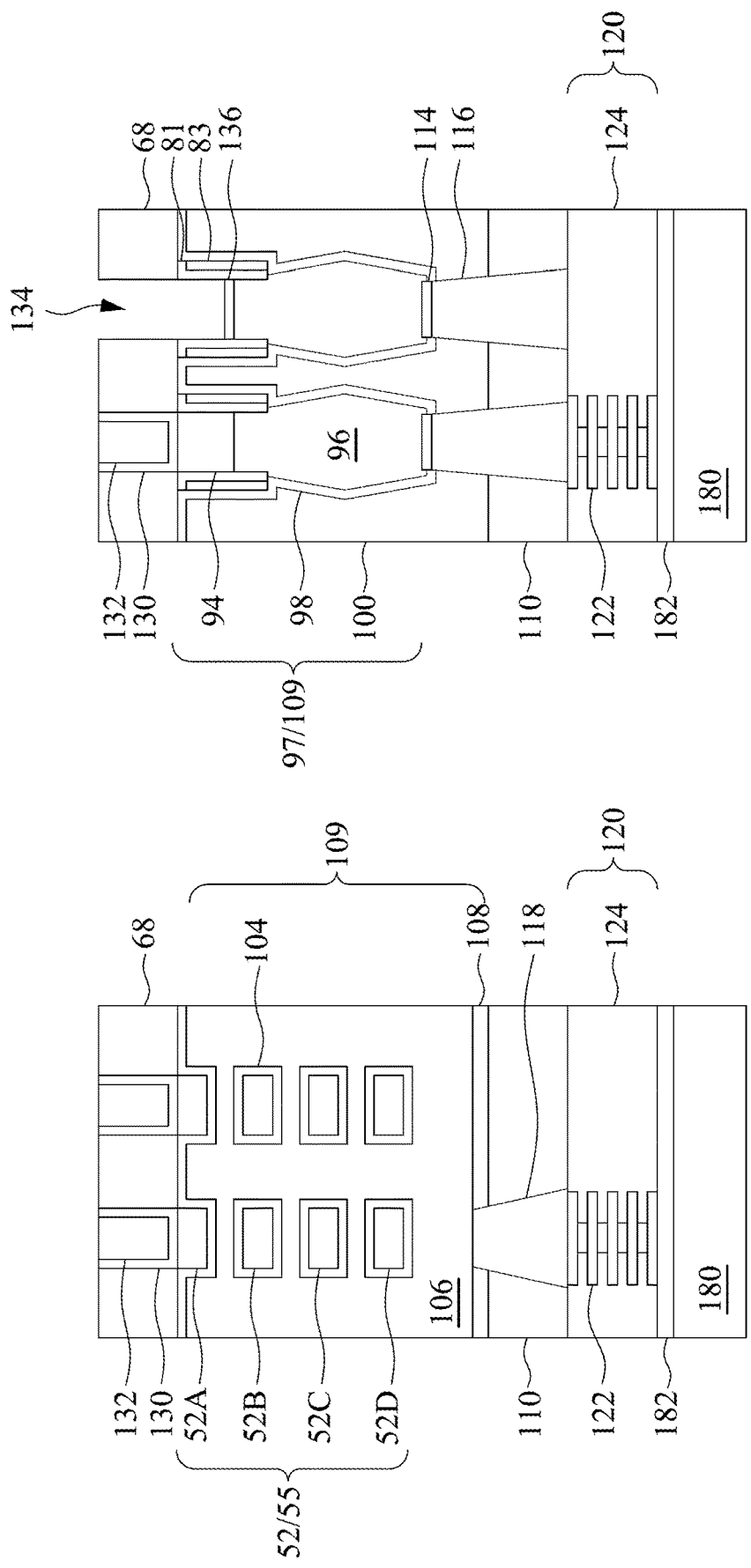

SEMICONDUCTOR DEVICES INCLUDING BACKSIDE POWER RAILS AND METHODS OF MANUFACTURE

PRIORITY CLAIM AND CROSS-REFERENCE

This application claims the benefit of U.S. Provisional Application No. 63/166,333 filed on Mar. 26, 2021, entitled "Implant Created Damage to Ease Facet Effect and Enhance Si/SiGe ER Selectivity of Wet Etch," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, and 28C are cross-sectional views of intermediate stages in the manufacturing of nano-FETs, in accordance with some embodiments.

DETAILED DESCRIPTION

Figure 1:
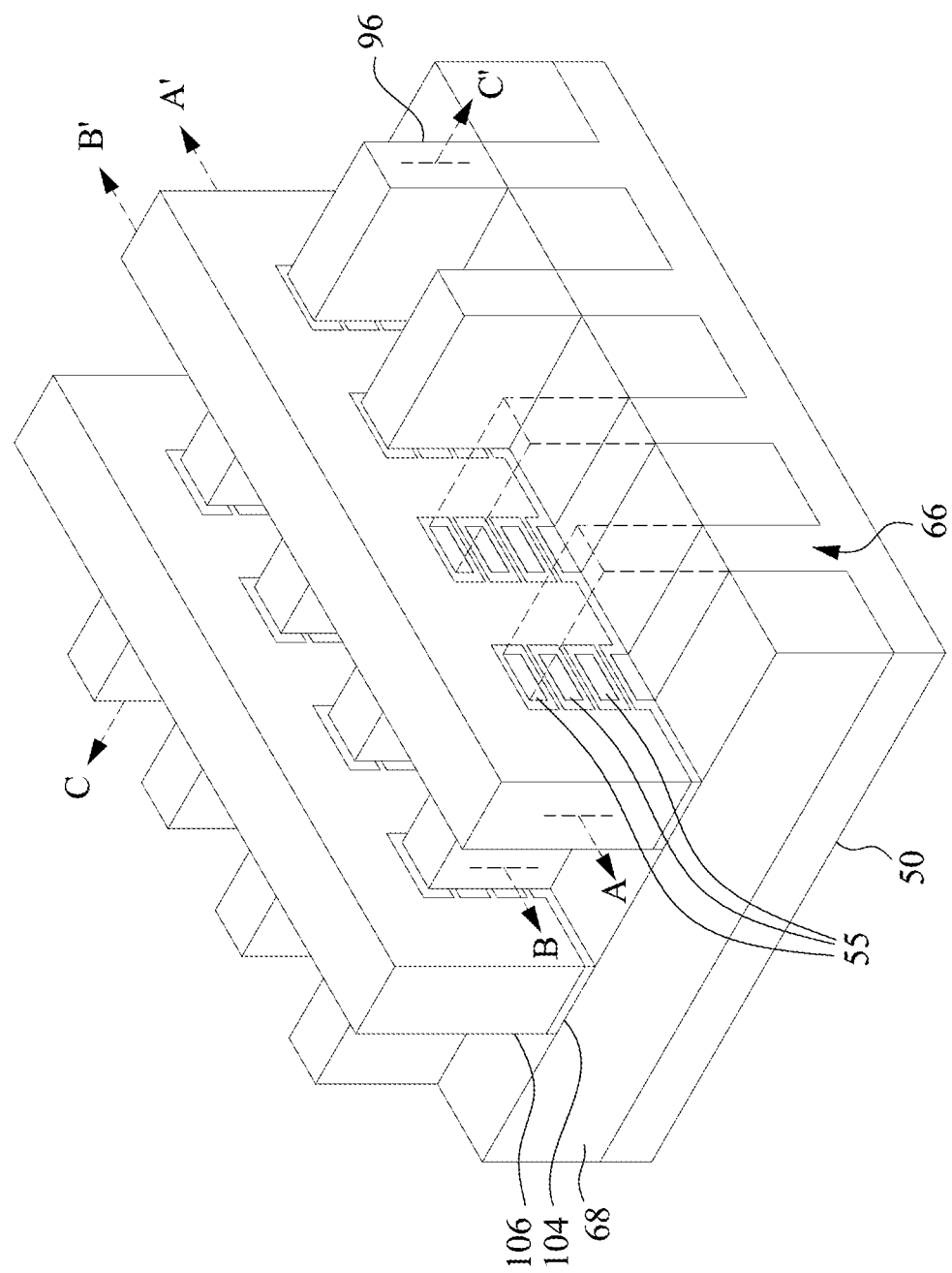
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide an improved method of performing a backside etching process on a substrate, and semiconductor devices formed by the same. The method includes performing an ion implantation on the substrate prior to etching the substrate. The ion implantation may be used to damage the crystal structure of the substrate, which increases an etch rate of the substrate, reduces etch rate variations of the substrate based on facets in the substrate (facet effect), and improves an etch selectivity of the substrate relative to surrounding materials (e.g., a silicon germanium (SiGe) dummy fin extending through the substrate, a SiGe etch stop layer, and the like). Performing the ion implantation on the substrate enables the substrate to be completely removed by an etch process, such as a wet etch process. An oxide may be subsequently grown in a recess formed by removing the substrate. Removing the substrate completely by performing the above-described ion implantation process improves the uniformity of oxide growth, which reduces device defects and improves device performance.

Embodiments are described below in a particular context, namely, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate). The nanostructures 55 act as channel regions for the nano-FETs. The nanostructures 55 may include p-type nanostructures, n-type nanostructures, or a combination thereof. Isolation regions 68 are disposed between adjacent fins 66, which may protrude above and from between neighboring isolation regions 68. Although the isolation regions 68 are described and illustrated as being separate from the substrate 50, as used herein, the term "substrate" may refer to the semiconductor substrate alone or a combination of the semiconductor substrate and the isolation regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring isolation regions 68.

Gate dielectric layers 104 are over top surfaces and sidewalls of the fins 66 and along top surfaces, sidewalls, and bottom surfaces of the nanostructures 55. Gate electrodes 106 are over the gate dielectric layers 104. Epitaxial source/drain regions 97 are disposed on the fins 66 on opposing sides of the gate dielectric layers 104 and the gate electrodes 106.

FIG. 1 further illustrates reference cross-sections that are used in later figures. Cross-section A-A' is along a longitudinal axis of a gate electrode 106 and in a direction, for example, perpendicular to the direction of current flow between epitaxial source/drain regions 97 of a nano-FET. Cross-section B-B' is perpendicular to cross-section A-A' and is parallel to a longitudinal axis of a fin 66 of the nano-FET and in a direction of, for example, a current flow between the epitaxial source/drain regions 97 of the nano-FET. Cross-section C-C' is parallel to cross-section A-A' and extends through the epitaxial source/drain regions 97 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects which may be used in planar devices, such as planar FETs, or in fin field-effect transistors (FinFETs).

FIGS. 2 through 28C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, and 28A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, and 28B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, and 28C illustrate reference cross-section C-C' illustrated in FIG. 1.

Figure 2:
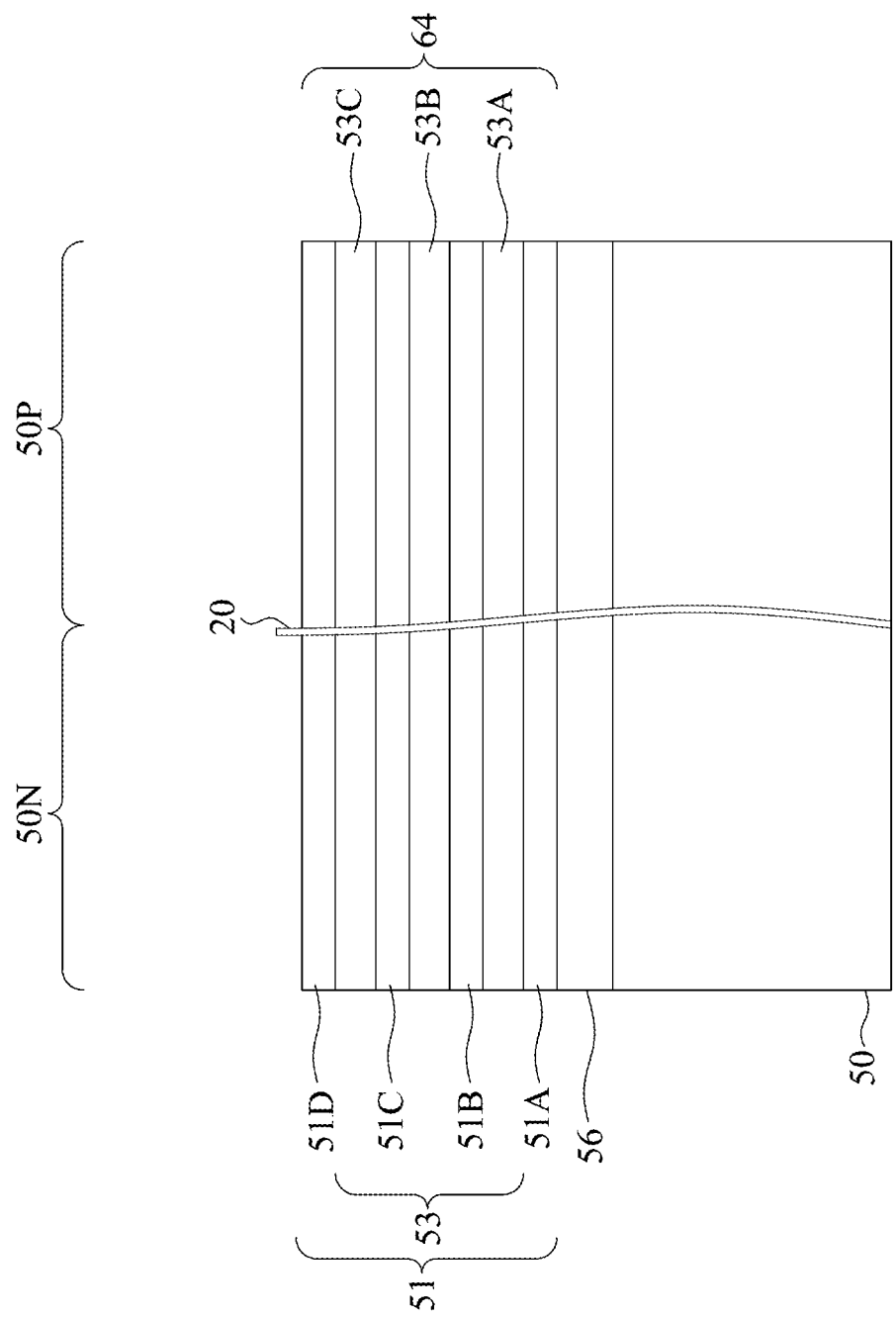

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs. The p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, or the like) may be disposed between the n-type region 50N and the p-type region 50P. Although one n-type region 50N and one p-type region 50P are illustrated, any number of n-type regions 50N and p-type regions 50P may be provided.

An etch stop layer 56 may be formed over the substrate 50. The etch stop layer 56 may be formed of a material having a high etch selectivity to the material of the substrate 50. As such, the substrate 50 may be removed without significantly removing the etch stop layer 56. In some embodiments, the etch stop layer 56 may be formed of silicon germanium or the like. In embodiments in which the etch stop layer 56 is formed of silicon germanium, the etch stop layer 56 may have an atomic germanium concentration ranging from about 10% to about 40%. The etch stop layer 56 may be epitaxially grown using a process such as chemical vapor deposition (CVD), atomic layer deposition (ALD), vapor phase epitaxy (VPE), molecular beam epitaxy (MBE), or the like.

Figure 28B:
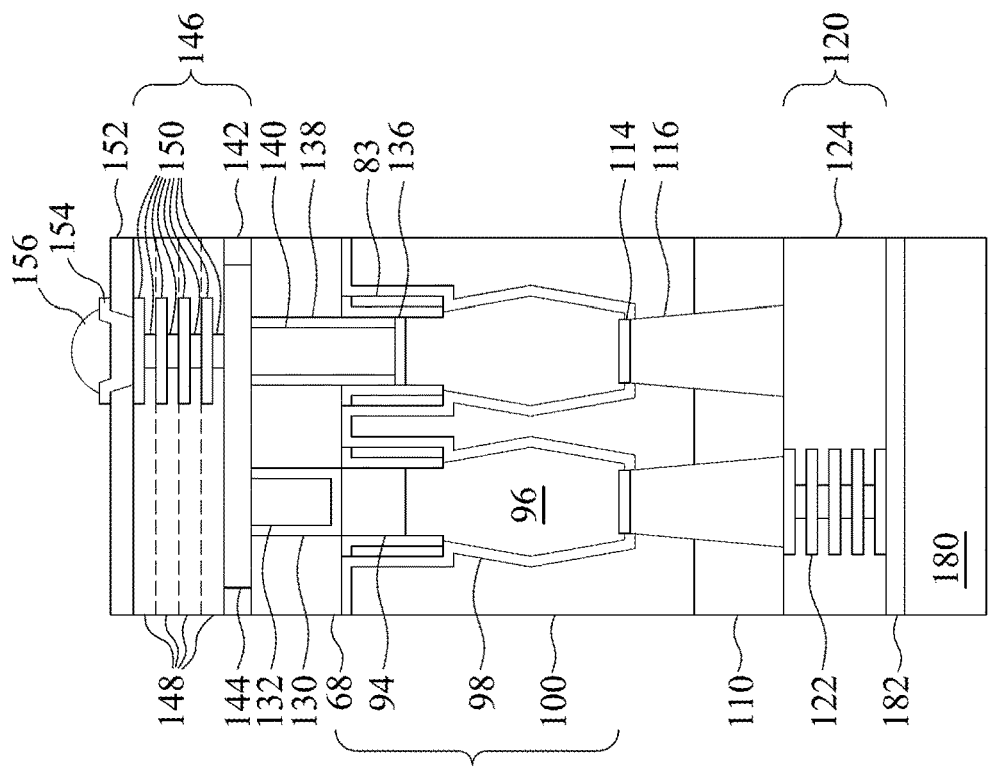
Figure 28A:
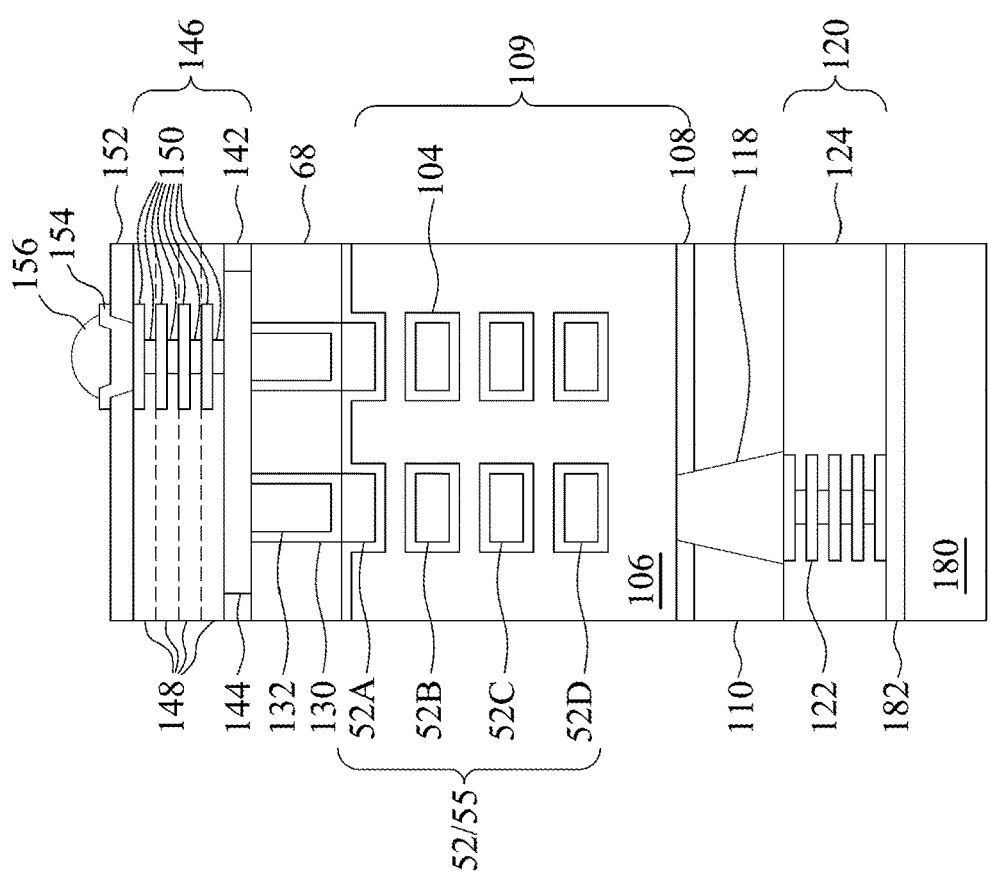
Figure 28C:
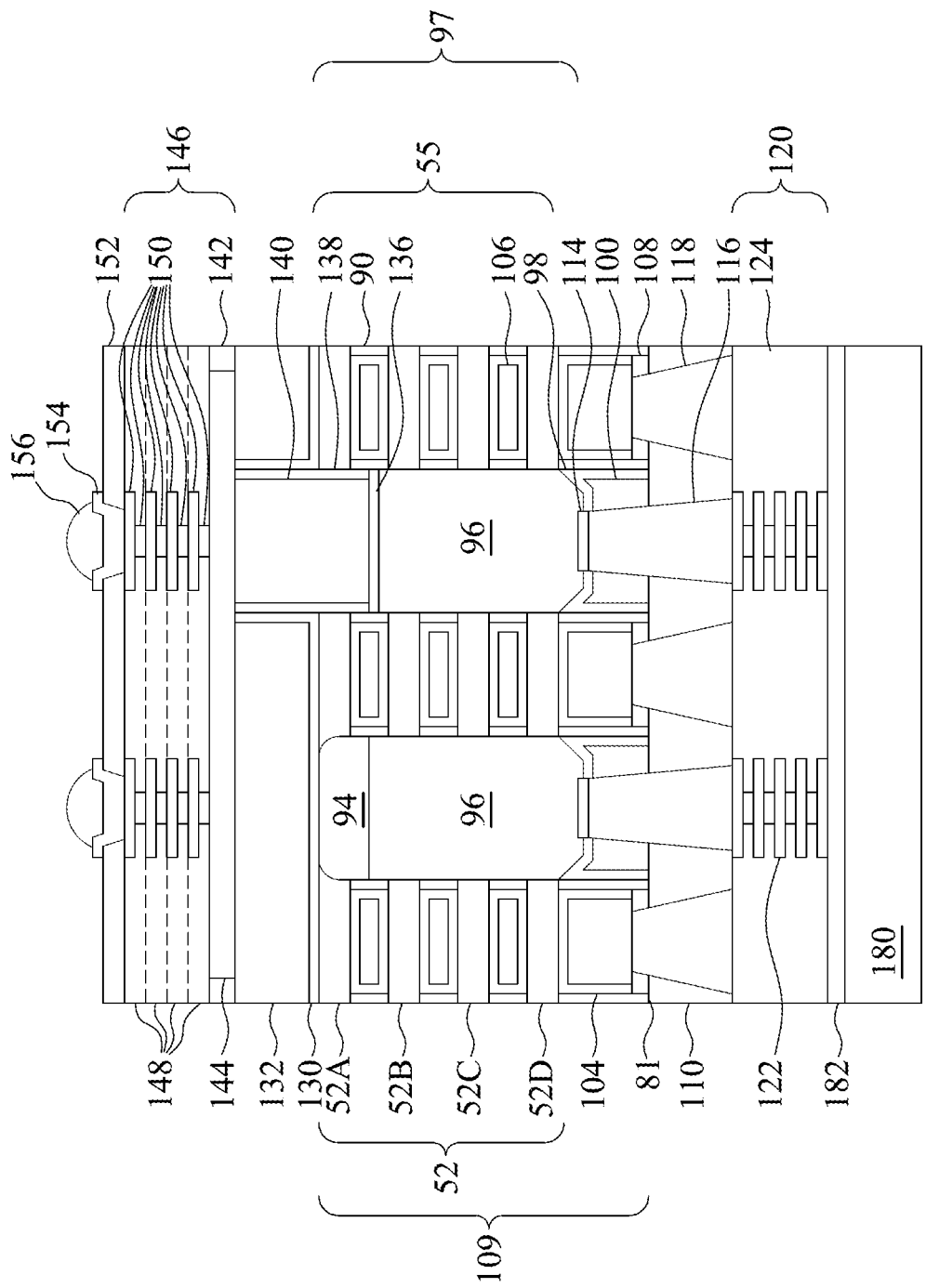

Further in FIG. 2, a multi-layer stack 64 is formed over the etch stop layer 56. The multi-layer stack 64 includes alternating layers of first semiconductor layers 51A-D (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the n-type region 50N and the p-type region 50P. In such embodiments, the channel regions in both the n-type region 50N and the p-type region 50P may have a same material composition (e.g., silicon, or the another semiconductor material) and may be formed simultaneously. FIGS. 28A through 28C illustrate a structure resulting from such embodiments where the channel regions in both the p-type region 50P and the n-type region 50N comprise silicon, for example.

In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments, the first semiconductor layers 51 may be removed and the second semiconductor layers 53 may be patterned to form channel regions of nano-FETs in both the n-type region 50N and the p-type region 50P.

The multi-layer stack 64 is illustrated as including four layers of the first semiconductor layers 51 and three layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as CVD, ALD, VPE, MBE, or the like. In some embodiments, the first semiconductor layers 51 may be formed of a first semiconductor material, such as silicon, silicon carbide, or the like, and the second semiconductor layers 53 may be formed of a second semiconductor material, such as silicon germanium or the like. The multi-layer stack 64 is illustrated as having a bottommost first semiconductor layer 51 formed of the first semiconductor material for illustrative purposes. In some embodiments, the multi-layer stack 64 may be formed having a bottommost second semiconductor layer 53 formed of the second semiconductor material.

The first semiconductor materials and the second semiconductor materials may be materials having a high etch selectivity to one another. As such, the second semiconductor layers 53 of the second semiconductor material may be removed without significantly removing the first semiconductor layers 51 of the first semiconductor material. This allows the first semiconductor layers 51 to be patterned to form channel regions of nano-FETs. Similarly, in embodiments in which the first semiconductor layers 51 are removed and the second semiconductor layers 53 are patterned to form channel regions, the first semiconductor layers 51 of the first semiconductor material may be removed without significantly removing the second semiconductor layers 53 of the second semiconductor material. This allows the second semiconductor layers 53 to be patterned to form channel regions of nano-FETs.

Figure 3:
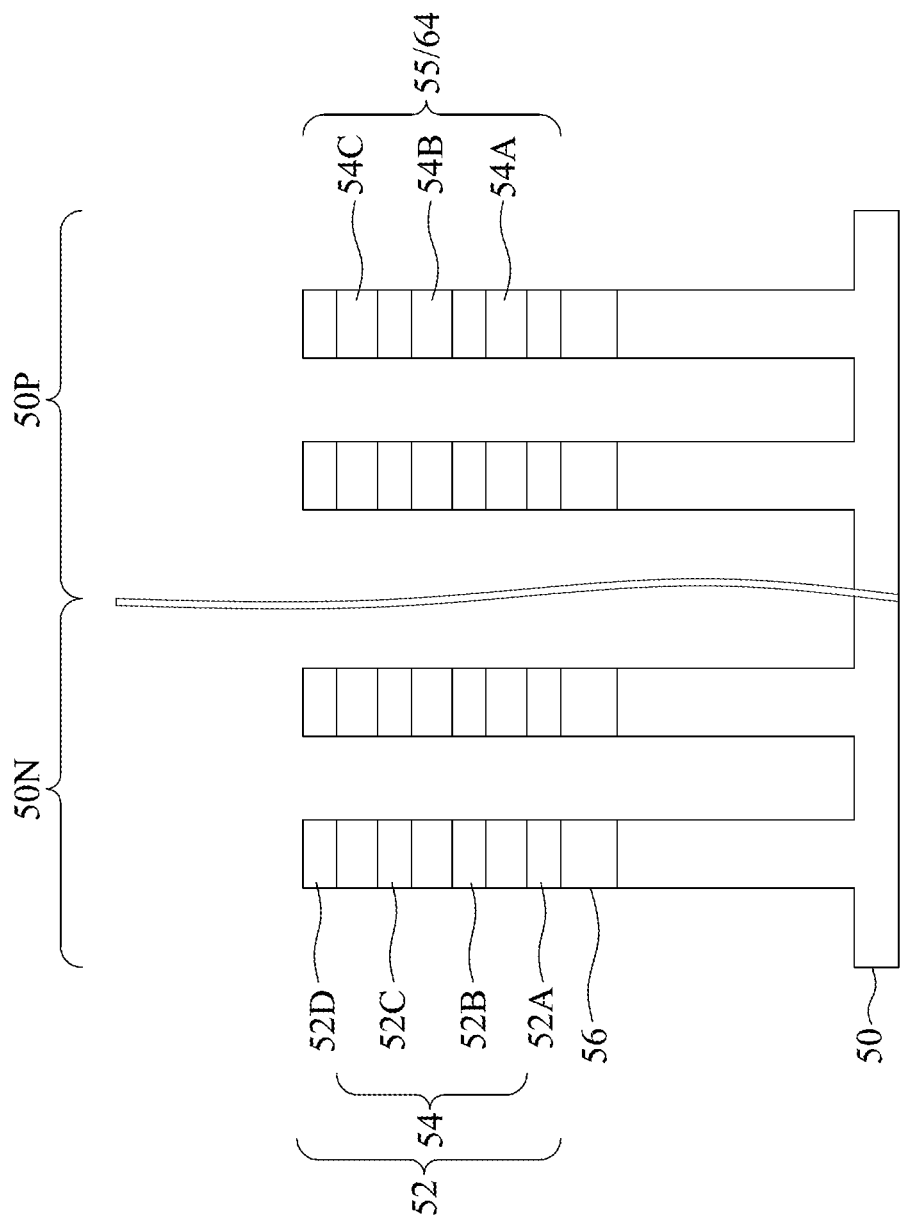

In FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64, the etch stop layer 56, and the substrate 50. The etching may be any acceptable etch process, such as a reactive ion etching (RIE), neutral beam etching (NBE), the like, or a combination thereof. The etching may be anisotropic. Forming the nanostructures 55 by etching the multi-layer stack 64 may further define first nanostructures 52A-D (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater than or less than widths of the fins 66 in the p-type region 50P. Further, while each of the fins 66 and the nanostructures 55 are illustrated as having consistent widths throughout, in some embodiments, the fins 66 and/or the nanostructures 55 may have tapered sidewalls. As such, a width of each of the fins 66 and/or the nanostructures 55 may continuously increase in a direction towards the substrate 50. In such embodiments, each of the nanostructures 55 in a vertical stack may have a different width and may be trapezoidal in shape.

Figure 4:
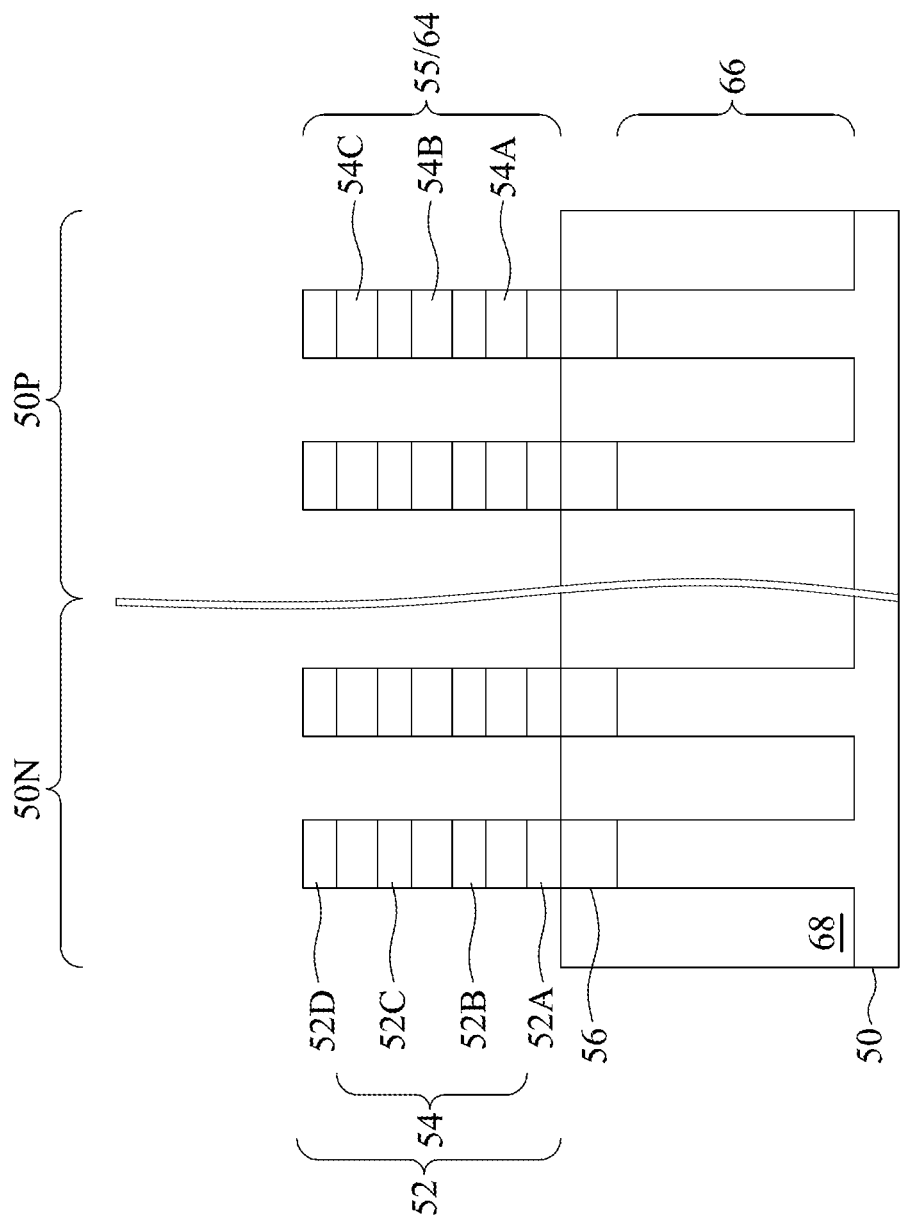

In FIG. 4, shallow trench isolation (STI) regions 68 are formed adjacent the fins 66. The STI regions 68 may be formed by depositing an insulation material over the substrate 50, the fins 66, the etch stop layer 56, and nanostructures 55, and between adjacent ones of the fins 66. The insulation material may be an oxide (such as silicon oxide), a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may be formed along surfaces of the substrate 50, the fins 66, the etch stop layer 56, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55, such that top surfaces of the nanostructures 55 and the insulation material are level after the planarization process is complete.

The insulation material is then recessed to form the STI regions 68. The insulation material is recessed such that the nanostructures 55 in the n-type region 50N and the p-type region 50P protrude from between neighboring ones of the STI regions 68. Top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the nanostructures 55). As illustrated in FIG. 4, top surfaces of the STI regions 68 may be level with top surfaces of the etch stop layer 56. However, in some embodiments, the top surfaces of the STI regions 68 may be disposed above or below the top surfaces of the etch stop layer 56. For example, an oxide removal using dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer may be formed over a top surface of the substrate 50, and trenches may be etched through the dielectric layer to expose the underlying substrate 50. Epitaxial structures may be epitaxially grown in the trenches, and the dielectric layer may be recessed such that the epitaxial structures protrude from the dielectric layer to form the fins 66, the etch stop layer 56, and/or the nanostructures 55. The epitaxial structures may comprise alternating layers of the semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations. In some embodiments, in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist may be formed by using a spin-on technique and may be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations. In some embodiments, in situ and implantation doping may be used together.

Figure 5:
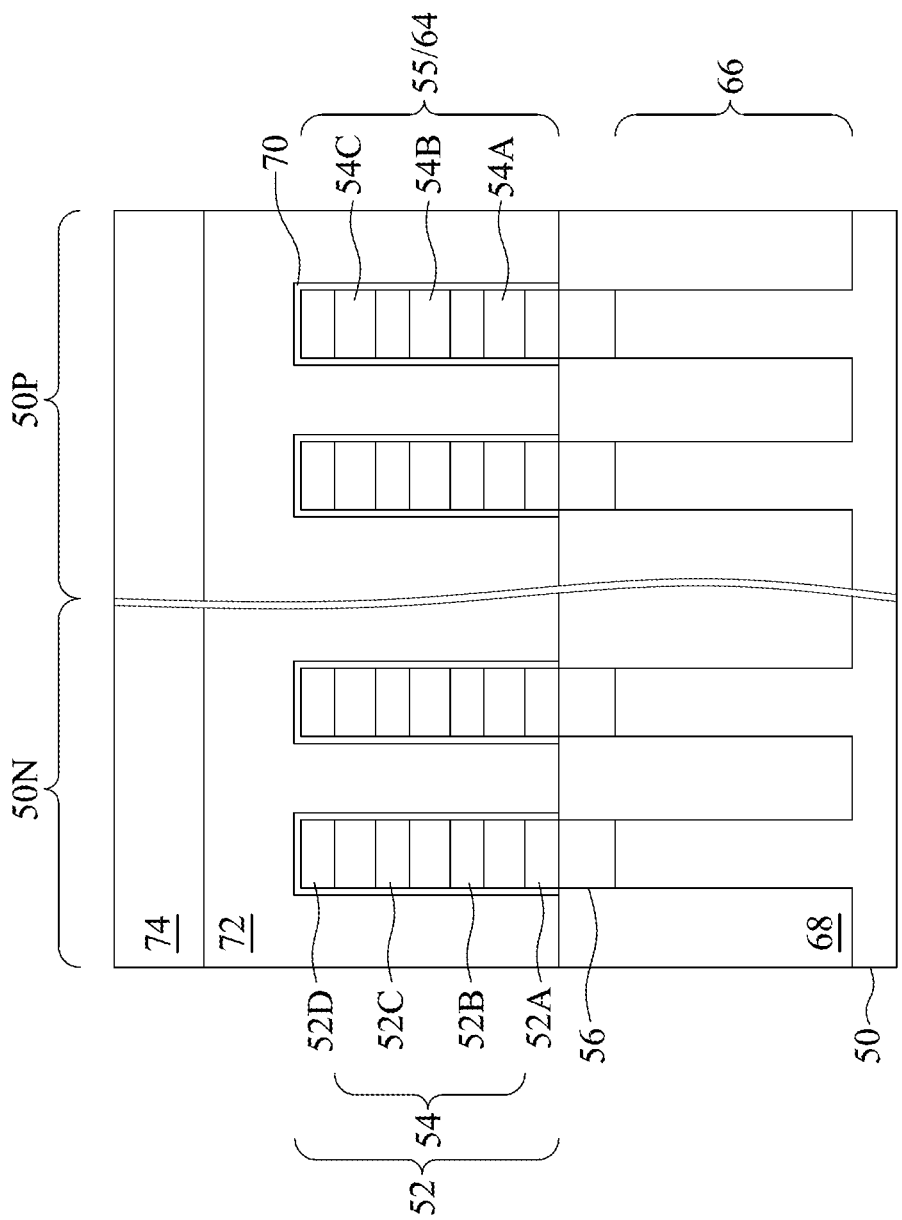

In FIG. 5, a dummy dielectric layer 70 is formed on the fins 66 and/or the nanostructures 55. The dummy dielectric layer 70 may be, for example, silicon oxide, silicon nitride, a combination thereof, or the like. The dummy dielectric layer 70 may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of the STI regions 68.

The mask layer 74 may be deposited over the dummy gate layer 72. The mask layer 74 may include, for example, silicon nitride, silicon oxynitride, or the like. In the illustrated embodiment, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6C:
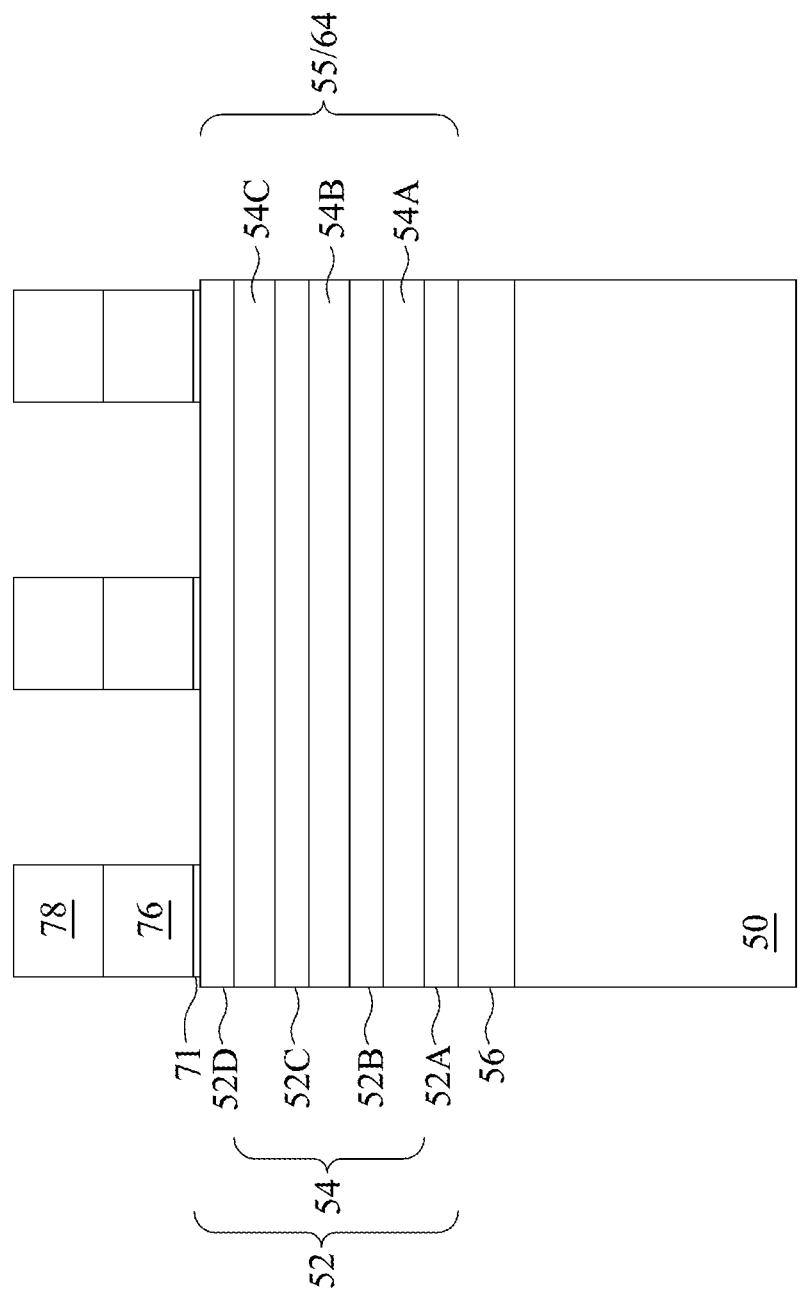

FIGS. 6A through 28C illustrate various additional steps in the manufacturing of embodiment devices. FIGS. 6A through 28C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction perpendicular to the lengthwise direction of respective fins 66.

Figures 7A, 7B:
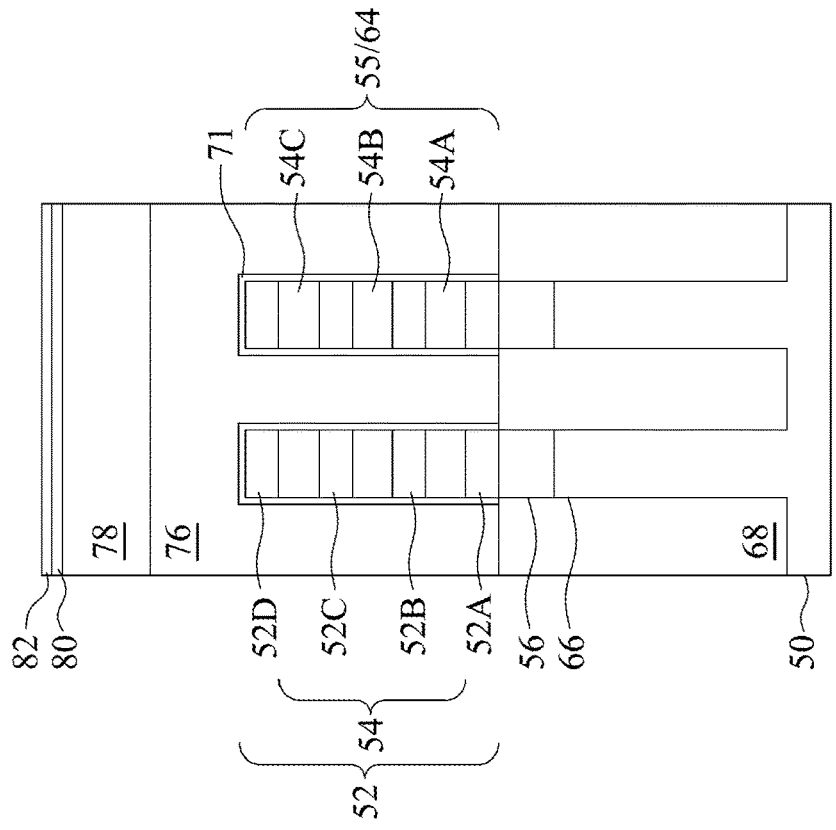
Figure 7C:
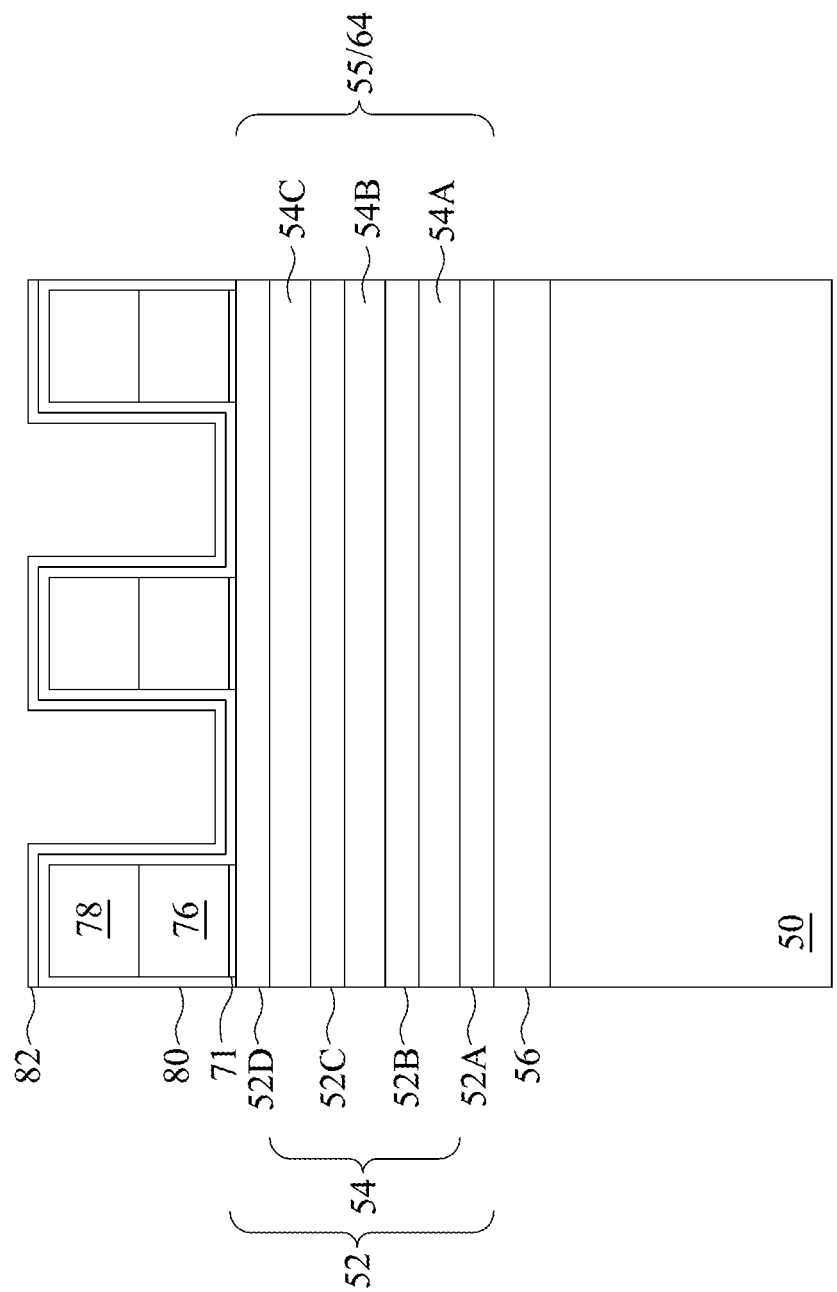

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the nanostructures 55 and the masks 78; and sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and the nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8C:
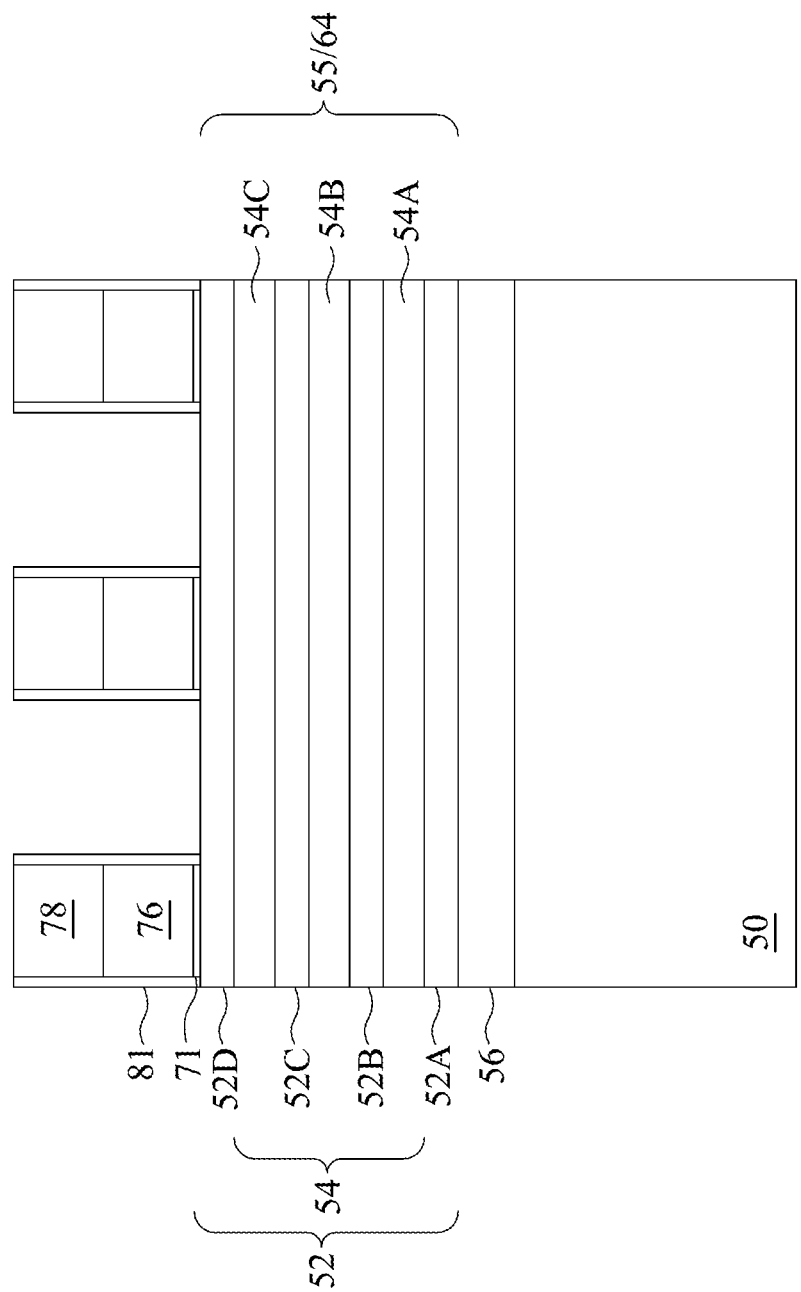

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process wherein the first spacer layer 80 acts as an etch stop layer. Remaining portions of the second spacer layer 82 form the second spacers 83 as illustrated in FIG. 8B. Thereafter, the second spacers 83 acts as a mask while etching exposed portions of the first spacer layer 80, forming the first spacers 81, as illustrated in FIGS. 8B and 8C.

As illustrated in FIG. 8B, the first spacers 81 and the second spacers 83 are disposed on sidewalls of the nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
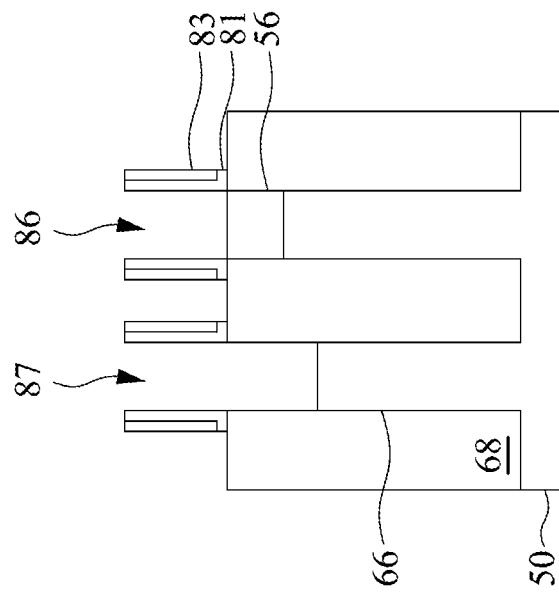
Figure 9A:
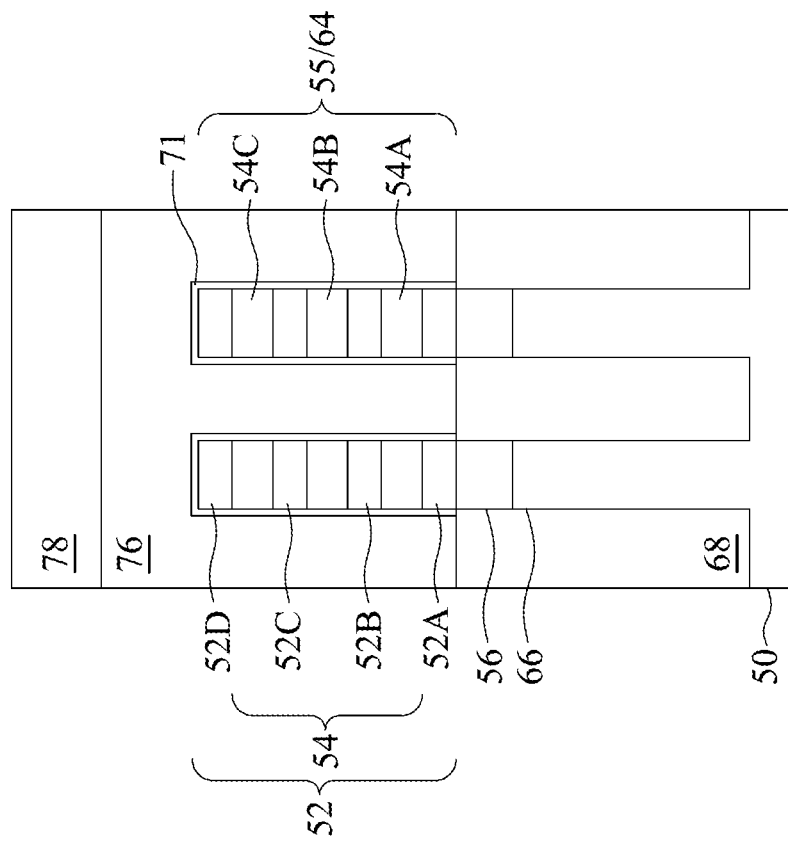
Figure 9C:
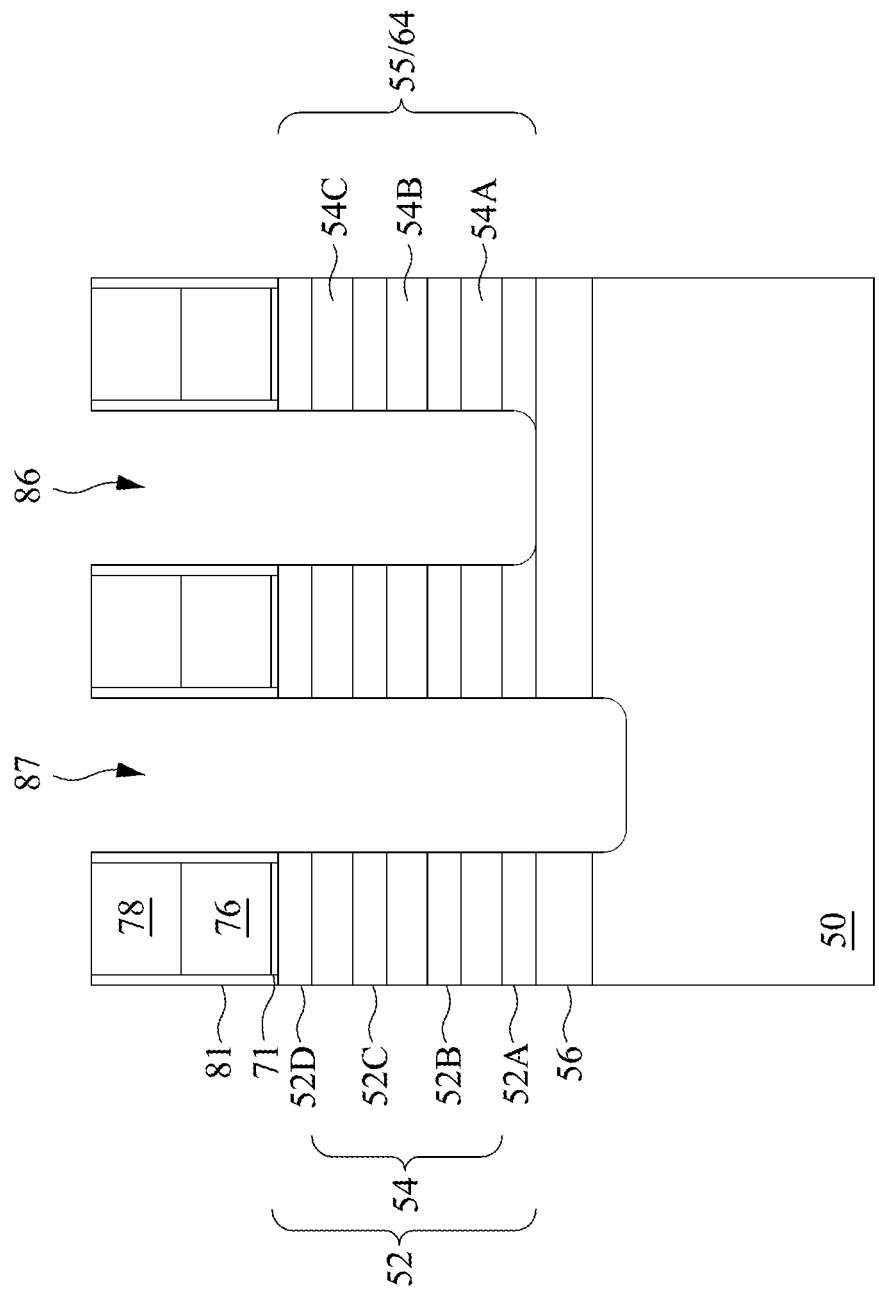

In FIGS. 9A through 9C, first recesses 86 and second recesses 87 are formed in the nanostructures 55, the etch stop layer 56, the fins 66, and the substrate 50. Epitaxial materials, which may be used as source/drain regions and/or dummy regions, will be subsequently formed in the first recesses 86 and the second recesses 87. The first recesses 86 may extend through the first nanostructures 52A-52D and the second nanostructures 54A-54C to the etch stop layer 56. In some embodiments, top surfaces of the STI regions 68 may be level with bottom surfaces of the first recesses 86. In some embodiments, the fins 66 may be etched such that bottom surfaces of the first recesses 86 are disposed below the top surfaces of the STI regions 68 or the like. The second recesses 87 may extend through the first nanostructures 52A-52D, the second nanostructures 54A-54C, the etch stop layer 56, and into the fins 66 and the substrate 50. Bottom surfaces of the second recesses 87 may be disposed below the bottom surfaces of the first recesses 86 and the top surfaces of the STI regions 68.

The first recesses 86 and the second recesses 87 may be formed by etching the nanostructures 55, the etch stop layer 56, the fins 66, and the substrate 50 using anisotropic etching processes, such as RIE, NBE, or the like. The first spacers 81, the second spacers 83, and the masks 78 mask portions of the nanostructures 55, the etch stop layer 56, the fins 66, and the substrate 50 during the etching processes used to form the first recesses 86 and the second recesses 87. A single etch process or multiple etch processes may be used to etch each layer of nanostructures 55, the etch stop layer 56, the fins 66, and the substrate 50. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
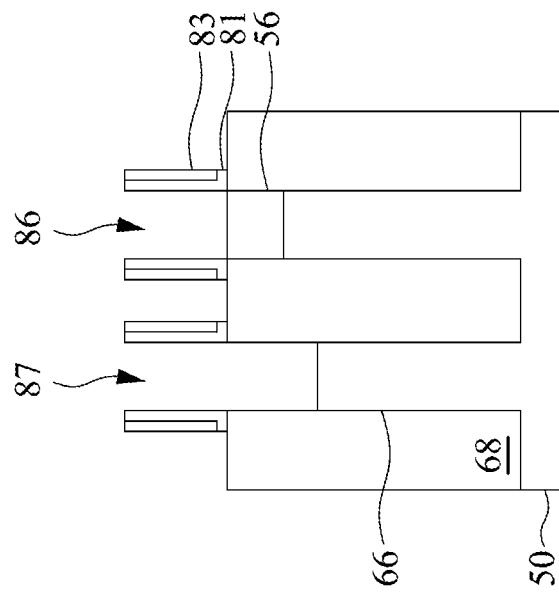
Figure 10A:
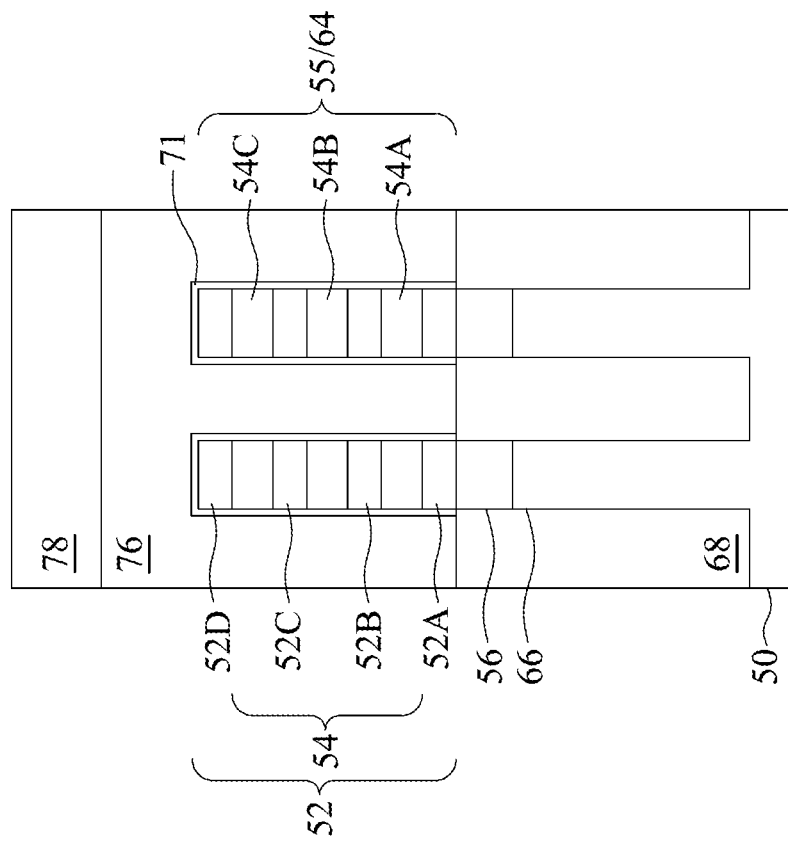
Figure 10C:
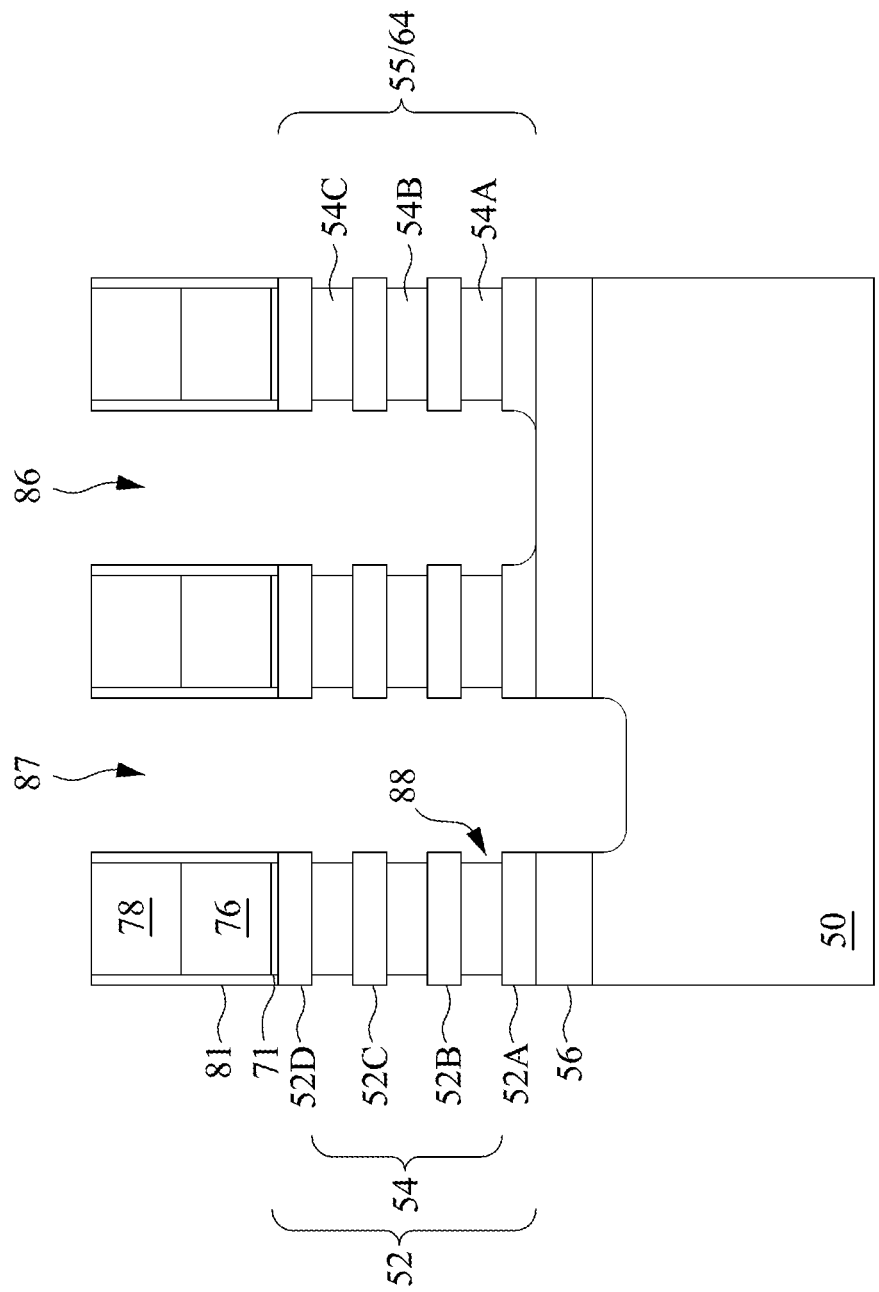

In FIGS. 10A through 10C, portions of sidewalls of the layers of the multi-layer stack 64 formed of the second semiconductor materials (e.g., the second nanostructures 54) exposed by the first recesses 86 and the second recesses 87 are etched to form sidewall recesses 88 in the n-type region 50N and the p-type region 50P. Although sidewalls of the second nanostructures 54 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., Si or SiC, and the second nanostructures 54 include, e.g., SiGe, a wet or dry etch process with hydrogen fluoride, another fluorine-based etchant, or the like may be used to etch sidewalls of the second nanostructures 54 in the n-type region 50N and the p-type region 50P.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and gate structures. As will be discussed in greater detail below, the source/drain regions will be formed in the first recesses 86 and the second recesses 87, while the second nanostructures 54 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the first nanostructures 52, the outer sidewalls of the first inner spacers 90 may extend beyond or be recessed from the sidewalls of the first nanostructures 52.

Figure 11B:
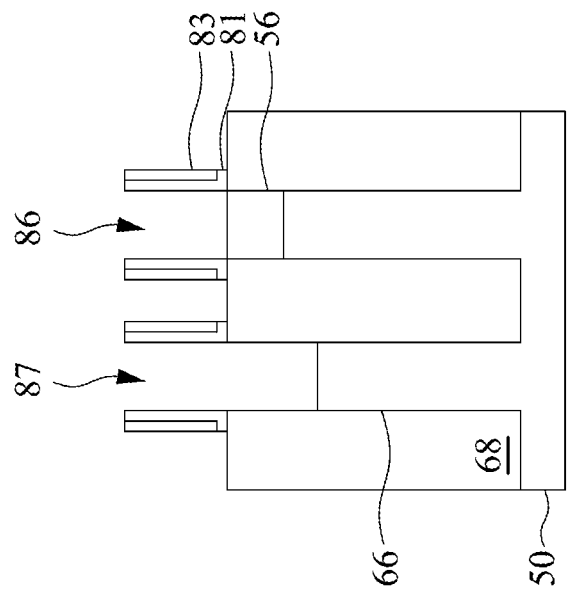
Figure 11A:
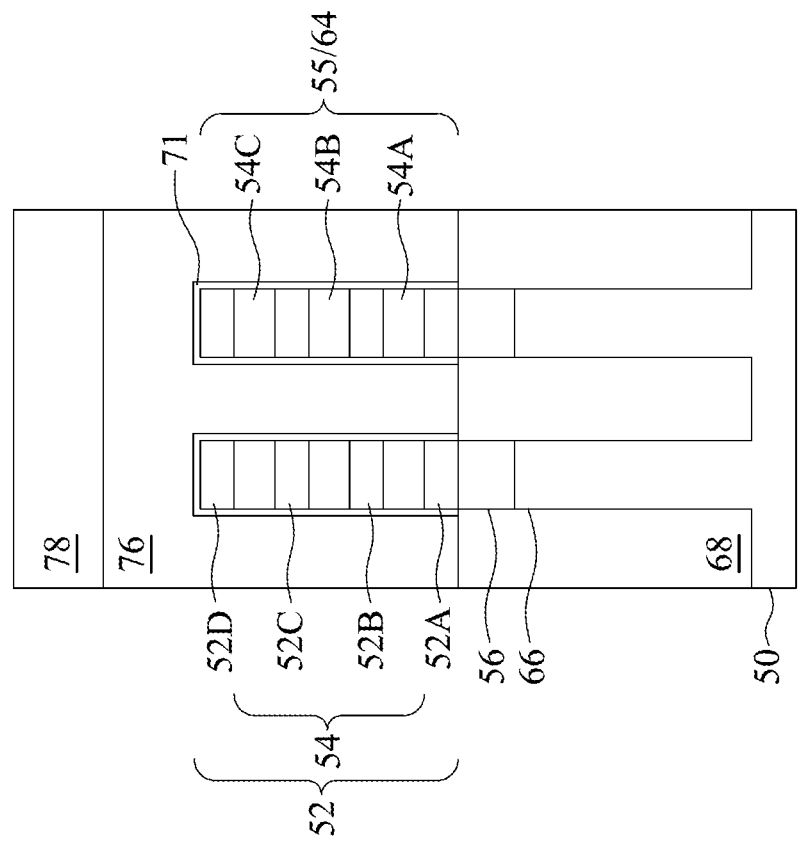
Figure 11C:
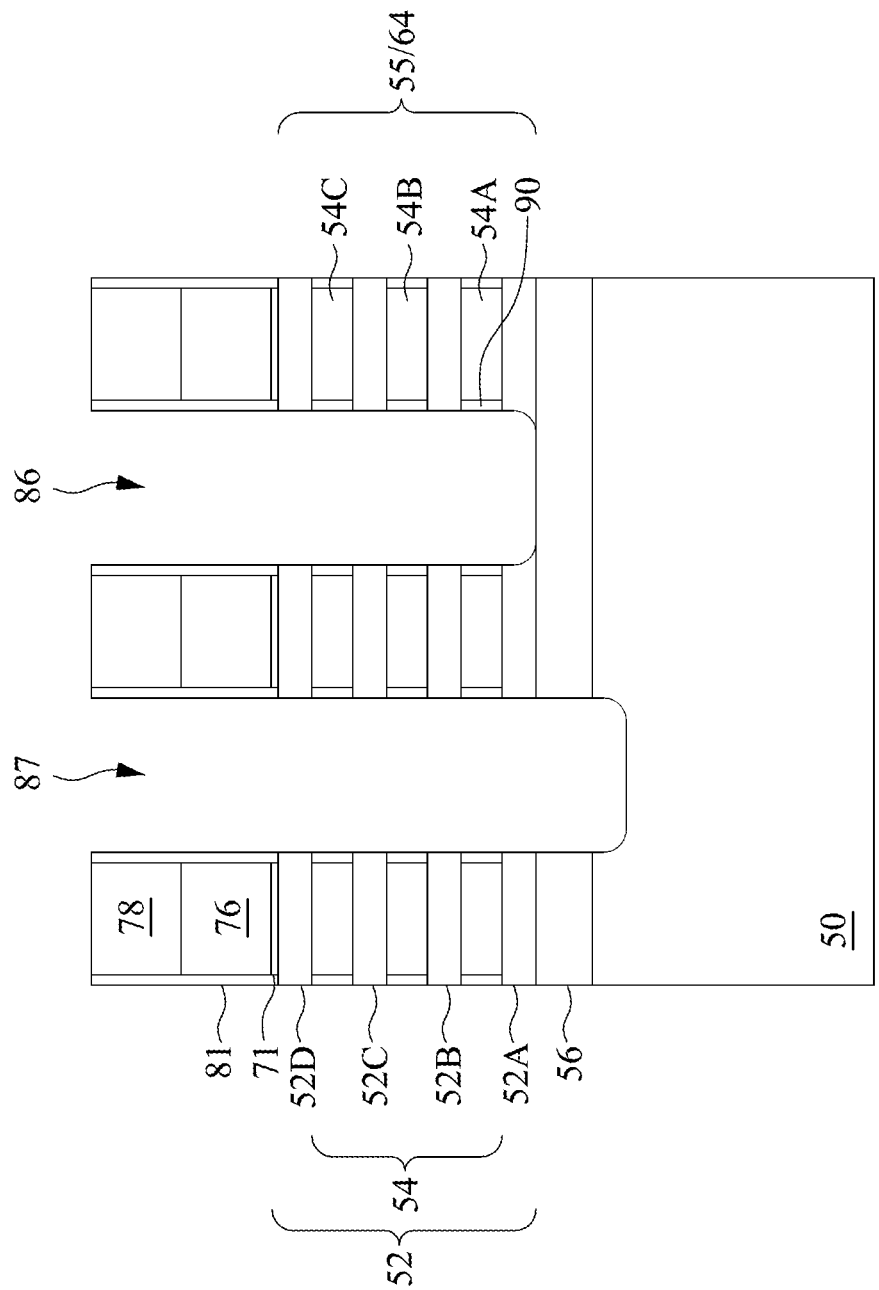
Figure 11D:
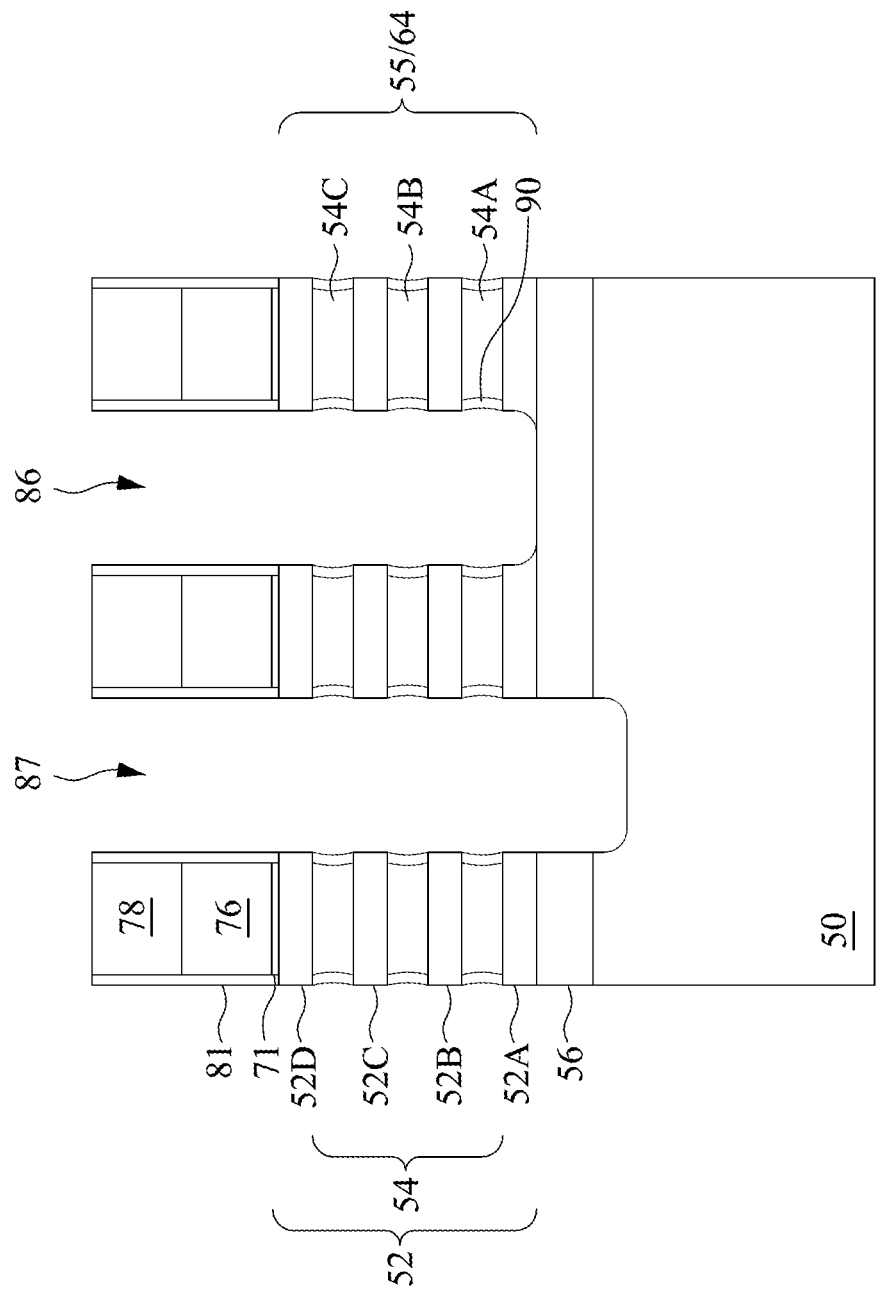

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the second nanostructures 54 are concave, outer sidewalls of the first inner spacers 90 are concave, and the first inner spacers 90 are recessed from sidewalls of the first nanostructures 52. The inner spacer layer may be etched by an anisotropic etching process, such as RIE, NBE, or the like. The first inner spacers 90 may be used to prevent damage to subsequently formed source/drain regions (such as the epitaxial source/drain regions 97, discussed below with respect to FIGS. 12A through 12E) by subsequent etching processes, such as etching processes used to form gate structures.

In FIGS. 12A through 12E, first epitaxial materials 92 are formed in the second recesses 87 and second epitaxial materials 94 and third epitaxial materials 96 are formed in the first recesses 86 and the second recesses 87. In some embodiments, the first epitaxial materials 92 and the second epitaxial materials 94 in the second recesses 87 may be sacrificial materials, which are subsequently removed to form backside vias (such as the backside vias 140, discussed below with respect to FIGS. 27A through 27C). The second epitaxial materials 94 and the third epitaxial materials 96 formed in the first recesses 86 and the third epitaxial materials 96 formed in the second recesses 87 may be used for epitaxial source/drain regions 97. In some embodiments, the epitaxial source/drain regions 97 may exert stress on the first nanostructures 52 thereby improving performance.

Figure 12B:
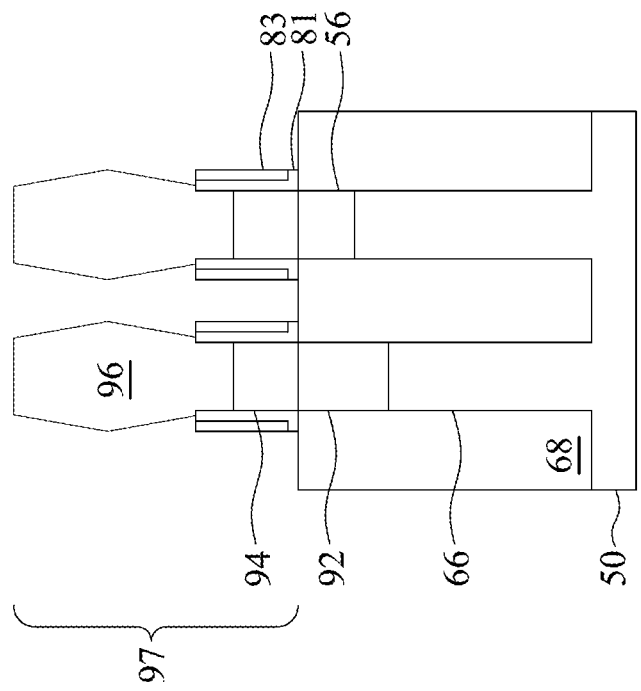
Figure 12A:
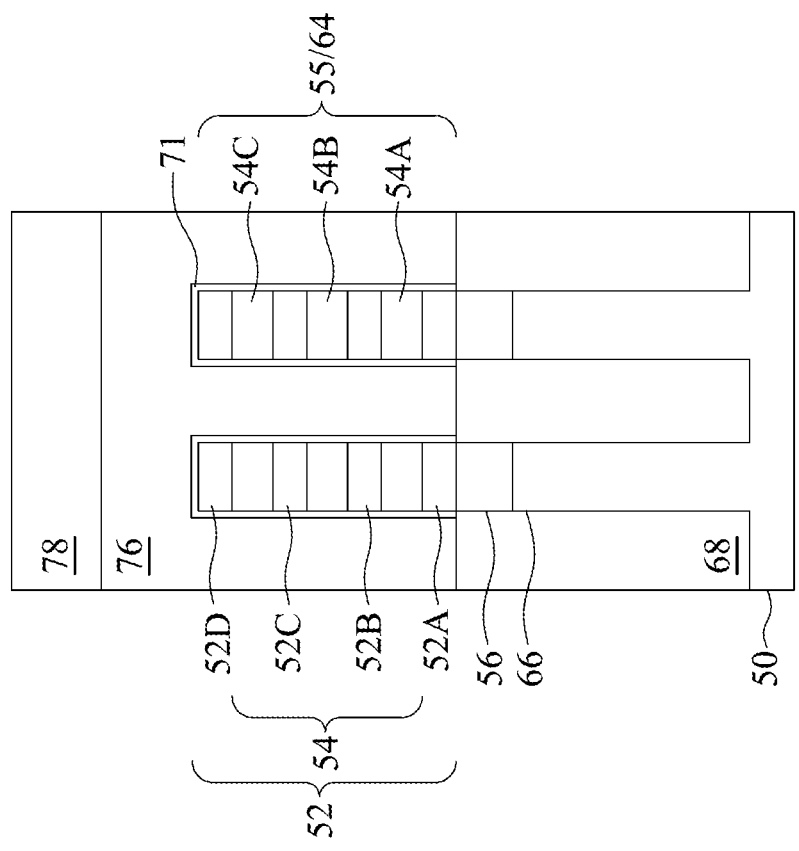
Figure 12C:
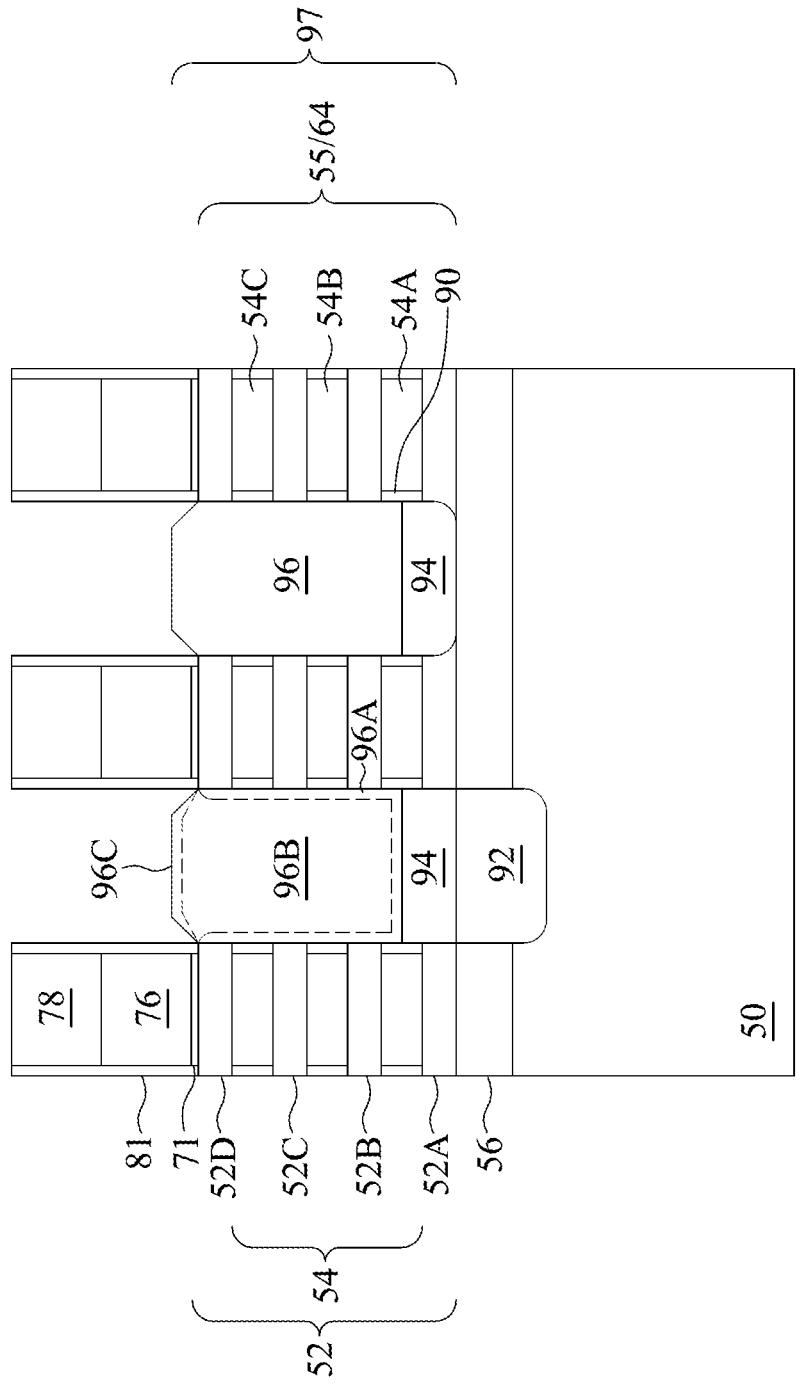

As illustrated in FIG. 12C, the epitaxial source/drain regions 97 are formed in the first recesses 86 and the second recesses 87 such that each dummy gate 76 is disposed between respective neighboring pairs of the epitaxial source/drain regions 97. In some embodiments, the first spacers 81 are used to separate the epitaxial source/drain regions 97 from the dummy gates 76 and the first inner spacers 90 are used to separate the epitaxial source/drain regions 97 from the nanostructures 55 by an appropriate lateral distance so that the epitaxial source/drain regions 97 do not short out with subsequently formed gates of the resulting nano-FETs.

The first epitaxial materials 92 may be grown such that top surfaces of the first epitaxial materials 92 are level with bottom surfaces of the first recesses 86 (see FIGS. 11A through 11D) and top surfaces of the etch stop layer 56. However, in some embodiments, top surfaces of the first epitaxial materials 92 may be disposed above or below the top surfaces of the etch stop layer 56. The first epitaxial materials 92 may be epitaxially grown in the second recesses 87 using a process such as CVD, ALD, VPE, MBE, or the like. The first epitaxial materials 92 may include any acceptable materials, such as silicon germanium or the like. In embodiments in which the first epitaxial materials 92 are formed of silicon germanium, the first epitaxial materials 92 may have an atomic germanium concentration ranging from about 20% to about 40%.

The second epitaxial materials 94 may be epitaxially grown over the first epitaxial materials 92 in the first recesses 86 and over the etch stop layer 56 in the second recesses 87 using a process such as CVD, ALD, VPE, MBE, or the like. The second epitaxial materials 94 may include any acceptable materials, such as silicon germanium or the like. In embodiments in which the second epitaxial materials 94 are formed of silicon germanium, the second epitaxial materials 94 may have an atomic germanium concentration ranging from about 10% to about 30%. As such, the second epitaxial materials 94 may have a germanium concentration greater than a germanium concentration of the first epitaxial materials 92.

The first epitaxial materials 92 may be formed of materials having high etch selectivity to materials of the substrate 50, the etch stop layer 56, and dielectric layers (such as the STI regions 68, the liners 130, and the second dielectric layer 132, discussed below with respect to FIGS. 25A through 25C). The second epitaxial materials 94 may be formed of materials having high etch selectivity to materials of the third epitaxial materials 96, the etch stop layer 56, the nanostructures 55, and dielectric layers (such as the STI regions 68, the first spacers 81, the first inner spacers 90, the liners 130, and the second dielectric layer 132). As such, the first epitaxial materials 92 and the second epitaxial materials 94 may be removed and replaced with backside vias without significantly removing the third epitaxial materials 96 and the dielectric layers.

The third epitaxial materials 96 in the n-type region 50N, e.g., the NMOS region, may be formed by masking the p-type region 50P, e.g., the PMOS region. Then, the third epitaxial materials 96 are epitaxially grown in the first recesses 86 and the second recesses 87 in the n-type region 50N. The third epitaxial materials 96 may include any acceptable material appropriate for n-type nano-FETs. For example, if the first nanostructures 52 are silicon, the third epitaxial materials 96 may include materials exerting a tensile strain on the first nanostructures 52, such as silicon, silicon carbide, phosphorous doped silicon carbide, silicon phosphide, or the like. The third epitaxial materials 96 may have surfaces raised from respective upper surfaces of the nanostructures 55 and may have facets.

The third epitaxial materials 96 in the p-type region 50P, e.g., the PMOS region, may be formed by masking the n-type region 50N, e.g., the NMOS region. Then, the third epitaxial materials 96 are epitaxially grown in the first recesses 86 and the second recesses 87 in the p-type region 50P. The third epitaxial materials 96 may include any acceptable material appropriate for p-type nano-FETs. For example, if the first nanostructures 52 are silicon, the third epitaxial materials 96 may comprise materials exerting a compressive strain on the first nanostructures 52, such as silicon-germanium, boron doped silicon-germanium, germanium, germanium tin, or the like. The third epitaxial materials 96 may also have surfaces raised from respective surfaces of the nanostructures 55 and may have facets.

The epitaxial source/drain regions 97, the first nanostructures 52, the second nanostructures 54, the fins 66 and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 97 may be in situ doped during growth.

Figure 12D:
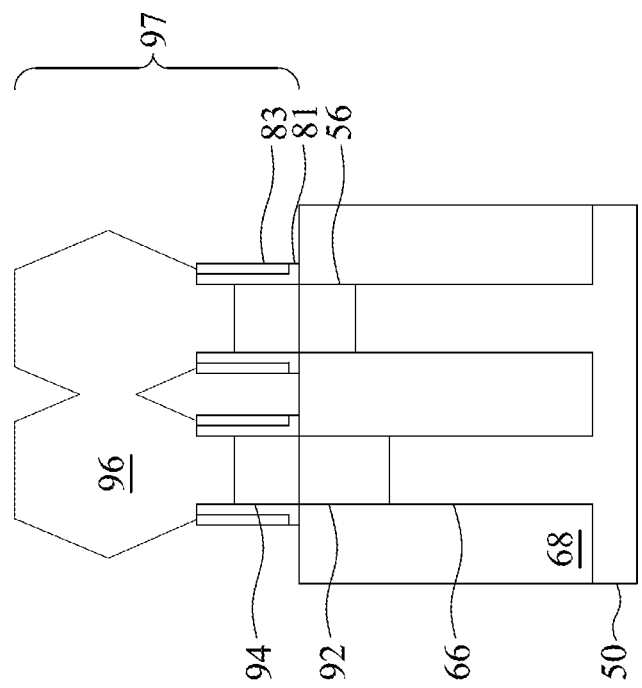

As a result of the epitaxy processes used to form the third epitaxial materials 96 in the n-type region 50N and the p-type region 50P, upper surfaces of the third epitaxial materials 96 have facets which expand laterally outward beyond sidewalls of the nanostructures 55. In some embodiments, these facets cause adjacent third epitaxial materials 96 of a same nano-FET to merge, as illustrated by FIG. 12D. In other embodiments, adjacent third epitaxial materials 96 remain separated after the epitaxy process is completed as illustrated by FIG. 12B. In the embodiments illustrated in FIGS. 12B and 12D, the first spacers 81 may be formed extending to top surfaces of the STI regions 68, thereby blocking the epitaxial growth. In some embodiments, the first spacers 81 may cover portions of the sidewalls of the nanostructures 55 further blocking the epitaxial growth. In some embodiments, the spacer etch used to form the first spacers 81 may be adjusted to remove the spacer material and allow the epitaxially grown region to extend to the surface of the STI region 68.

The third epitaxial materials 96 may comprise one or more semiconductor material layers. For example, the third epitaxial materials 96 may comprise a first semiconductor material layer 96A, a second semiconductor material layer 96B, and a third semiconductor material layer 96C. Any number of semiconductor material layers may be used for the third epitaxial materials 96. Each of the first semiconductor material layer 96A, the second semiconductor material layer 96B, and the third semiconductor material layer 96C may be formed of different semiconductor materials and may be doped to different dopant concentrations. In some embodiments, the first semiconductor material layer 96A may have a dopant concentration less than the second semiconductor material layer 96B and greater than the third semiconductor material layer 96C. In embodiments in which the third epitaxial materials 96 comprise three semiconductor material layers, the first semiconductor material layer 96A may be deposited, the second semiconductor material layer 96B may be deposited over the first semiconductor material layer 96A, and the third semiconductor material layer 96C may be deposited over the second semiconductor material layer 96B.

Figure 12E:
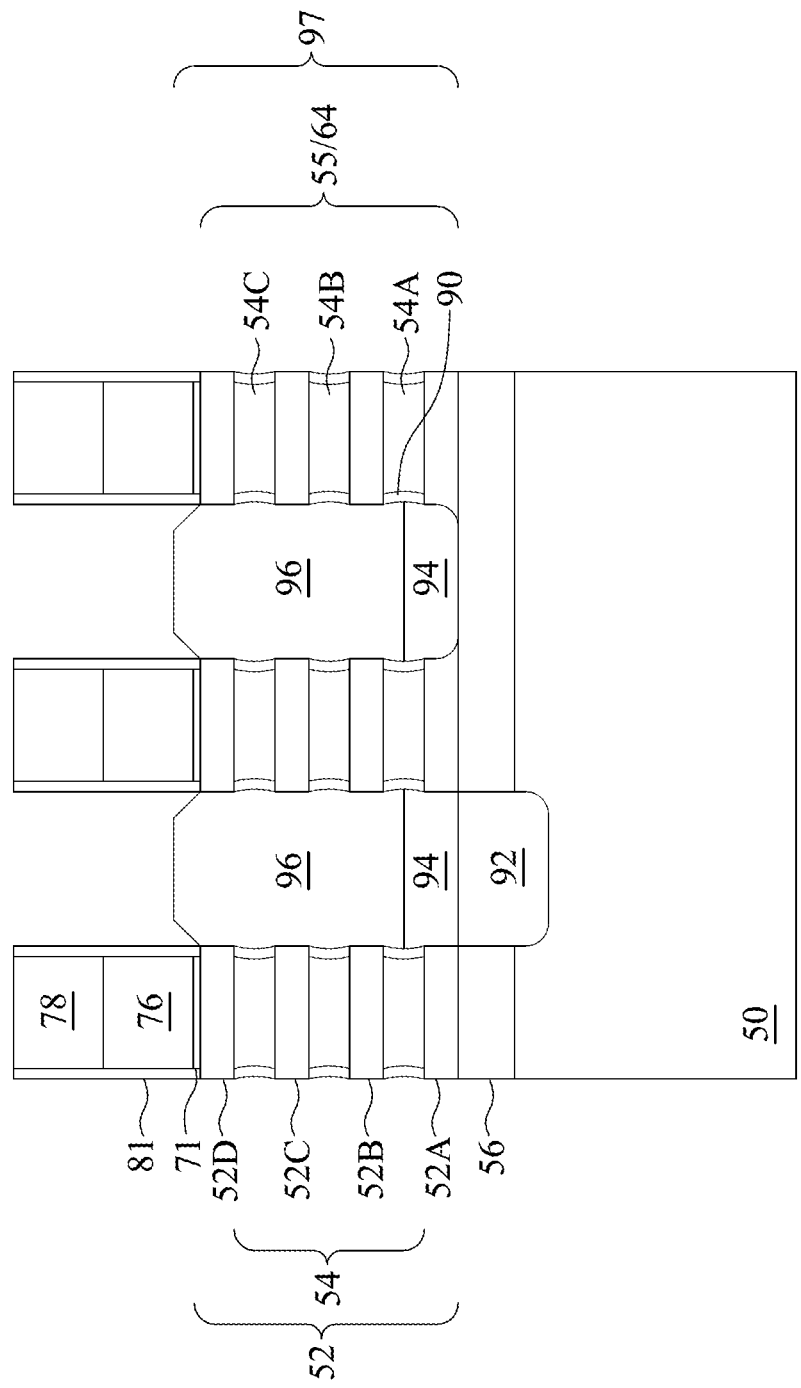

FIG. 12E illustrates an embodiment in which sidewalls of the second nanostructures 54 are concave, outer sidewalls of the first inner spacers 90 are concave, and the first inner spacers 90 are recessed from sidewalls of the first nanostructures 52. As illustrated in FIG. 12E, the epitaxial source/drain regions 97 may be formed in contact with the first inner spacers 90 and may extend past sidewalls of the first nano structures 52.

Figure 13B:
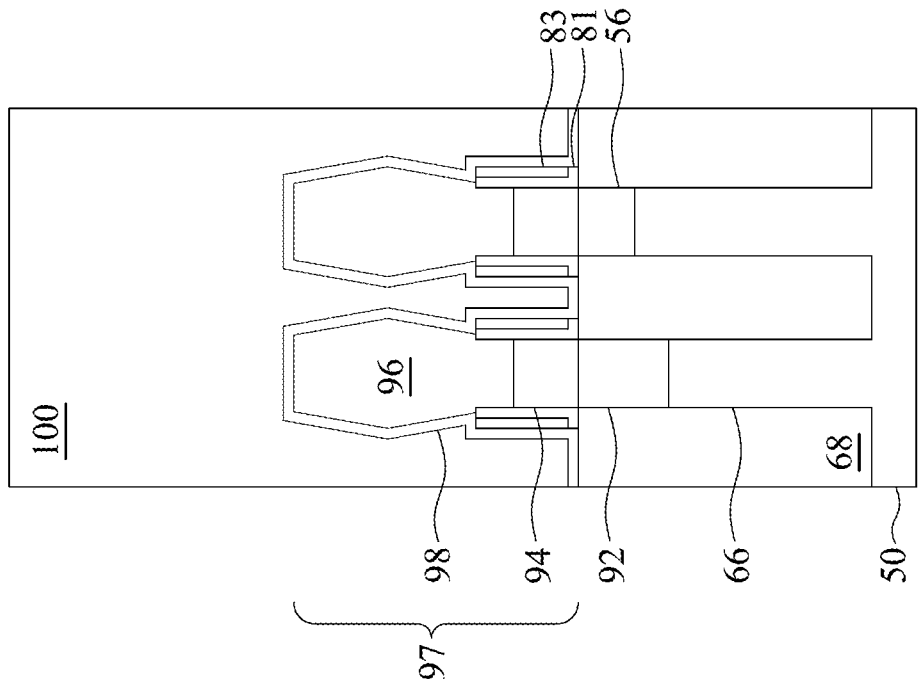
Figure 13A:
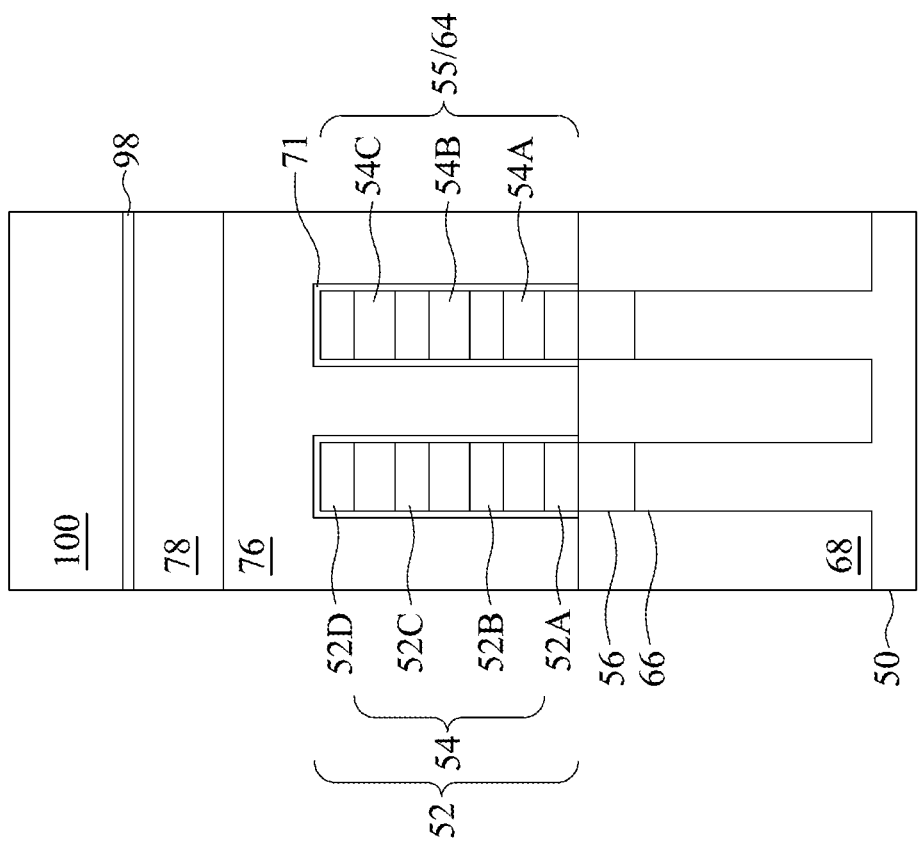
Figure 13C:
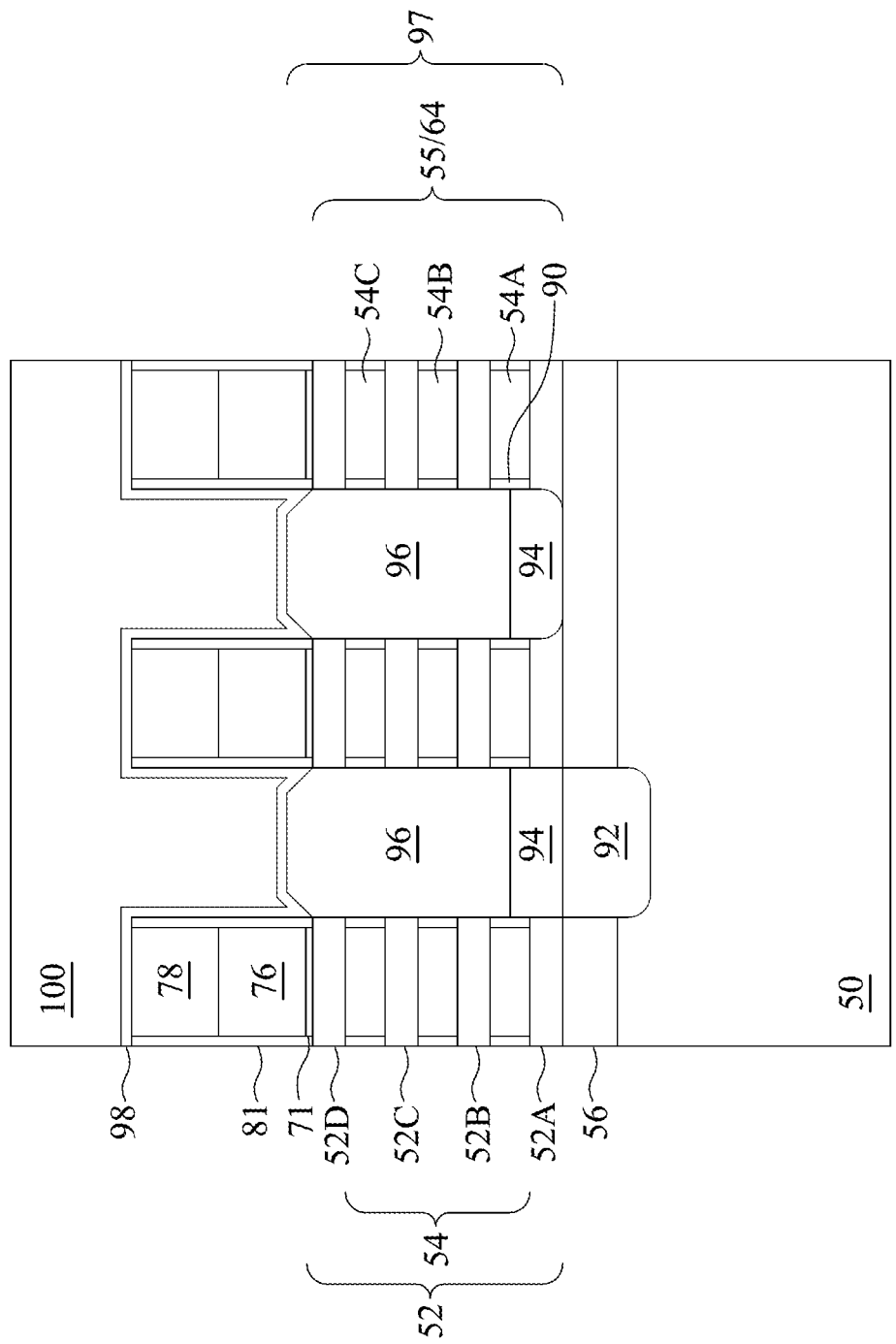

In FIGS. 13A through 13C, a first interlayer dielectric (ILD) 100 is deposited over the structure illustrated in FIGS. 12A through 12C, respectively. The first ILD 100 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 98 is disposed between the first ILD 100 and the epitaxial source/drain regions 97, the masks 78, the first spacers 81, the second spacers 83, and the STI regions 68. The CESL 98 may comprise a dielectric material, such as, silicon nitride, silicon oxide, silicon oxynitride, or the like, having a different etch rate than the material of the overlying first ILD 100.

Figure 14C:
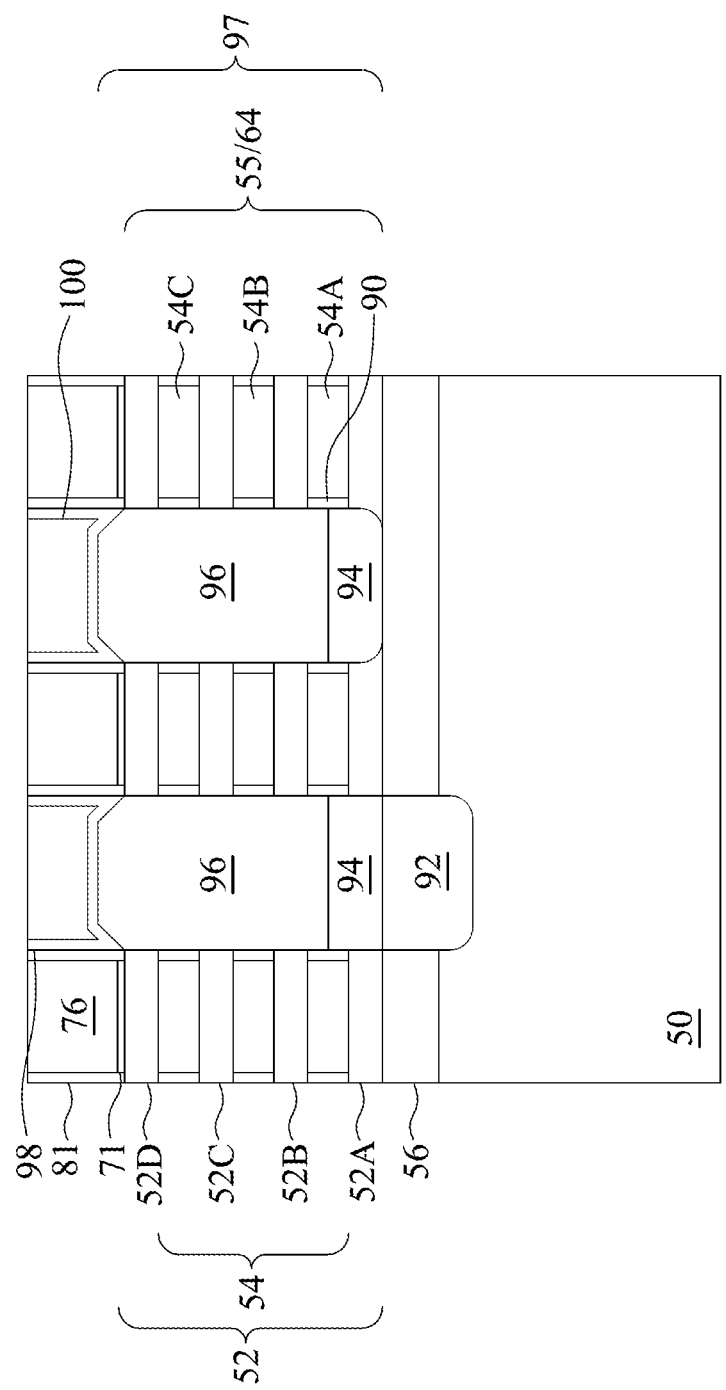

In FIGS. 14A through 14C, a planarization process, such as a CMP, may be performed to level the top surface of the first ILD 100 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the first ILD 100, and the CESL 98 may be level with one another, within process variations. Accordingly, the top surfaces of the dummy gates 76 are exposed through the first ILD 100. In some embodiments, the masks 78 may remain, in which case the planarization process levels top surfaces of the first ILD 100 with top surfaces of the masks 78, the first spacers 81, and the CESL 98.

Figure 15C:
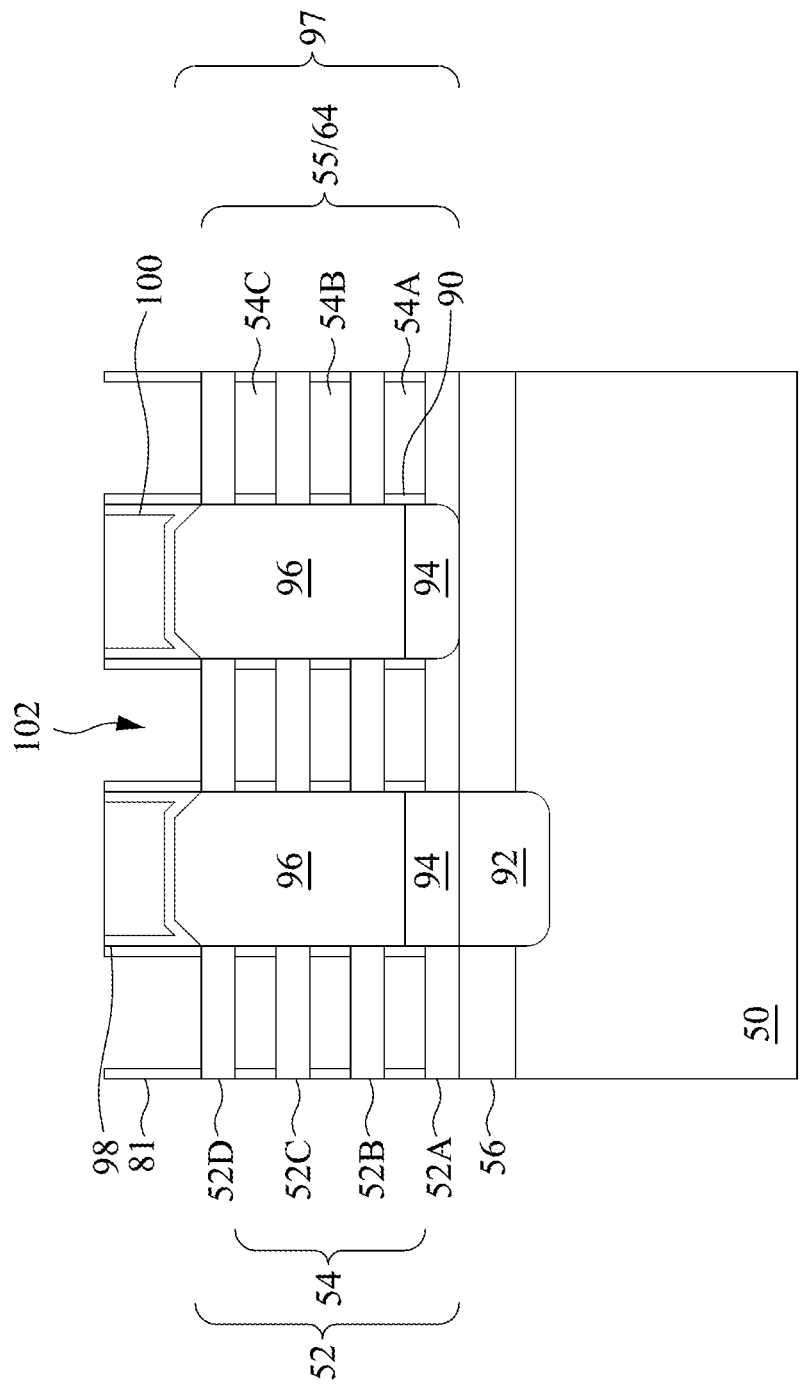

In FIGS. 15A through 15C, the dummy gates 76, and the masks 78 if present, are removed in one or more etching steps, forming third recesses 102. Portions of the dummy gate dielectrics 71 in the third recesses 102 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 100, the CESL 98, or the first spacers 81. Each of the third recesses 102 exposes and/or overlies portions of nanostructures 55, which act as channel regions in subsequently completed nano-FETs. Portions of the nanostructures 55 which act as the channel regions are disposed between neighboring pairs of the epitaxial source/drain regions 97. During the removal, the dummy gate dielectrics 71 may be used as etch stop layers when the dummy gates 76 are etched. The dummy gate dielectrics 71 may then be removed after the removal of the dummy gates 76.

Figure 16B:
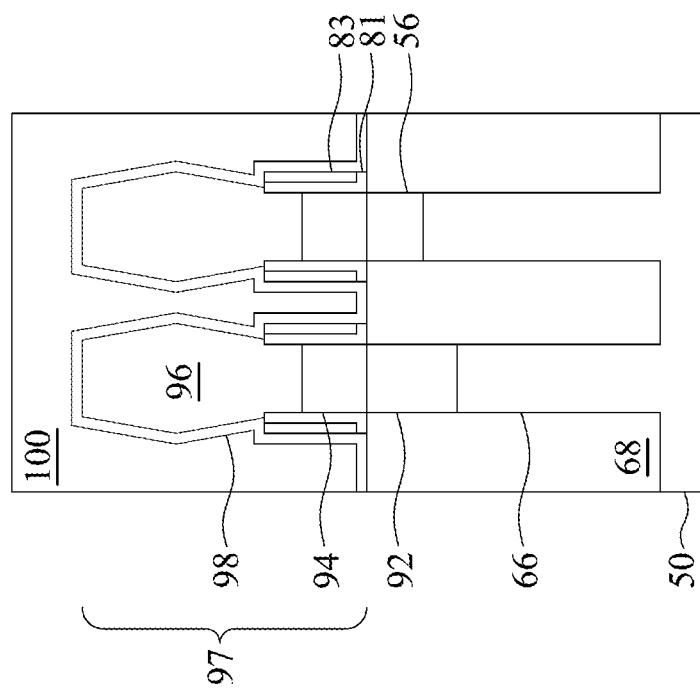
Figure 16A:
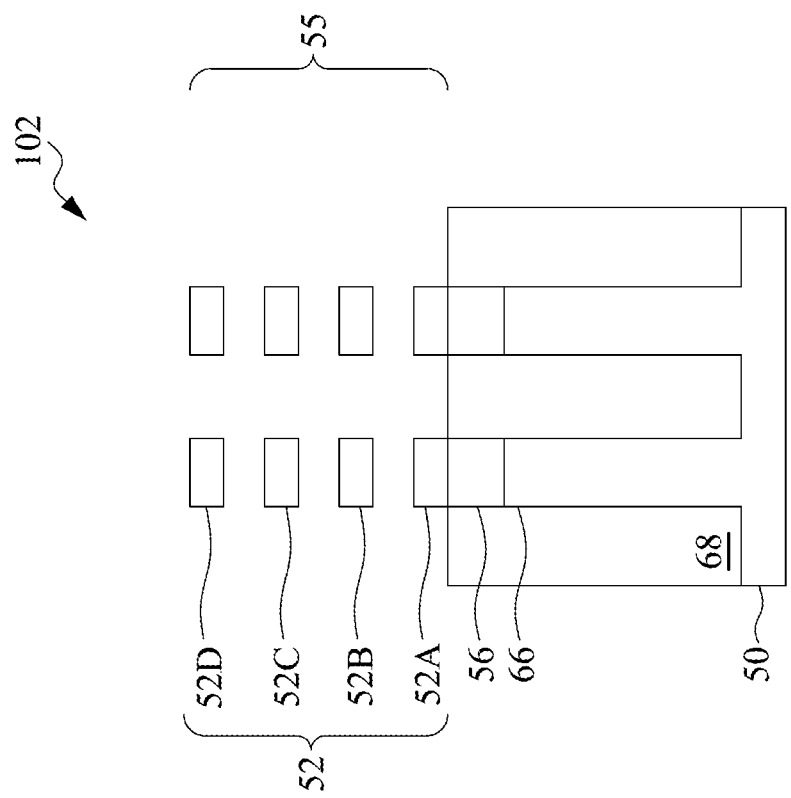
Figure 16C:
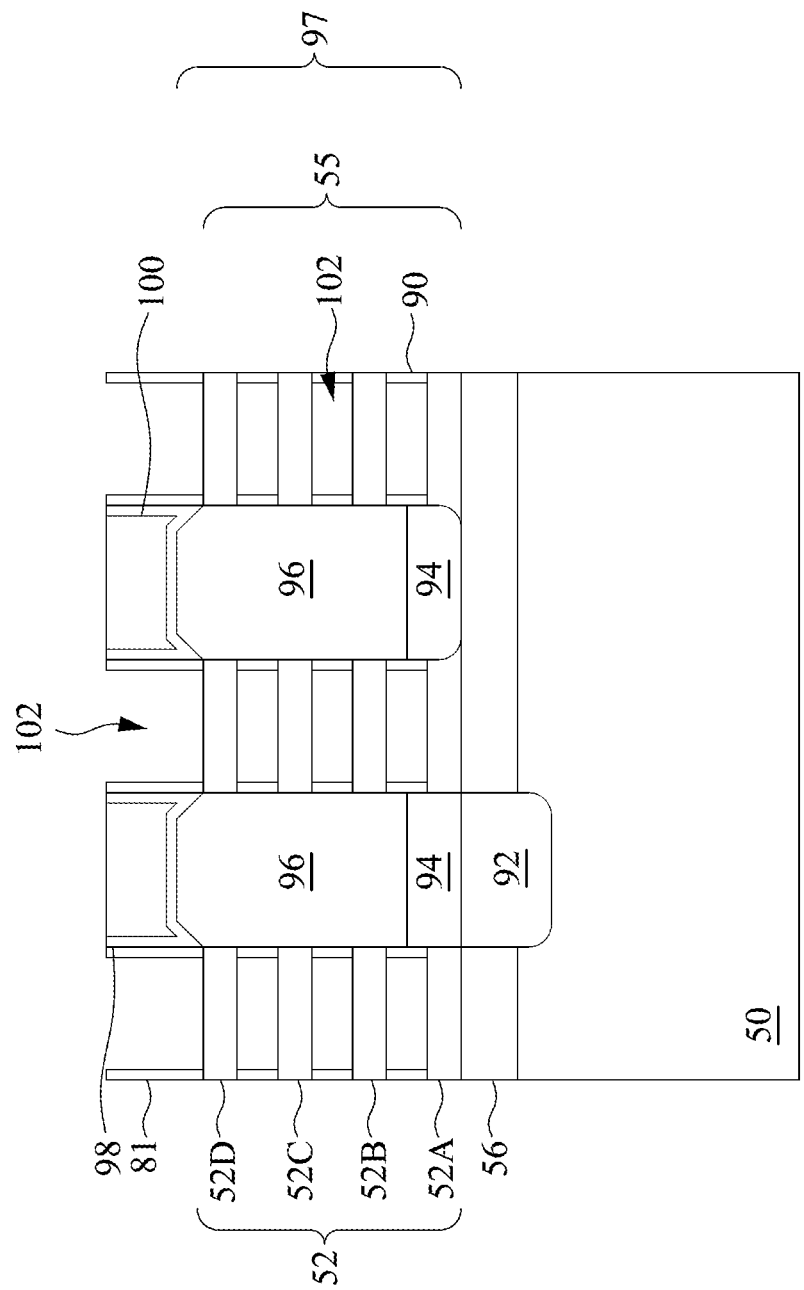

In FIGS. 16A through 16C, the second nanostructures 54 are removed extending the third recesses 102. The second nanostructures 54 may be removed by performing an isotropic etching process, such as wet etching or the like, using etchants which are selective to the materials of the second nanostructures 54, while the first nanostructures 52, the substrate 50, the STI regions 68, the first ILD 100, the CESL 98, the first spacers 81, and the first inner spacers 90 remain relatively un-etched as compared to the second nanostructures 54. In embodiments in which the first nanostructures 52 include, e.g., Si or SiC, and the second nanostructures 54A-54C include, e.g., SiGe, tetramethylammonium hydroxide (TMAH), ammonium hydroxide ($NH_4OH$), or the like may be used to remove the second nanostructures 54.

Figure 17B:
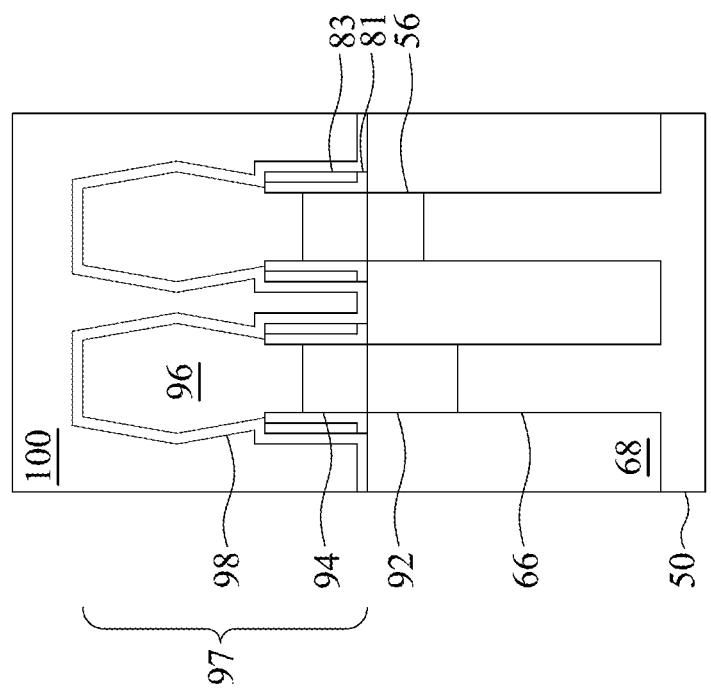
Figure 17A:
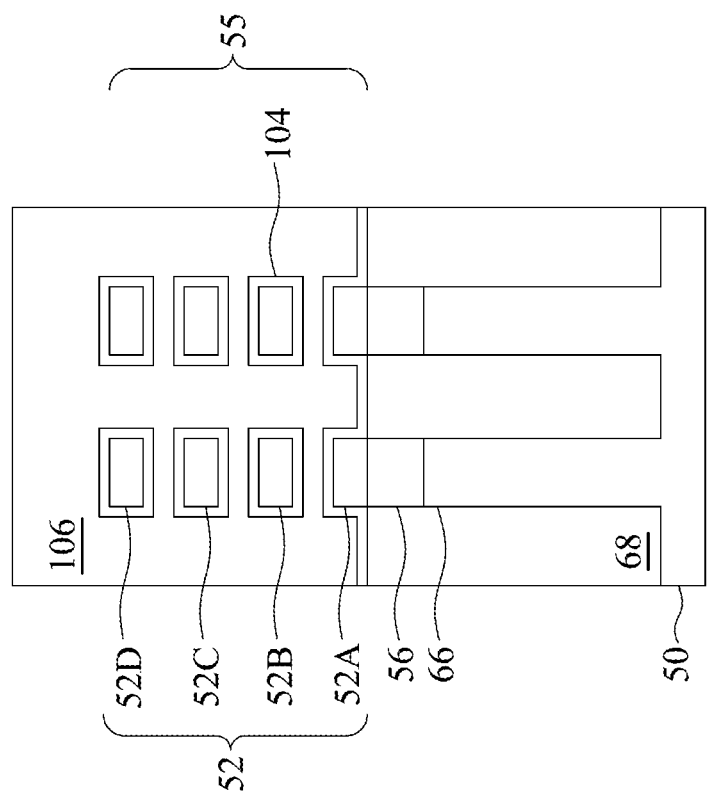
Figure 17C:
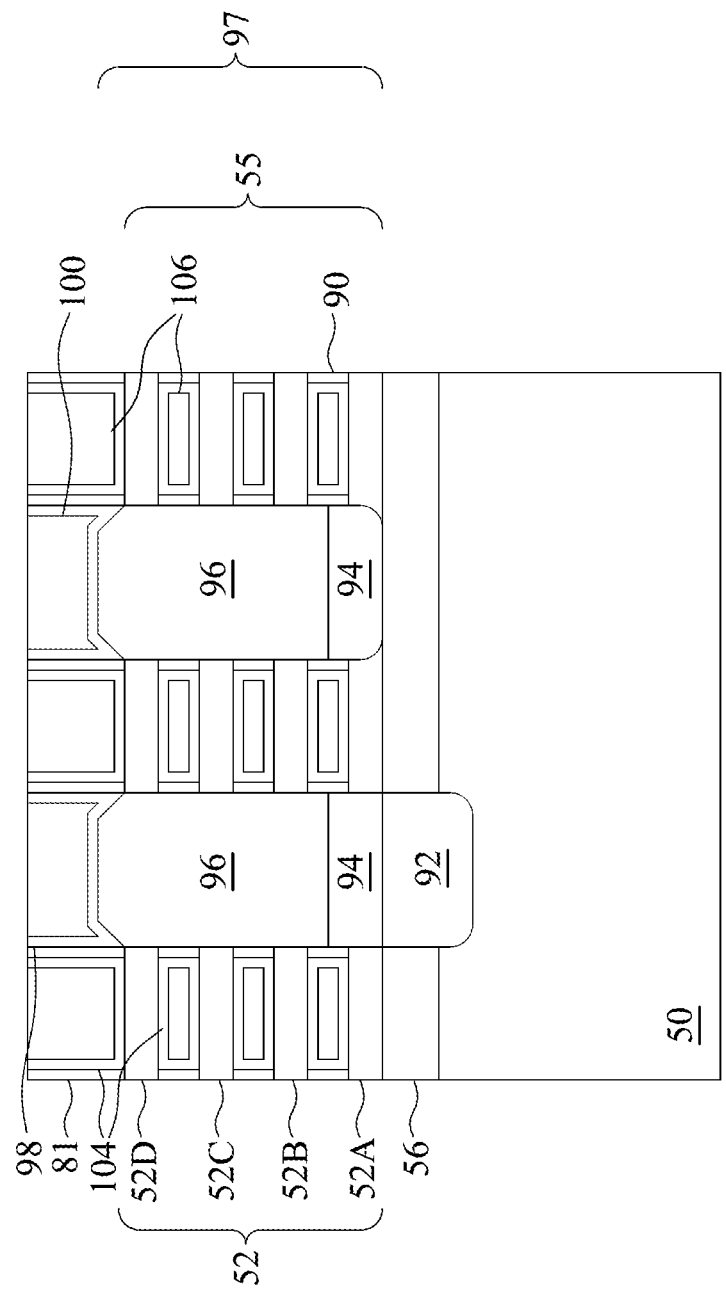

In FIGS. 17A through 17C, gate dielectric layers 104 and gate electrodes 106 are formed for replacement gates. The gate dielectric layers 104 are deposited conformally in the third recesses 102. The gate dielectric layers 104 may be formed on top surfaces, sidewalls, and bottom surfaces of the first nanostructures 52. The gate dielectric layers 104 may also be deposited on top surfaces of the first ILD 100, the CESL 98, the first spacers 81, and the STI regions 68.

In accordance with some embodiments, the gate dielectric layers 104 comprise one or more dielectric layers, such as an oxide, a metal oxide, the like, or combinations thereof. For example, in some embodiments, the gate dielectric layers 104 may comprise a silicon oxide layer and a metal oxide layer over the silicon oxide layer. In some embodiments, the gate dielectric layers 104 include a high-k dielectric material, and in these embodiments, the gate dielectric layers 104 may have a k-value greater than about 7.0, and may include a metal oxide or a silicate of hafnium, aluminum, zirconium, lanthanum, manganese, barium, titanium, lead, and combinations thereof. The structure of the gate dielectric layers 104 may be the same or different in the n-type region 50N and the p-type region 50P. The formation methods of the gate dielectric layers 104 may include molecular-beam deposition (MBD), ALD, PECVD, or the like.

The gate electrodes 106 are deposited over the gate dielectric layers 104, and fill remaining portions of the third recesses 102. The gate electrodes 106 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate electrodes 106 are illustrated in FIGS. 17A and 17C, the gate electrodes 106 may comprise any number of liner layers, any number of work function tuning layers, and a fill material. Any combination of the layers which make up the gate electrodes 106 may be deposited between adjacent ones of the first nanostructures 52.

The formation of the gate dielectric layers 104 in the n-type region 50N and the p-type region 50P may occur simultaneously such that the gate dielectric layers 104 in each region are formed from the same materials, and the formation of the gate electrodes 106 may occur simultaneously such that the gate electrodes 106 in each region are formed from the same materials. In some embodiments, the gate dielectric layers 104 in each region may be formed by distinct processes, such that the gate dielectric layers 104 may be different materials and/or have a different number of layers, and/or the gate electrodes 106 in each region may be formed by distinct processes, such that the gate electrodes 106 may be different materials and/or have a different number of layers. Various masking steps may be used to mask and expose appropriate regions when using distinct processes.

After the filling of the third recesses 102, a planarization process, such as a CMP, may be performed to remove the excess portions of the gate dielectric layers 104 and the material of the gate electrodes 106, which excess portions are over the top surfaces of the first ILD 100, the first spacers 81, and the CESL 98. The remaining portions of material of the gate electrodes 106 and the gate dielectric layers 104 thus form replacement gate structures of the resulting nanoFETs. The gate electrodes 106 and the gate dielectric layers 104 may be collectively referred to as "gate structures."

Figure 18B:
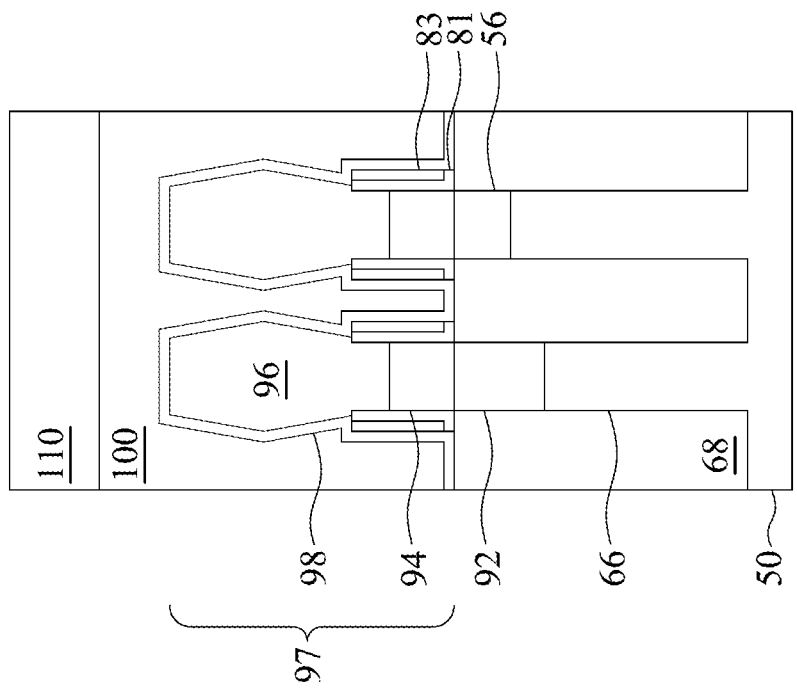
Figure 18A:
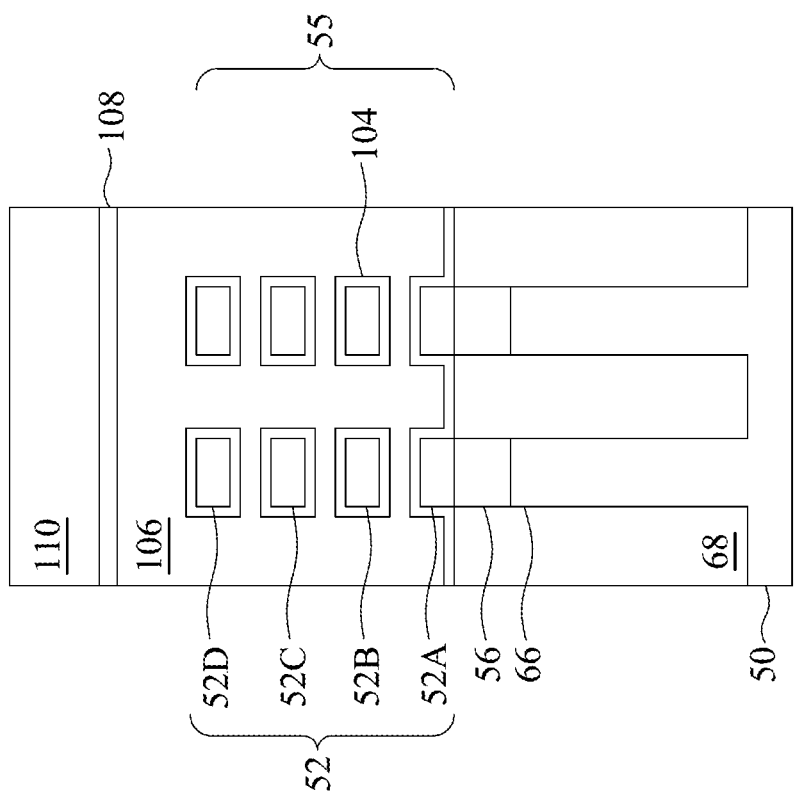
Figure 18C:
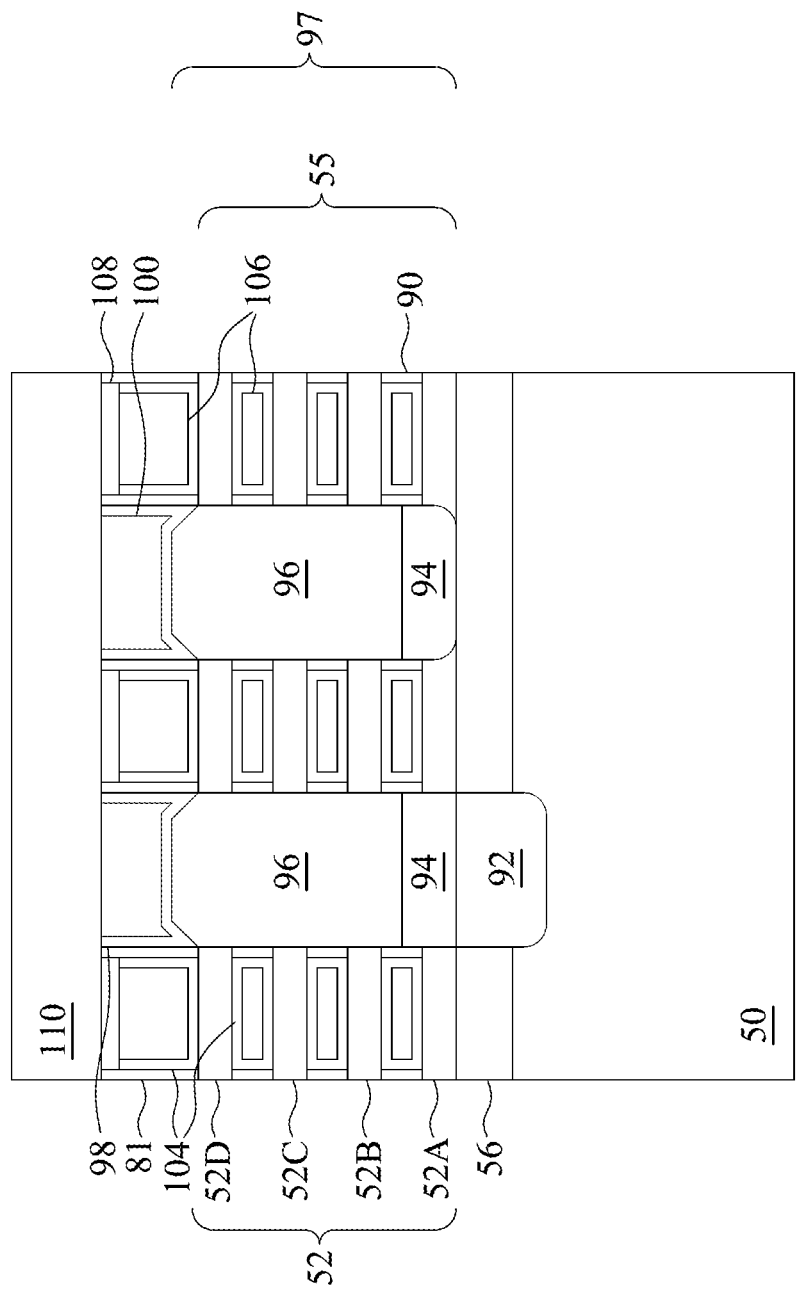

In FIGS. 18A through 18C, the gate structures (including the gate dielectric layers 104 and the corresponding overlying gate electrodes 106) are recessed, so that recesses are formed directly over each of the gate structures and between opposing portions of the first spacers 81. Gate masks 108 comprising one or more layers of dielectric material, such as silicon nitride, silicon oxynitride, or the like, are filled in the recesses, followed by a planarization process to remove excess portions of the dielectric material extending over the first ILD 100, the CESL 98, and the first spacers 81. Subsequently formed gate contacts (such as the gate contacts 118, discussed below with respect to FIGS. 20A and 20C) penetrate through the gate masks 108 to contact the top surface of the recessed gate electrodes 106.

As further illustrated by FIGS. 18A through 18C, a second ILD 110 is deposited over the first ILD 100, the CESL 98, and over the gate masks 108. In some embodiments, the second ILD 110 is a flowable film formed by FCVD. In some embodiments, the second ILD 110 is formed of a dielectric material such as PSG, BSG, BPSG, USG, or the like, and may be deposited by any suitable method, such as CVD, PECVD, or the like.

Figure 19C:
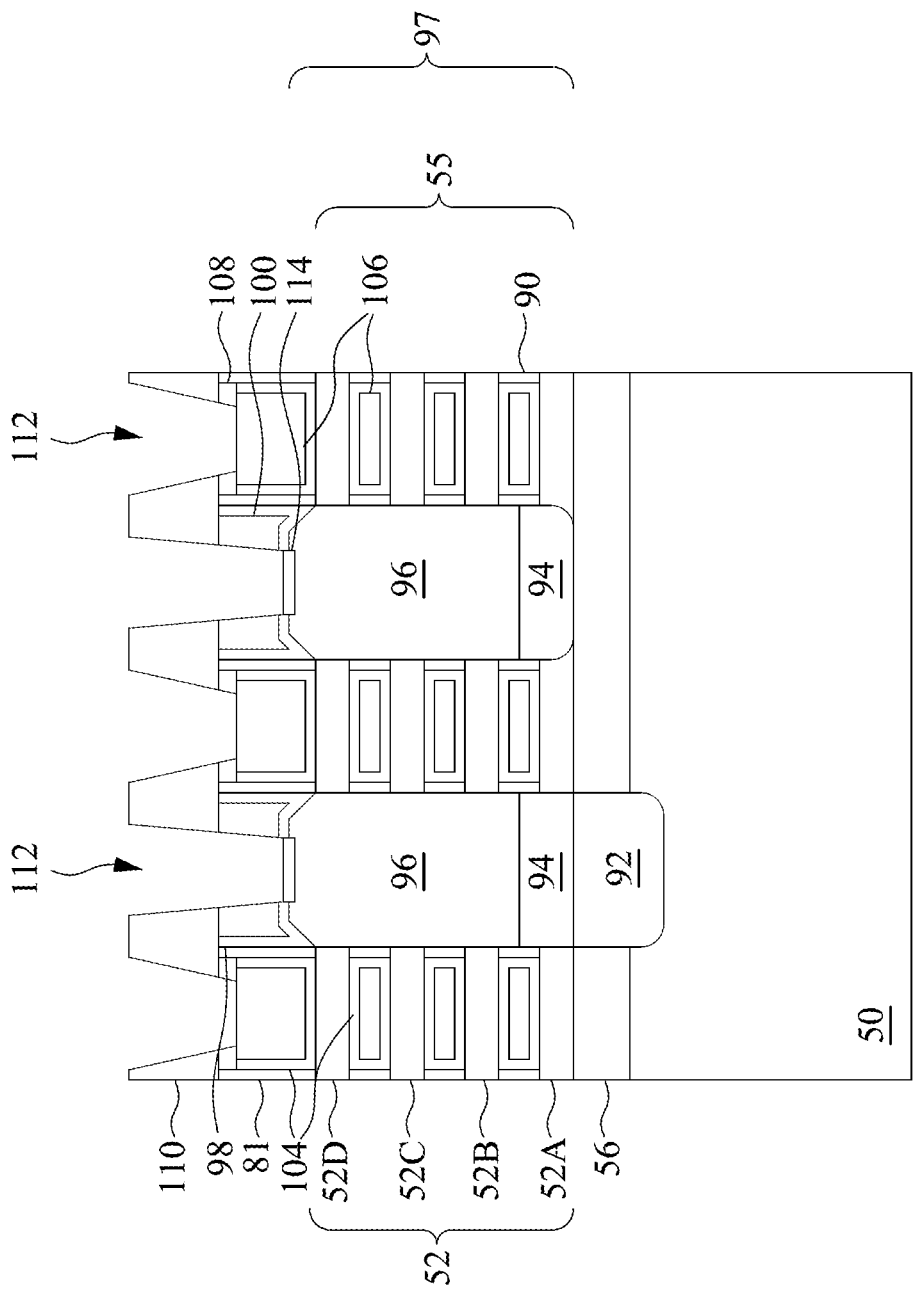

In FIGS. 19A through 19C, the second ILD 110, the first ILD 100, the CESL 98, and the gate masks 108 are etched to form fourth recesses 112 exposing surfaces of the epitaxial source/drain regions 97 and/or the gate structures. The fourth recesses 112 may be formed by etching using an anisotropic etching process, such as RIE, NBE, or the like. In some embodiments, the fourth recesses 112 may be etched through the second ILD 110 and the first ILD 100 using a first etching process; may be etched through the gate masks 108 using a second etching process; and may be etched through the CESL 98 using a third etching process. A mask, such as a photoresist, may be formed and patterned over the second ILD 110 to mask portions of the second ILD 110 from the first etching process and the second etching process. In some embodiments, the etching process may over-etch, and therefore, the fourth recesses 112 may extend into the epitaxial source/drain regions 97 and/or the gate structure. Bottom surfaces of the fourth recesses 112 may be level with (e.g., at a same level, or having a same distance from the substrate 50), or lower than (e.g., closer to the substrate 50) top surfaces of the epitaxial source/drain regions 97 and/or the gate structure. Although FIG. 19C illustrates the fourth recesses 112 as exposing the epitaxial source/drain regions 97 and the gate structures in a same cross-section, in some embodiments, the epitaxial source/drain regions 97 and the gate structure may be exposed in different cross-sections, thereby reducing the risk of shorting subsequently formed contacts.

After the fourth recesses 112 are formed, first silicide regions 114 are formed over the epitaxial source/drain regions 97. In some embodiments, the first silicide regions 114 are formed by first depositing a metal (not separately illustrated) capable of reacting with the semiconductor materials of the underlying epitaxial source/drain regions 97 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal may be deposited over the exposed portions of the epitaxial source/drain regions 97, then a thermal anneal process may be performed to form the first silicide regions 114. The unreacted portions of the deposited metal are then removed by, e.g., an etching process. Although the first silicide regions 114 are referred to as silicide regions, the first silicide regions 114 may also be germanide regions, or silicon germanide regions (e.g., regions comprising silicon and germanium), or the like. In an embodiment, the first silicide regions 114 comprise TiSi, and have thicknesses ranging from about 2 nm to about 10 nm.

Figures 20A, 20B:
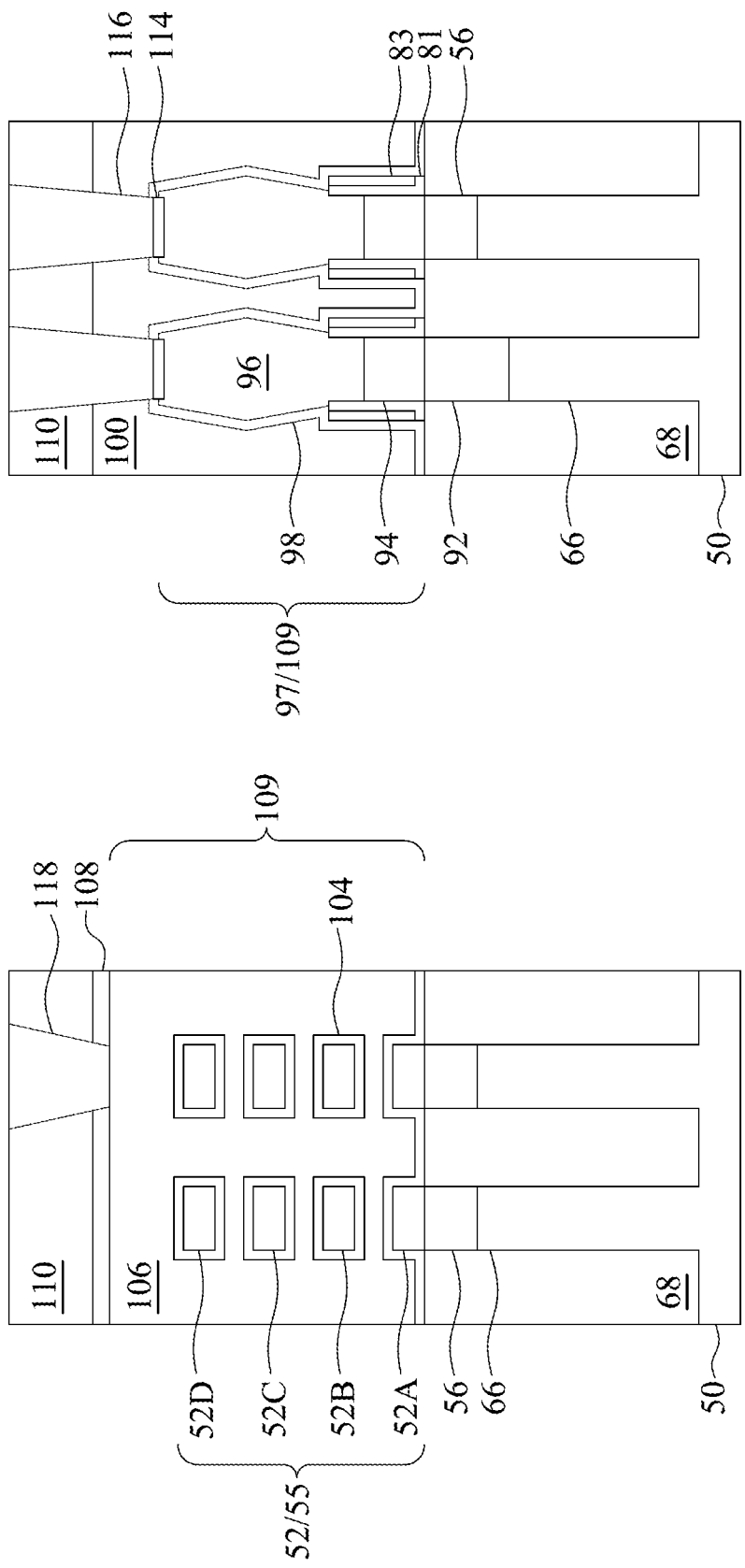
Figure 20C:
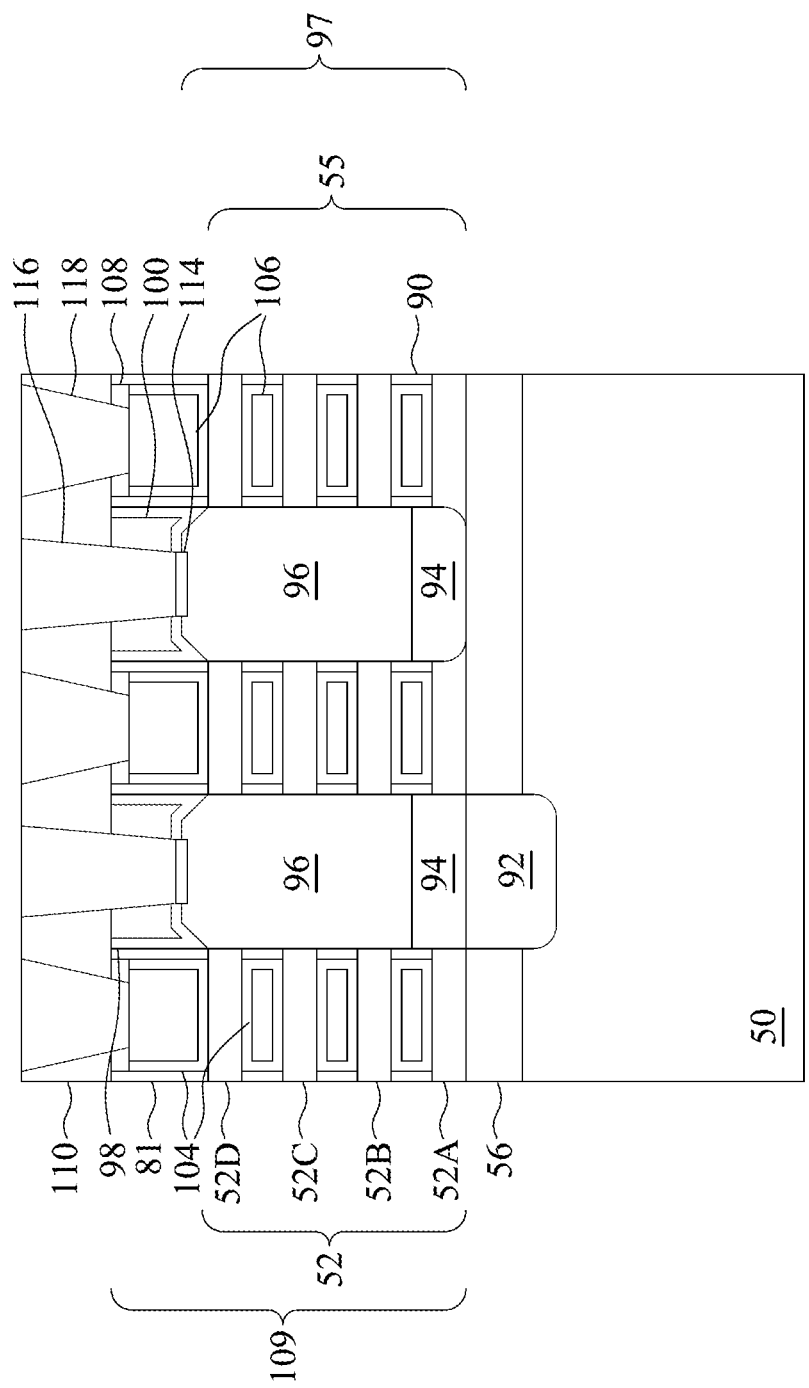

In FIGS. 20A through 20C, source/drain contacts 116 and gate contacts 118 (also referred to as contact plugs) are formed in the fourth recesses 112. The source/drain contacts 116 and the gate contacts 118 may each comprise one or more layers, such as barrier layers, diffusion layers, and fill materials. For example, in some embodiments, the source/drain contacts 116 and the gate contacts 118 each include a barrier layer and a conductive material. The source/drain contacts 116 and the gate contacts 118 are each electrically coupled to the underlying conductive feature (e.g., the gate electrodes 106 or the first silicide regions 114 over the epitaxial source/drain regions 97 in the illustrated embodiment). The gate contacts 118 are electrically coupled to the gate electrodes 106, and the source/drain contacts 116 are electrically coupled to the first silicide regions 114 over the epitaxial source/drain regions 97. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess portions of the source/drain contacts 116 and the gate contacts 118, which excess portions are over top surfaces of the second ILD 110.

The epitaxial source/drain regions 97, the first nanostructures 52, and the gate structures (including the gate dielectric layers 104 and the gate electrodes 106) may collectively be referred to as transistor structures 109. A first interconnect structure (such as the front-side interconnect structure 120, discussed below with respect to FIGS. 21A through 21C) may be formed over front-sides of the transistor structures 109 and a second interconnect structure (such as the backside interconnect structure 146, discussed below with respect to FIGS. 28A through 28C) may be formed over backsides of the transistor structures 109. Although the transistor structures 109 are described as including nano-FETs, other embodiments may include transistor structures 109 with different types of transistors (e.g., planar FETs, FinFETs, thin film transistors (TFTs), or the like).

Although FIGS. 20A through 20C illustrate a source/drain contact 116 extending to each of the epitaxial source/drain regions 97, the source/drain contacts 116 may be omitted from certain ones of the epitaxial source/drain regions 97. For example, as explained in greater detail below, conductive features (e.g., backside vias or power rails) may be subsequently attached through backsides of one or more of the epitaxial source/drain regions 97. For these particular epitaxial source/drain regions 97, the source/drain contacts 116 may be omitted or may be dummy contacts that are not electrically connected to any overlying conductive lines (such as the first conductive features 122, discussed below with respect to FIGS. 21A through 21C).

FIGS. 21A through 28C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. In FIGS. 21A through 28C, figures ending in "A" illustrate a cross-sectional view along line A-A' of FIG. 1, figures ending in "B" illustrate a cross-sectional view along line B-B' of FIG. 1, and figures ending in "C" illustrate a cross-sectional view along line C-C' of FIG. 1. The process steps described in FIGS. 21A through 28C may be applied to both the n-type region 50N and the p-type region 50P. As noted above, a back-side conductive feature (e.g., a backside via or a power rail) may be connected to one or more of the epitaxial source/drain regions 97. As such, the source/drain contacts 116 may be optionally omitted from the epitaxial source/drain regions 97.

Figure 21B:
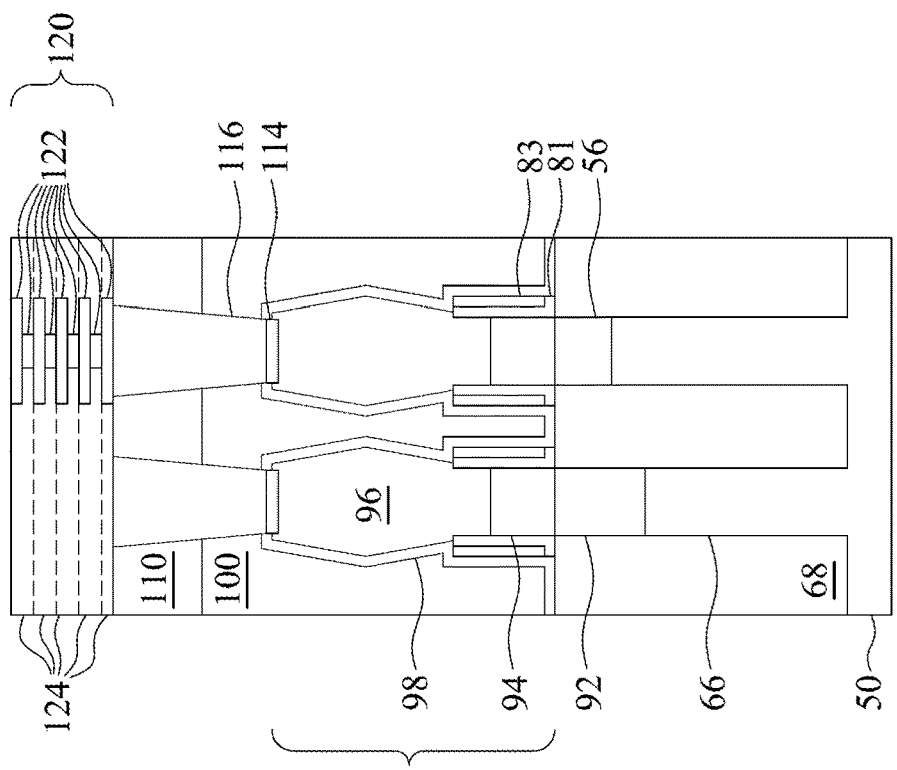
Figure 21A:
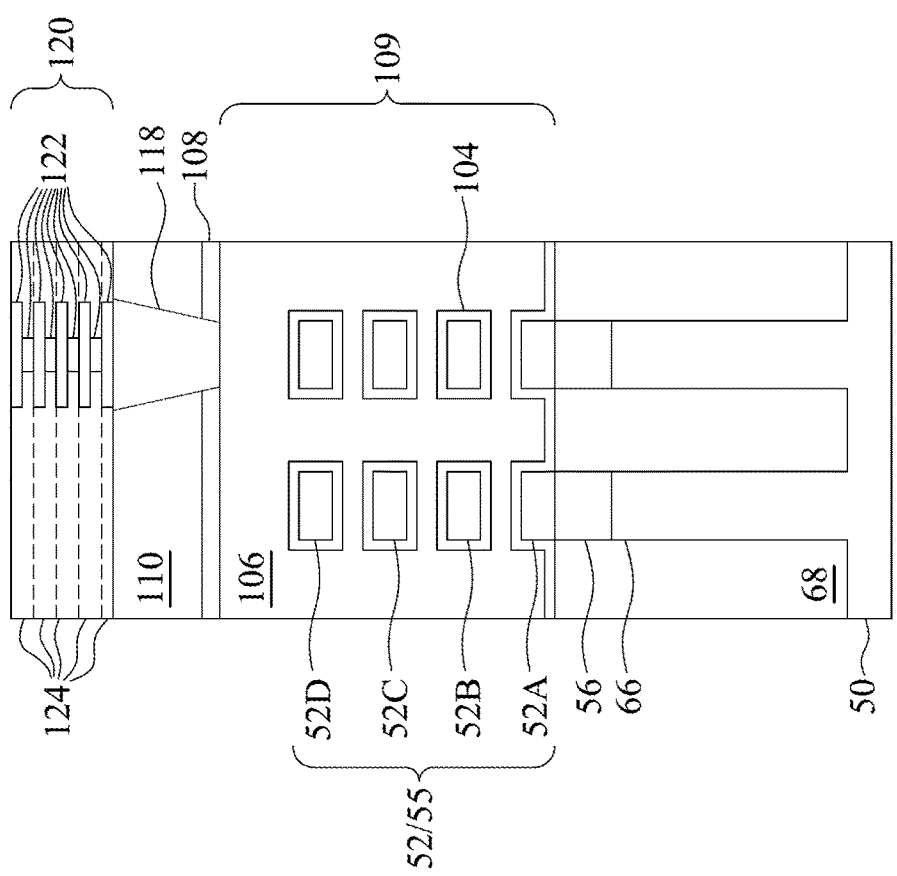
Figure 21C:
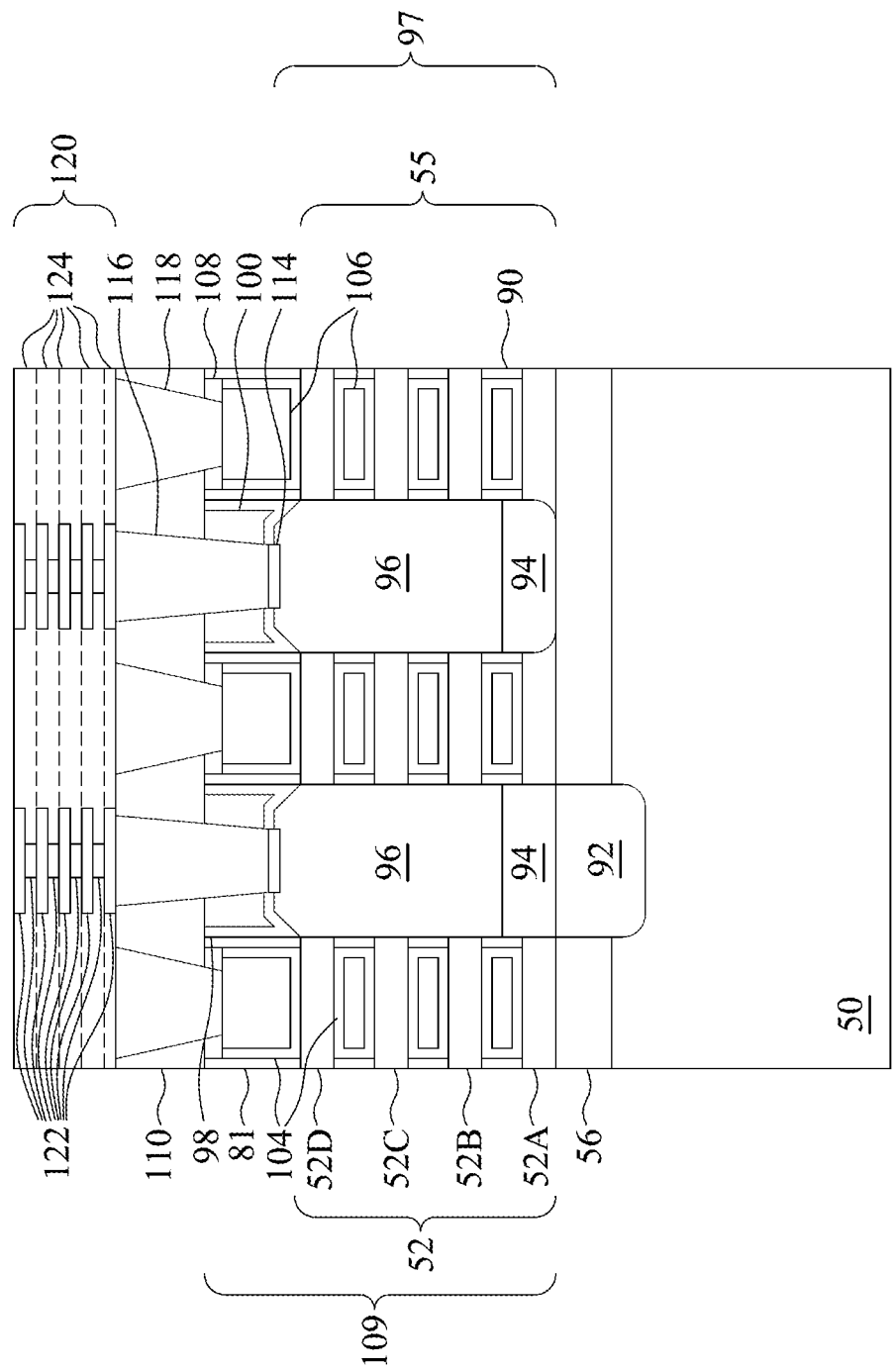

In FIGS. 21A through 21C, a front-side interconnect structure 120 is formed on the second ILD 110. The front-side interconnect structure 120 may be referred to as a front-side interconnect structure because it is formed on a front-side of the transistor structures 109 (e.g., a side of the transistor structures opposite the substrate 50 on which the transistor structures 109 are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, tantalum oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A CMP process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 118 and the source/drain contacts 116 to form functional circuits. In some embodiments, the functional circuits formed by the front-side interconnect structure 120 may comprise logic circuits, memory circuits, image sensor circuits, or the like.

Figure 22C:
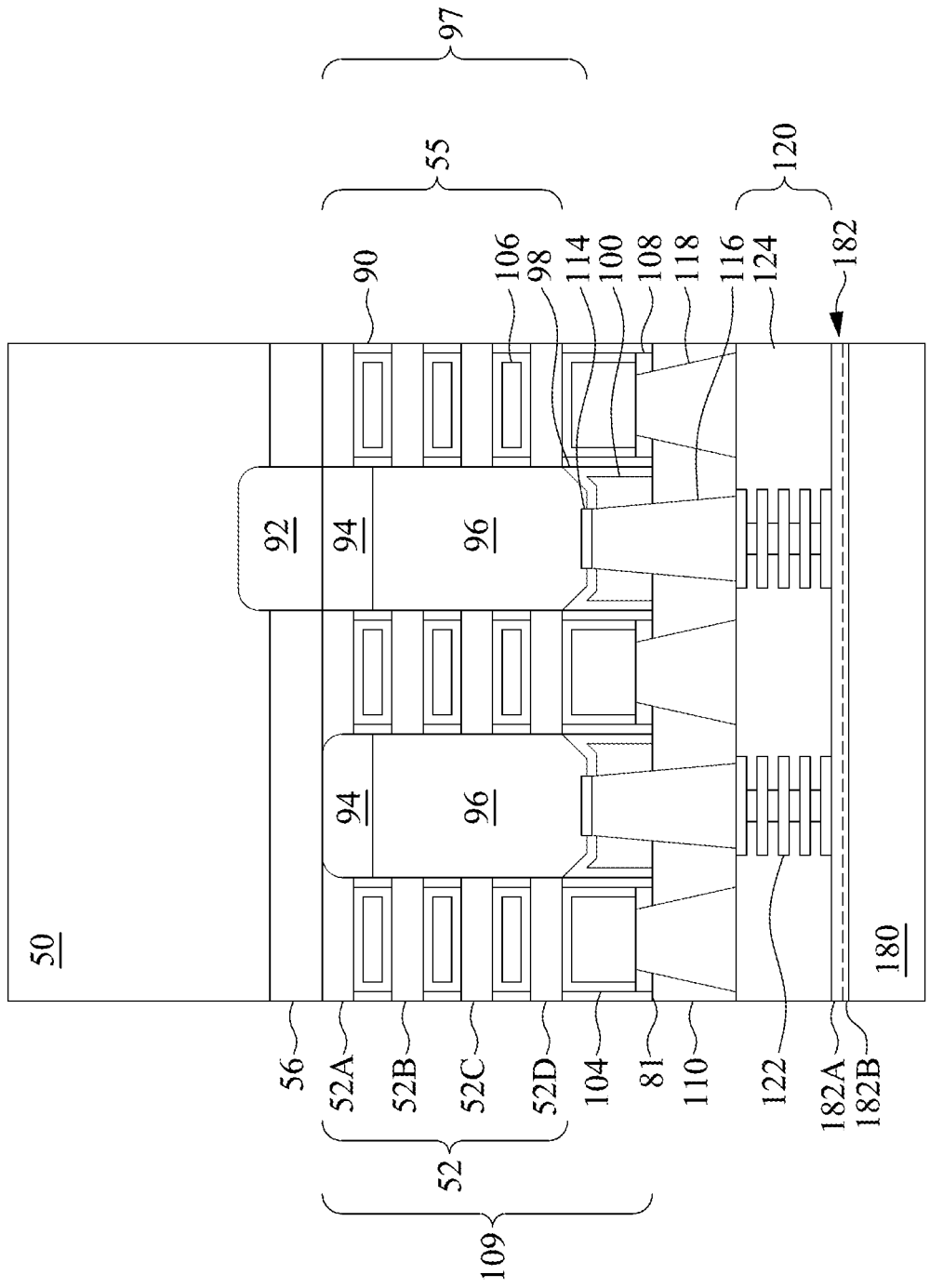

In FIGS. 22A through 22C, a carrier substrate 180 is bonded to a top surface of the front-side interconnect structure 120 by a first bonding layer 182A and a second bonding layer 182B (collectively referred to as bonding layers 182). The carrier substrate 180 may be a glass carrier substrate, a ceramic carrier substrate, a wafer (e.g., a silicon wafer), or the like. The carrier substrate 180 may provide structural support during subsequent processing steps and in the completed device.

In various embodiments, the carrier substrate 180 may be bonded to the front-side interconnect structure 120 using a suitable technique, such as dielectric-to-dielectric bonding, or the like. The dielectric-to-dielectric bonding may comprise depositing the first bonding layer 182A on the front-side interconnect structure 120. In some embodiments, the first bonding layer 182A comprises silicon oxide (e.g., a high-density plasma (HDP) oxide, or the like) that is deposited by CVD, ALD, PVD, or the like. The second bonding layer 182B may likewise be an oxide layer that is formed on a surface of the carrier substrate 180 prior to bonding using, for example, CVD, ALD, PVD, thermal oxidation, or the like. Other suitable materials may be used for the first bonding layer 182A and the second bonding layer 182B.

The dielectric-to-dielectric bonding process may further include applying a surface treatment to one or more of the first bonding layer 182A and the second bonding layer 182B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 182. The carrier substrate 180 is then aligned with the front-side interconnect structure 120 and the two are pressed against each other to initiate a pre-bonding of the carrier substrate 180 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 180 to a temperature of about 170° C.

Further in FIGS. 22A through 22C, after the carrier substrate 180 is bonded to the front-side interconnect structure 120, the device may be flipped such that a backside of the transistor structures 109 faces upwards. The backside of the transistor structures 109 may refer to a side opposite to the front-side of the transistor structures 109.

Figures 23A, 23B:
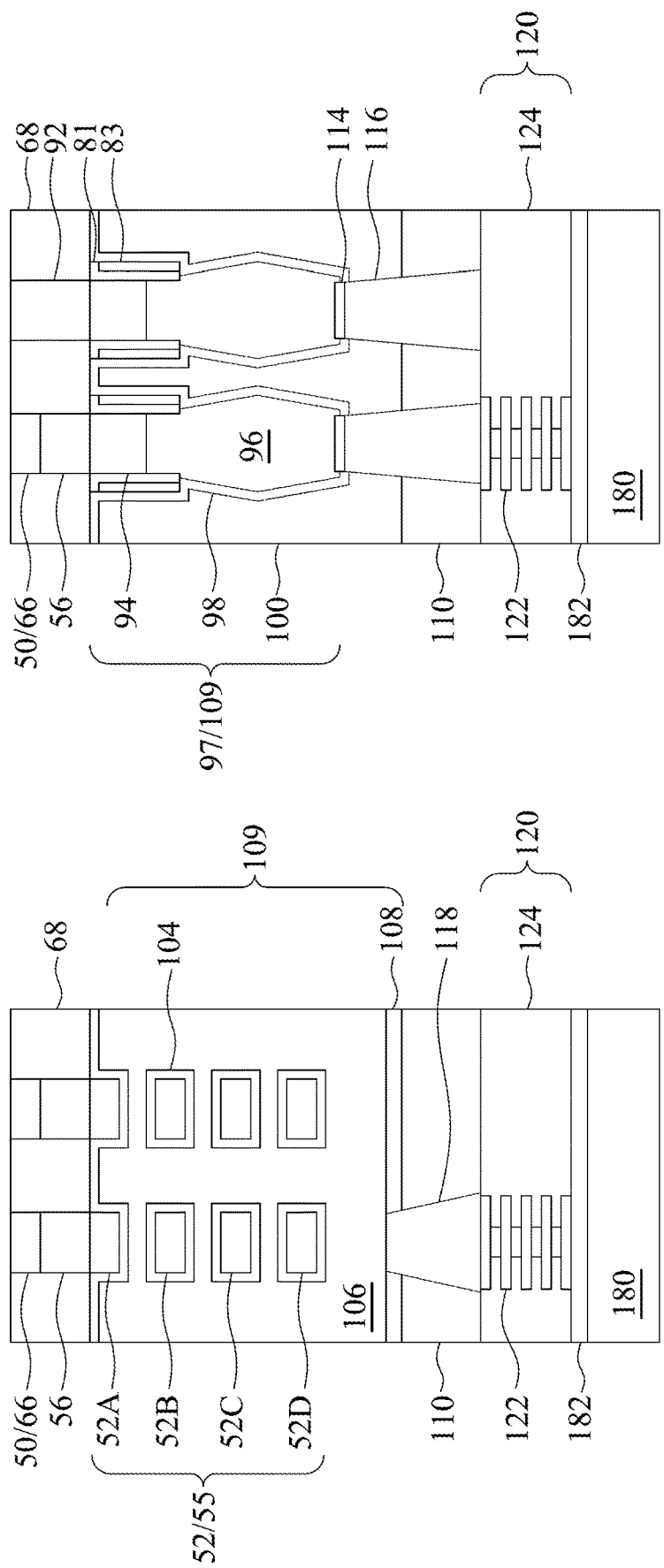
Figure 23C:
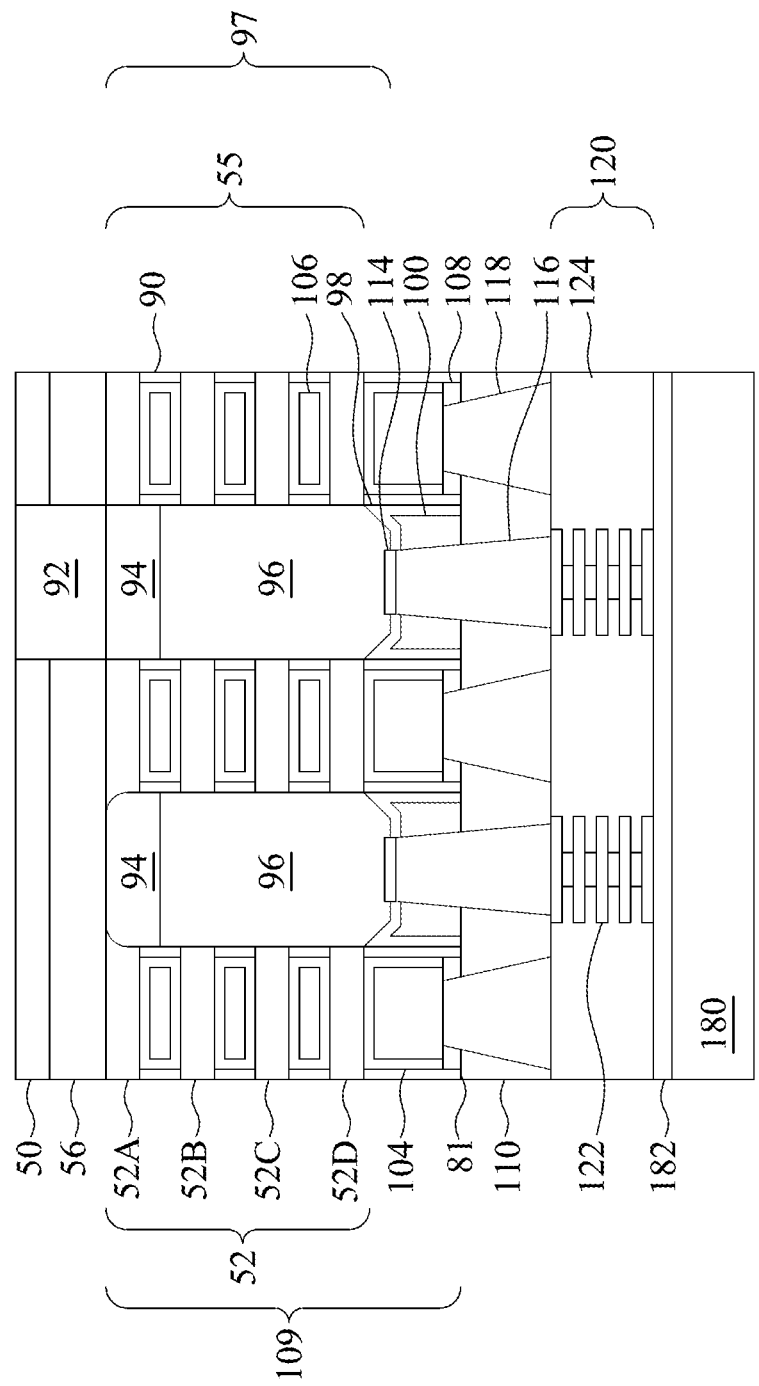

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 92 opposite the front-side interconnect structure 120. Further, a portion of the substrate 50 may remain over the transistor structures 109 after the thinning process. As illustrated in FIGS. 23A through 23C, backside surfaces of the substrate 50, the first epitaxial materials 92, the STI regions 68, and the fins 66 may be level with one another following the thinning process. Following the thinning process, the substrate 50 may have a thickness over the etch stop layer 56 ranging from about 30 nm to about 80 nm.

Figures 24A, 24B:
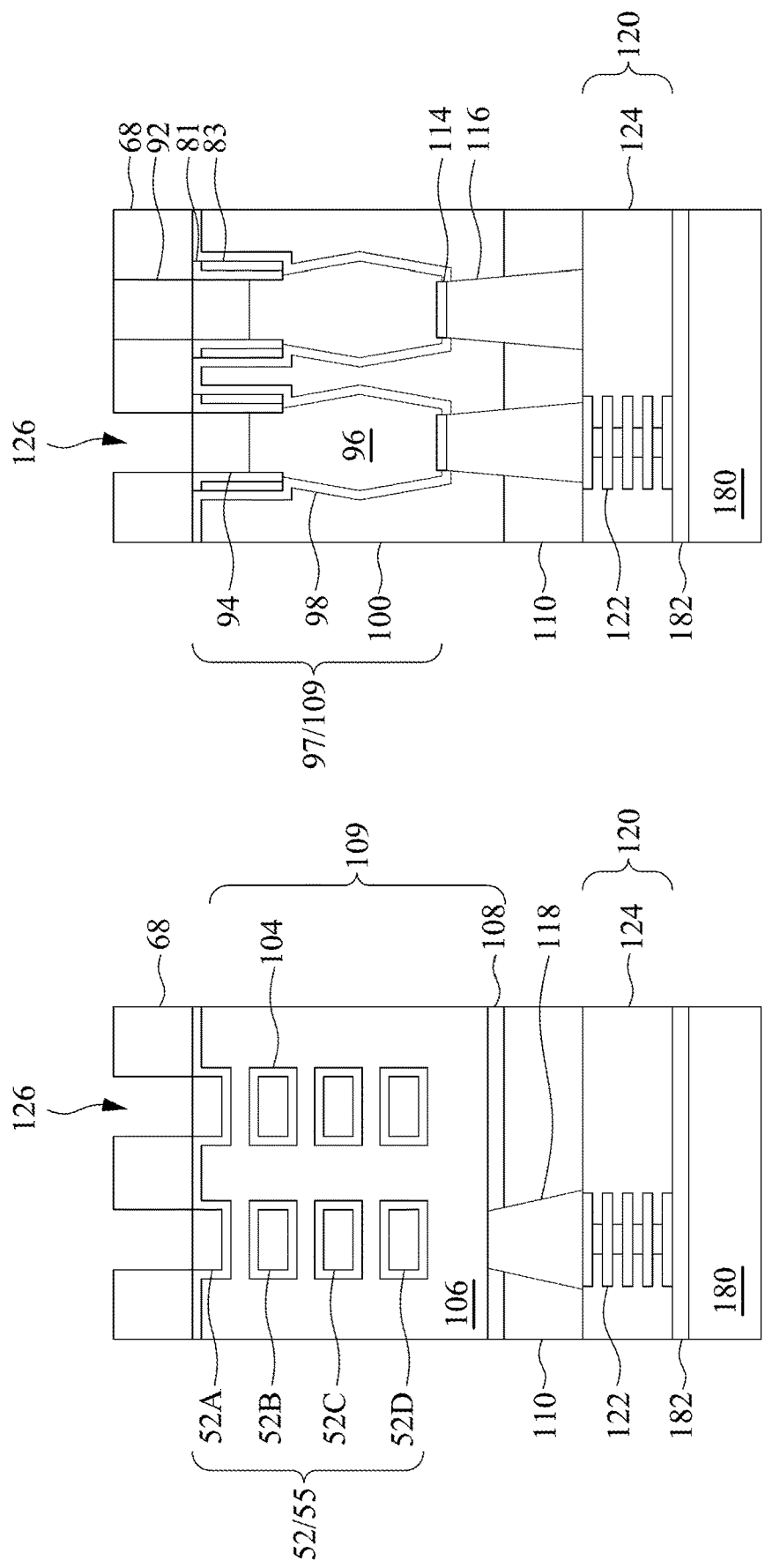
Figure 24C:
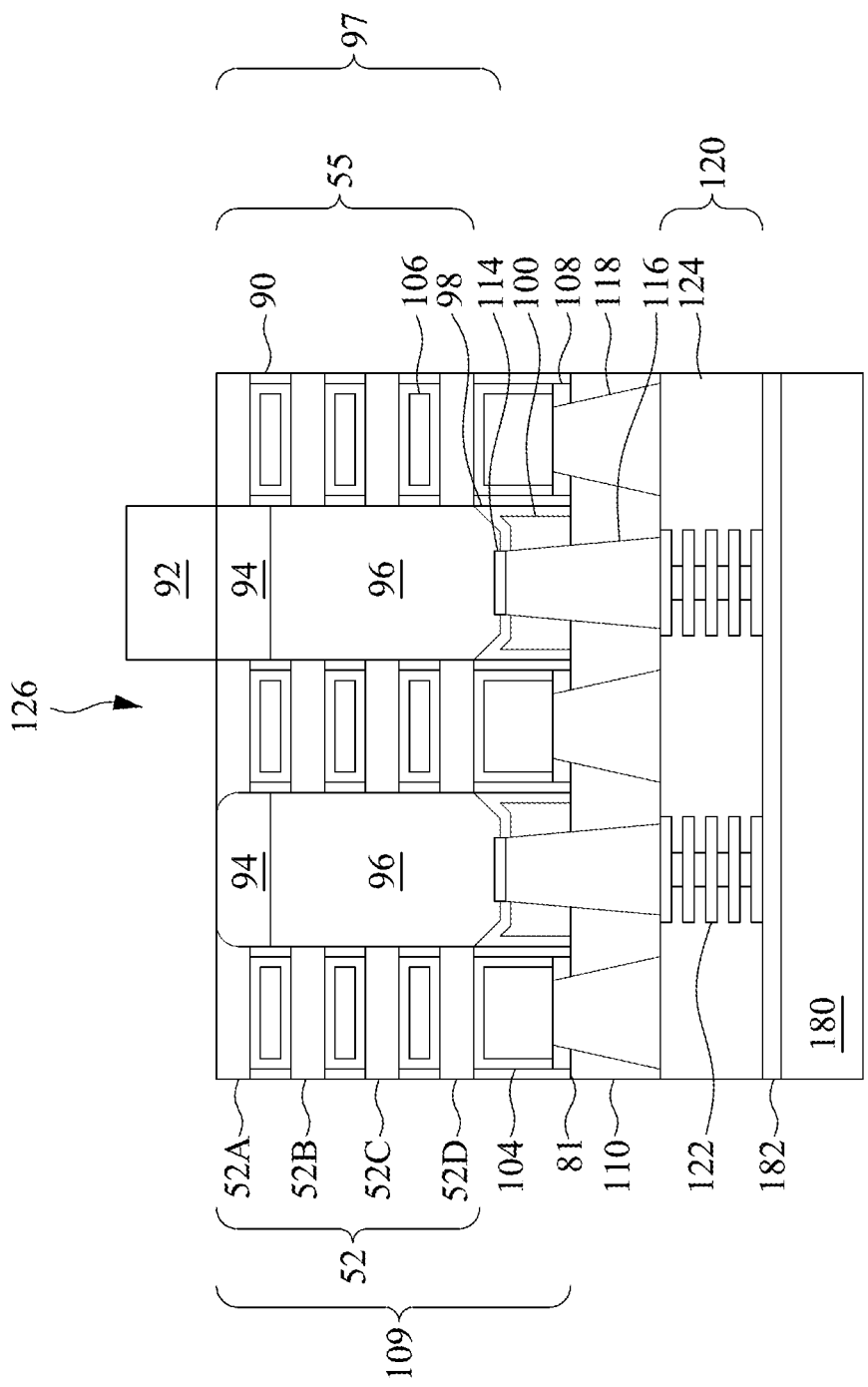

In FIGS. 24A through 24C, an ion implantation is performed on the substrate 50 and remaining portions of the substrate 50 and the fins 66 are removed to form fifth recesses 126. The ion implantation may be performed with one or more species selected from helium (He), boron (B), boron fluoride ($BF_2$), carbon (C), oxygen (O), nitrogen (N), fluorine (F), argon (Ar), germanium (Ge), xenon (Xe), silicon (Si), gallium (Ga), arsenic (As), phosphorus (P), diphosphorus ($P_2$), indium (In), antimony (Sb), or the like. A dosage for the ion implantation may range from about $1\times10^{13}$ atoms/cm$^2$ to about $1\times10^{16}$ atoms/cm$^2$ and a tilt angle for the ion implantation may range from about 0 degrees to about 85 degrees. The ion implantation may be performed at a temperature ranging from about −300° C. to about 500° C., or from about −300° C. to about 30° C. with an applied energy ranging from about 100 keV to about 60 keV. In embodiments in which the species of ions implanted include inert gases, such as helium, argon, or xenon, structures underlying the substrate 50 may be free from ions or species implanted by the ion implantation. However, in other embodiments, structures underlying the substrate 50, such as the STI regions 68, the first nanostructures 52A, the first epitaxial materials 92, and the second epitaxial materials 94 may be implanted with the species and have a dopant concentration ranging from about $1\times10^{16}$ atoms/cm$^3$ to about $1\times10^{21}$ atoms/cm$^3$.

Following the ion implantation, the remaining portions of the substrate 50 and the fins 66 are removed to form the fifth recesses 126. The substrate 50 and the fins 66 may be etched using a suitable etch process, which may be an isotropic etch process, such as a wet etch. The ion implantation may be used to damage the crystal structure of the substrate 50, which improves the etch rate of the substrate 50, improves etch selectivity between materials of the substrate 50 and materials of the etch stop layer 56 and the first epitaxial materials 92, and reduces directional etching of the substrate 50. In some embodiments, the process variables for the ion implantation (e.g., the species implanted, the ion implantation dosage, the tilt angle, the ion implantation temperature, and the applied energy) may be selected in order to control the etch selectivity of the substrate 50 and/or the etch rate of the substrate 50. The etch stop layer 56 may be removed after removing the substrate 50. The etch stop layer 56 may be removed using a suitable etch process, which may be an isotropic etch process, such as a wet etch. The etch process used to remove the etch stop layer 56 may have a high etch selectivity to the etch stop layer 56 as compared with the STI regions 68, the first nanostructures 52A, the first epitaxial materials 92, and the second epitaxial materials 94, such that the etch stop layer 56 is removed without removing or damaging the STI regions 68, the first nanostructures 52A, the first epitaxial materials 92, and the second epitaxial materials 94.

Prior to the ion implantation being performed on the substrate 50, etching the substrate 50 using the etch process may etch Si (111) facets of the substrate 50 slower than Si (100) facets of the substrate 50 (e.g., the etch process may have a facet effect). As a result, portions of the substrate 50 may remain after performing the etch process. However, by performing the ion implantation, the substrate 50 may be completely removed by the etch process. Residual portions of the substrate 50 remaining after the etch process may cause non-uniform growth of a dielectric material subsequently formed in the fifth recesses 126. As such, performing the ion implantation and the subsequent etch process to remove the substrate 50 and the fins 66 results in reduced device defects and improved device performance.

Figure 25C:
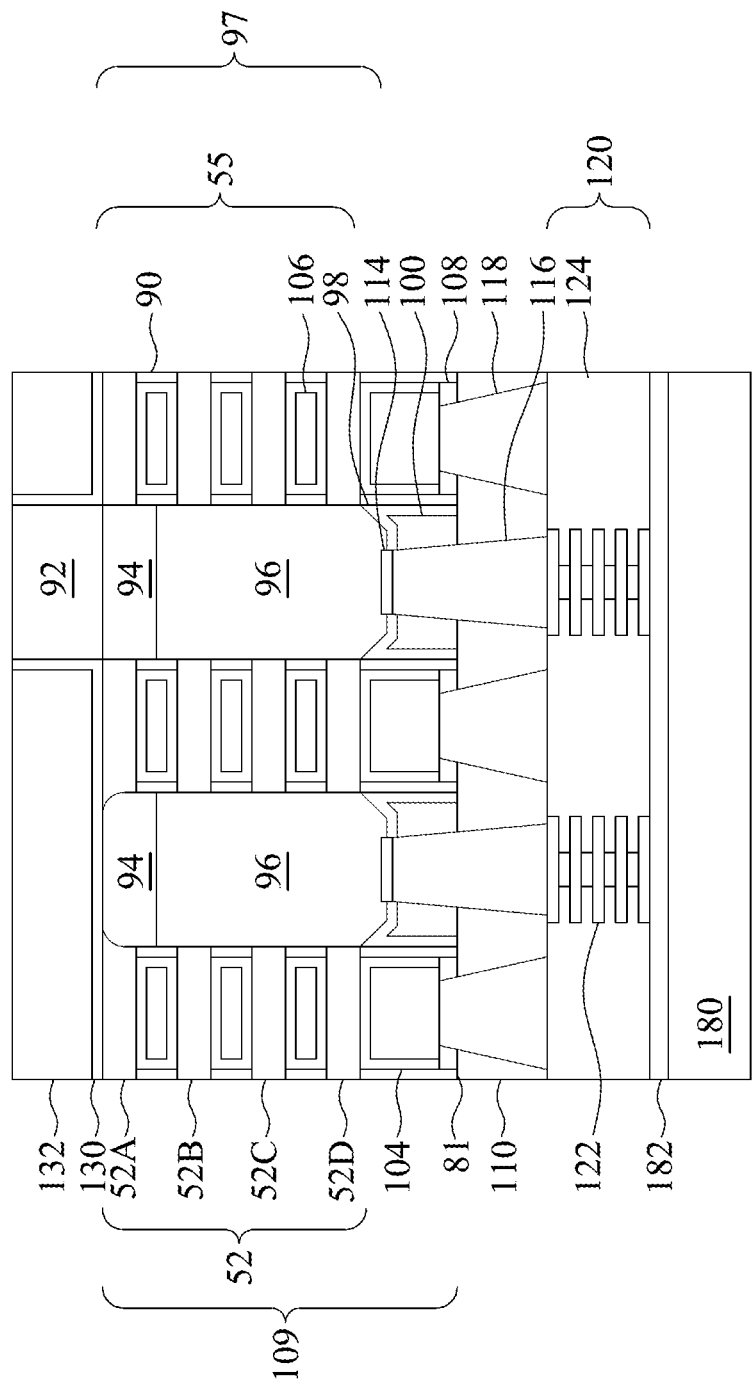

In FIGS. 25A through 25C, liners 130 and second dielectric layers 132 are formed in the fifth recesses 126. The liners 130 may be deposited over and in contact with surfaces of the STI regions 68, the etch stop layer 56, and the first epitaxial materials 92. The liners 130 may be formed of materials and in a manner the same as or similar to the CESL 98, described above with respect to FIGS. 13A through 13C. The second dielectric layers 132 are formed over the liners 130. The second dielectric layers 132 may be formed of materials and in a manner the same as or similar to the first ILD 100, described above with respect to FIGS. 13A through 13C. A planarization process, such as a CMP, may be performed to remove excess portions of the liners 130 and the second dielectric layers 132, which excess portions are over top surfaces of the STI regions 68 and the first epitaxial materials 92.

Figure 26C:
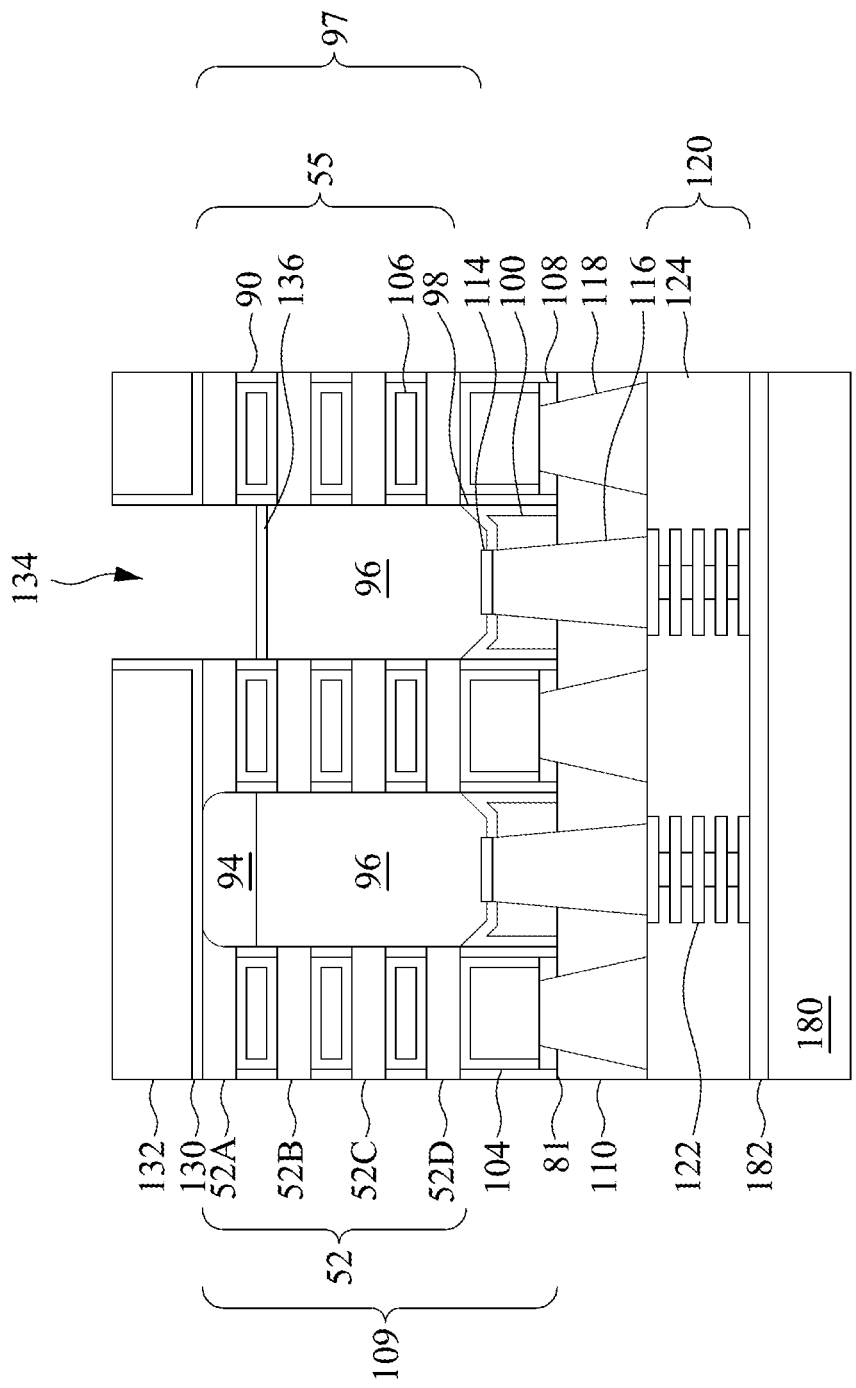

In FIGS. 26A through 26C, the first epitaxial materials 92 and the second epitaxial materials 94 are removed to form sixth recesses 134 and second silicide regions 136 are formed in the sixth recesses 134. The first epitaxial materials 92 and the second epitaxial materials 94 may be removed by a suitable etching process, which may be an isotropic etching process, such as a wet etching process. The etching process may have a high etch selectivity to materials of the first epitaxial materials 92 and the second epitaxial materials 94. As such, the first epitaxial materials 92 and the second epitaxial materials 94 may be removed without significantly removing materials of the liners 130, the second dielectric layer 132, the STI regions 68, the nanostructures 55, the first inner spacers 90, or the third epitaxial materials 96. The sixth recesses 134 may expose sidewalls of the STI regions 68, sidewalls of the first spacers 81, backside surfaces of the third epitaxial materials 96, sidewalls of the etch stop layer 56, sidewalls of the liners 130, sidewalls of the nanostructures 55, and sidewalls of the first inner spacers 90.

Second silicide regions 136 may then be formed in the sixth recesses 134 on backsides of the third epitaxial materials 96. The second silicide regions 136 may be similar to the first silicide regions 114, described above with respect to FIGS. 19A through 19C. For example, the second silicide regions 136 may be formed of a like material and using a like process as the first silicide regions 114.

Figures 27A, 27B:
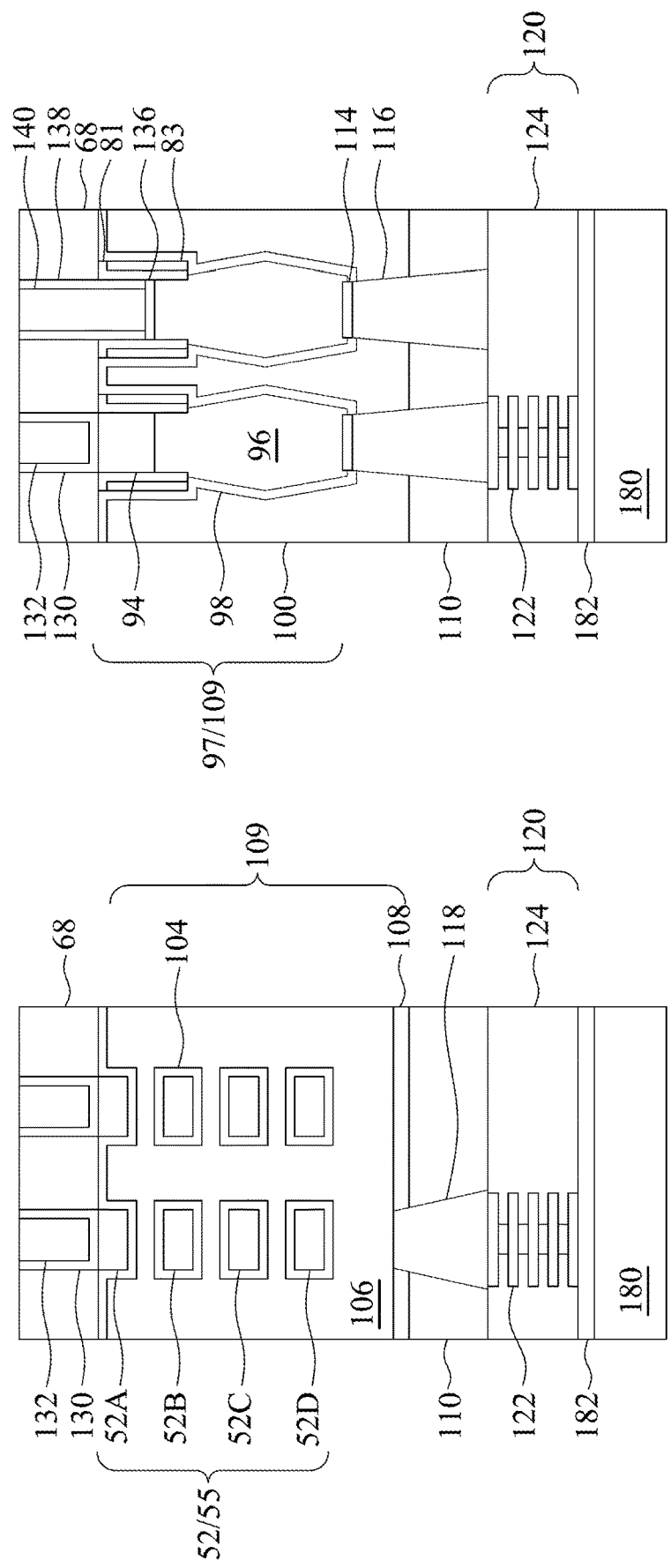
Figure 27C:
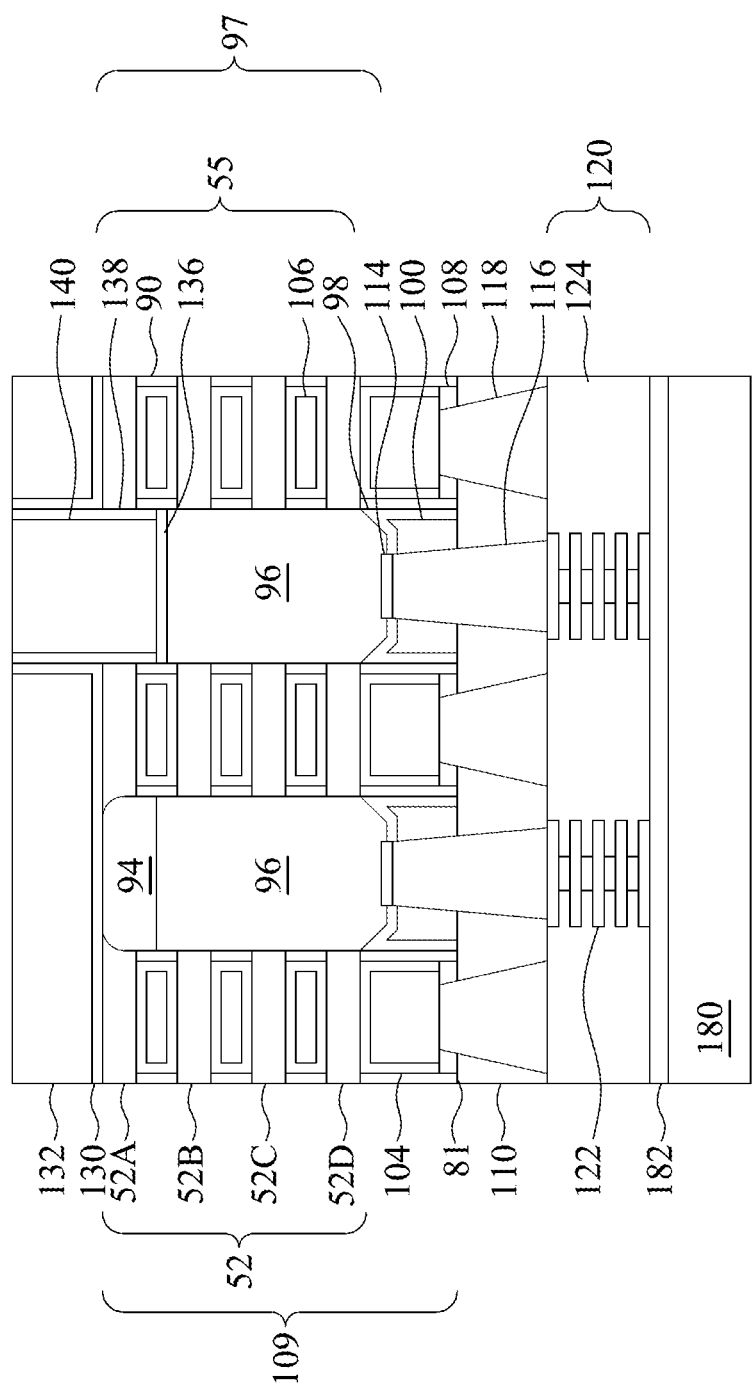

In FIGS. 27A through 27C, barrier layers 138 and backside vias 140 are formed in the sixth recesses 134. The barrier layers 138 and the backside vias 140 may extend through the STI regions 68, the liners 130, the second dielectric layer 132, the etch stop layer 56, and the nanostructures 55. The barrier layers 138 may physically contact the STI regions 68, the first spacers 81, the second silicide regions 136, the etch stop layer 56, the liners 130, the nanostructures 55, and the first inner spacers 90. The barrier layers 138 may be deposited by CVD, ALD, PVD, or the like, and may be etched using an anisotropic etch process or the like prior to depositing the backside vias 140. The backside vias 140 may each comprise one or more layers, such as barrier layers, diffusion layers, and fill materials, in addition to or in place of the barrier layers 138. The backside vias 140 are electrically coupled to the epitaxial source/drain regions 97 through the second silicide regions 136. The barrier layer2 138 may include titanium, titanium nitride, tantalum, tantalum nitride, or the like. The backside vias 140 may include copper, a copper alloy, silver, gold, tungsten, cobalt, aluminum, nickel, ruthenium, or the like. The backside vias 140 may be formed of materials and in a manner the same as or similar to the source/drain contacts 116, described above with respect to FIGS. 20A through 20C. A planarization process, such as a CMP, may be performed to remove excess portions of the barrier layers 138 and the backside vias 140, which excess portions are over top surfaces of the STI regions 68, the liners 130, and the second dielectric layer 132.

In FIGS. 28A through 28C, first conductive lines 144 and a third dielectric layer 142 are formed. The first conductive lines 144 and the third dielectric layer 142 may be formed over the backside vias 140, the barrier layers 138, the liners 130, the second dielectric layers 132, and the STI regions 68. The third dielectric layer 142 may be formed of materials and in a manner the same as or similar to the second ILD 110, described above with respect to FIGS. 18A through 18C.

The first conductive lines 144 are formed in the third dielectric layer 142. Forming the first conductive lines 144 may include patterning recesses in the third dielectric layer 142 using a combination of photolithography and etching processes, for example. A pattern of the recesses in the third dielectric layer 142 may correspond to a pattern of the first conductive lines 144. The first conductive lines 144 are then formed by depositing a conductive material in the recesses. In some embodiments, the first conductive lines 144 comprise a metal layer, which may be a single layer or a composite layer comprising a plurality of sub-layers formed of different materials. In some embodiments, the first conductive lines 144 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, tantalum oxide, or the like. The first conductive lines 144 may be formed using, for example, CVD, ALD, PVD, plating or the like. The first conductive lines 144 are electrically coupled to the epitaxial source/drain regions 97 through the backside vias 140 and the second silicide regions 136. A planarization process (e.g., a CMP, a grinding, an etch-back, or the like) may be performed to remove excess portions of the first conductive lines 144 formed over the third dielectric layer 142.

In some embodiments, the first conductive lines 144 are backside power rails, which are conductive lines that electrically connect the epitaxial source/drain regions 97 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the first conductive lines 144 may be at least twice a width of first level conductive lines (e.g., the first conductive features 122) of the front-side interconnect structure 120.

Remaining portions of a backside interconnect structure 146 are formed over the third dielectric layer 142 and the first conductive lines 144. The backside interconnect structure 146 may be referred to as a backside interconnect structure because it is formed on a backside of the transistor structures 109 (e.g., a side of the transistor structures 109 opposite the side of the transistor structure 109 on which active devices are formed). The backside interconnect structure 146 may comprise the third dielectric layer 142 and the first conductive lines 144.

The remaining portions of the backside interconnect structure 146 may comprise materials and be formed using processes the same as or similar to those used for the front-side interconnect structure 120, discussed above with respect to FIGS. 21A through 21C. In particular, the backside interconnect structure 146 may comprise stacked layers of second conductive features 150 formed in fourth dielectric layers 148. The second conductive features 150 may include routing lines (e.g., for routing to and from subsequently formed contact pads and external connectors). The second conductive features 150 may further be patterned to include one or more embedded passive devices such as, resistors, capacitors, inductors, or the like. The embedded passive devices may be integrated with the first conductive lines 144 (e.g., the power rail) to provide circuits (e.g., power circuits) on the backside of the nano-FETs.

Further in FIGS. 28A through 28C, a passivation layer 152, UBMs 154, and external connectors 156 are formed over the backside interconnect structure 146. The passivation layer 152 may comprise polymers such as PBO, polyimide, BCB, or the like. Alternatively, the passivation layer 152 may include non-organic dielectric materials such as silicon oxide, silicon nitride, silicon carbide, silicon oxynitride, or the like. The passivation layer 152 may be deposited by, for example, CVD, PVD, ALD, or the like.

The UBMs 154 are formed through the passivation layer 152 to the second conductive features 150 in the backside interconnect structure 146 and the external connectors 156 are formed on the UBMs 154. The UBMs 154 may comprise one or more layers of copper, nickel, gold, or the like, which are formed by a plating process, or the like. The external connectors 156 (e.g., solder balls) are formed on the UBMs 154. The formation of the external connectors 156 may include placing solder balls on exposed portions of the UBMs 154 and reflowing the solder balls. In some embodiments, the formation of the external connectors 156 includes performing a plating step to form solder regions over the topmost second conductive features 150 and then reflowing the solder regions. The UBMs 154 and the external connectors 156 may be used to provide input/output connections to other electrical components, such as, other device dies, redistribution structures, printed circuit boards (PCBs), motherboards, or the like. The UBMs 154 and the external connectors 156 may also be referred to as backside input/ output pads that may provide signal, supply voltage, and/or ground connections to the nano-FETs described above.

Embodiments may achieve advantages. For example, performing the ion implantation on the substrate 50 prior to etching the substrate 50 to remove the substrate 50 damages the crystal structure of the substrate 50. The improves the etch rate of the substrate 50, improves etch selectivity of the substrate 50 relative to surrounding materials and helps to ensure that the substrate 50 is completely removed by the subsequent etching. The substrate 50 may then be removed using a wet etching process or the like. Completely removing the substrate 50 improves the deposition of the liners 130 and the second dielectric layer 132, reduces device defects, and improves device performance.

In accordance with an embodiment, a method includes forming a transistor on a first side of a substrate; performing an ion implantation on a second side of the substrate opposite the first side; after performing the ion implantation, etching the substrate to remove the substrate and form a first recess; and forming a dielectric layer in the first recess. In an embodiment, the ion implantation is used to implant a species selected from helium (He), boron (B), boron fluoride ($BF_2$), carbon (C), oxygen (O), nitrogen (N), fluorine (F), argon (Ar), germanium (Ge), xenon (Xe), silicon (Si), gallium (Ga), arsenic (As), phosphorus (P), diphosphorus ($P_2$), indium (In), and antimony (Sb) into the substrate. In an embodiment, the ion implantation is performed with an implant energy ranging from about 100 eV to about 60 keV. In an embodiment, the ion implantation is performed at a temperature ranging from −300° C. to 30° C. In an embodiment, the ion implantation is performed with a dosage ranging from $1\times10^{13}$ atoms/cm$^2$ to $1\times10^{16}$ atoms/cm$^2$. In an embodiment, the method further includes etching the substrate to form a second recess; epitaxially growing a first epitaxial material in the second recess; and replacing the first epitaxial material with a first contact after forming the dielectric layer. In an embodiment, the method further includes forming an epitaxial source/drain region over the first epitaxial material, replacing the first epitaxial material includes removing the first epitaxial material to expose the epitaxial source/drain region.

In accordance with another embodiment, a method includes forming a fin extending from a substrate; etching the fin to form a first recess; forming dummy fin in the first recess; forming a source/drain region in the first recess over the dummy fin; implanting ions into the substrate; etching the substrate to remove the substrate and form a second recess exposing sidewalls of the dummy fin; forming a dielectric layer in the second recess adjacent the dummy fin; and replacing the dummy fin with a contact structure. In an embodiment, the substrate includes silicon and the dummy fin includes silicon germanium. In an embodiment, the source/drain region includes silicon germanium, and a germanium concentration of the source/drain region is less than a germanium concentration of the dummy fin. In an embodiment, replacing the dummy fin with the contact structure includes etching the dummy fin to remove the dummy fin and form a third recess exposing the source/drain region, the method further includes forming a silicide region in the third recess over the source/drain region. In an embodiment, implanting the ions into the substrate damages a crystal structure of the substrate. In an embodiment, implanting the ions into the substrate increases an etch rate of the substrate. In an embodiment, implanting the ions into the substrate increases an etch selectivity of the substrate relative to the dummy fin.

In accordance with yet another embodiment, a method includes depositing an etch stop layer over a substrate; depositing a multi-layer stack over the substrate, the multi-layer stack including alternating layers of a first semiconductor material and a second semiconductor material; forming a first recess extending through the multi-layer stack and the etch stop layer; depositing a first epitaxial material in the first recess; forming an epitaxial source/drain region in the first recess over the first epitaxial material; performing an ion implantation on the substrate; etching the substrate to form a second recess exposing the etch stop layer and sidewalls of the first epitaxial material; and forming a dielectric structure in the second recess. In an embodiment, the method further includes etching the first epitaxial material to form a third recess exposing the epitaxial source/drain region; and forming a contact structure in the third recess. In an embodiment, the etch stop layer and the first epitaxial material include silicon germanium, and the substrate includes silicon. In an embodiment, the method further includes performing a planarization process on the substrate prior to performing the ion implantation, the planarization process exposing the first epitaxial material. In an embodiment, the method further includes etching a first layer of the multi-layer stack including the first semiconductor material to form a third recess; and forming a gate structure in the third recess adjacent a second layer of the multi-layer stack including the second semiconductor material. In an embodiment, forming the dielectric structure includes depositing a dielectric liner in the second recess, the dielectric liner including a nitride; and depositing a dielectric layer in the second recess over the dielectric liner, the dielectric layer including an oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a transistor on a first side of a substrate;
   performing an ion implantation on a second side of the substrate opposite the first side;
   after performing the ion implantation, etching the substrate to remove the substrate and form a first recess;
   forming a dielectric layer in the first recess;
   etching the substrate to form a second recess;
   epitaxially growing a first epitaxial material in the second recess; and
   replacing the first epitaxial material with a first contact after forming the dielectric layer.

2. The method of claim 1, wherein the ion implantation is used to implant a species selected from helium (He), boron (B), boron fluoride ($BF_2$), carbon (C), oxygen (O), nitrogen (N), fluorine (F), argon (Ar), germanium (Ge), xenon (Xe), silicon (Si), gallium (Ga), arsenic (As), phosphorus (P), diphosphorus ($P_2$), indium (In), and antimony (Sb) into the substrate.

3. The method of claim 1, wherein the ion implantation is performed with an implant energy ranging from about 100 eV to about 60 keV.

4. The method of claim 1, wherein the ion implantation is performed at a temperature ranging from −300° C. to 30° C.

5. The method of claim 1, wherein the ion implantation is performed with a dosage ranging from $1\times10^{13}$ atoms/cm$^2$ to $1\times10^{16}$ atoms/cm$^2$.

6. The method of claim 1, further comprising etching the substrate to remove the substrate and to expose the first epitaxial material.

7. The method of claim 1, further comprising forming an epitaxial source/drain region over the first epitaxial material, wherein replacing the first epitaxial material comprises removing the first epitaxial material to expose the epitaxial source/drain region.

8. A method comprising:
forming a fin extending from a substrate;
etching the fin to form a first recess;
forming a dummy fin in the first recess;
forming a source/drain region in the first recess over the dummy fin;
implanting ions into the substrate;
etching the substrate to remove the substrate and form a second recess exposing sidewalls of the dummy fin;
forming a dielectric layer in the second recess adjacent the dummy fin; and
replacing the dummy fin with a contact structure.

9. The method of claim 8, wherein the substrate comprises silicon and the dummy fin comprises silicon germanium.

10. The method of claim 9, wherein the source/drain region comprises silicon germanium, and wherein a germanium concentration of the source/drain region is less than a germanium concentration of the dummy fin.

11. The method of claim 8, wherein replacing the dummy fin with the contact structure comprises etching the dummy fin to remove the dummy fin and form a third recess exposing the source/drain region, wherein the method further comprises forming a silicide region in the third recess over the source/drain region.

12. The method of claim 8, wherein implanting the ions into the substrate damages a crystal structure of the substrate.

13. The method of claim 8, wherein implanting the ions into the substrate increases an etch rate of the substrate.

14. The method of claim 8, wherein implanting the ions into the substrate increases an etch selectivity of the substrate relative to the dummy fin.

15. A method comprising:
depositing an etch stop layer over a substrate;
depositing a multi-layer stack over the substrate, the multi-layer stack comprising alternating layers of a first semiconductor material and a second semiconductor material;
forming a first recess extending through the multi-layer stack and the etch stop layer;
depositing a first epitaxial material in the first recess;
forming an epitaxial source/drain region in the first recess over the first epitaxial material;
performing an ion implantation on the substrate;
etching the substrate to form a second recess exposing the etch stop layer and sidewalls of the first epitaxial material; and
forming a dielectric structure in the second recess.

16. The method of claim 15, further comprising:
etching the first epitaxial material to form a third recess exposing the epitaxial source/drain region; and
forming a contact structure in the third recess.

17. The method of claim 15, wherein the etch stop layer and the first epitaxial material comprise silicon germanium, and wherein the substrate comprises silicon.

18. The method of claim 15, further comprising performing a planarization process on the substrate prior to performing the ion implantation, wherein the planarization process exposes the first epitaxial material.

19. The method of claim 15, further comprising:
etching a first layer of the multi-layer stack comprising the first semiconductor material to form a third recess; and
forming a gate structure in the third recess adjacent a second layer of the multi-layer stack comprising the second semiconductor material.

20. The method of claim 15, wherein forming the dielectric structure comprises:
depositing a dielectric liner in the second recess, the dielectric liner comprising a nitride; and
depositing a dielectric layer in the second recess over the dielectric liner, the dielectric layer comprising an oxide.

* * * * *